(12) United States Patent
Kim et al.

(10) Patent No.: US 10,804,146 B2
(45) Date of Patent: Oct. 13, 2020

(54) METHOD FOR PRODUCING SEMICONDUCTOR PACKAGE

(71) Applicant: NEPES CO., LTD., Chungcheongbuk-do (KR)

(72) Inventors: Nam Chul Kim, Chungcheongbuk-do (KR); Yong Woon Yeo, Chungcheongbuk-do (KR); Yong Tae Kwon, Chungcheongbuk-do (KR); Young Seok Lee, Daegu (KR)

(73) Assignee: NEPES LAWEH Corporation, Cheongju-si (KR)

( * ) Notice: Subject to any disclaimer, the term of this patent is extended or adjusted under 35 U.S.C. 154(b) by 0 days.

(21) Appl. No.: 16/505,970

(22) Filed: Jul. 9, 2019

(65) Prior Publication Data

US 2019/0333809 A1    Oct. 31, 2019

Related U.S. Application Data

(63) Continuation of application No. PCT/KR2017/004824, filed on May 10, 2017, and a
(Continued)

(30) Foreign Application Priority Data

Jan. 17, 2017  (KR) .................. 10-2017-0008190
Apr. 26, 2017  (KR) .................. 10-2017-0053559
(Continued)

(51) Int. Cl.
*H01L 21/768* (2006.01)
*H01L 21/673* (2006.01)
*H01L 23/00* (2006.01)

(52) U.S. Cl.
CPC .. *H01L 21/76871* (2013.01); *H01L 21/67333* (2013.01); *H01L 21/76802* (2013.01); *H01L 24/09* (2013.01)

(58) Field of Classification Search
CPC ......... H01L 21/76871; H01L 21/67333; H01L 21/76802; H01L 21/561; H01L 24/09; H01L 24/80
See application file for complete search history.

(56) References Cited

U.S. PATENT DOCUMENTS 7,652,467 B2   1/2010 Tomita et al.
8,450,151 B1   5/2013 Poddar et al.
(Continued)

FOREIGN PATENT DOCUMENTS

JP   2015-504608 A   2/2015
KR   2002-0022600 A   3/2002
(Continued)

OTHER PUBLICATIONS

Office Action for Korean Patent Application No. 10-2017-0053559 dated May 31, 2017; 8 pages.
Office Action for Korean Patent Application No. 10-2017-0053560 dated May 31, 2017; 6 pages.
Office Action for Korean Patent Application No. 10-2017-0053562 dated May 31, 2017; 8 pages.
(Continued)

*Primary Examiner* — Armando Rodriguez
(74) *Attorney, Agent, or Firm* — Brinks Gilson & Lione

(57) ABSTRACT

A technical concept of the present disclosure provides a method of producing a semiconductor package, the method including operations of: arranging a plurality of wafers on a tray, forming an interconnect structure on the tray and the plurality of wafers, and separating the plurality of wafers from the tray.

20 Claims, 41 Drawing Sheets

Related U.S. Application Data continuation of application No. PCT/KR2017/004829, filed on May 10, 2017, and a continuation of application No. PCT/KR2017/004830, filed on May 10, 2017, and a continuation of application No. PCT/KR2017/004825, filed on May 10, 2017.

(30) Foreign Application Priority Data

| Apr. 26, 2017 | (KR) | 10-2017-0053560 |
| Apr. 26, 2017 | (KR) | 10-2017-0053561 |
| Apr. 26, 2017 | (KR) | 10-2017-0053562 |

(56) References Cited

U.S. PATENT DOCUMENTS

| 8,652,858 B2 | 2/2014 | Byun et al. |
| 8,964,190 B2 | 2/2015 | Tanaka et al. |
| 10,276,541 B2 | 4/2019 | Chen et al. |
| 2002/0033339 A1 | 3/2002 | Kimura et al. |

FOREIGN PATENT DOCUMENTS

| KR | 10-2008-0013820 A | 2/2008 |
| KR | 10-2010-0074126 A | 7/2010 |
| KR | 10-2010-0077818 A | 7/2010 |
| KR | 10-2011-0077574 A | 7/2011 |
| KR | 10-2012-0046034 A | 5/2012 |
| KR | 10-2012-0138517 A | 12/2012 |
| KR | 10-2015-0065544 A | 6/2015 |
| KR | 10-2017-0003352 A | 1/2017 |

OTHER PUBLICATIONS

Office Action for Korean Patent Application No. 10-2017-0053561 dated Sep. 11, 2017; 6 pages.
Office Action for Korean Patent Application No. 10-2017-0053559 dated Apr. 10, 2018; 6 pages.
Office Action for Korean Patent Application No. 10-2017-0053560 dated Apr. 10, 2018; 6 pages.
Office Action for Korean Patent Application No. 10-2017-0053561 dated Apr. 10, 2018; 7 pages.
Office Action for Korean Patent Application No. 10-2017-0053562 dated Apr. 10, 2018; 6 pages.
Final Office Action for Korean Patent Application No. 10-2017-0053561 dated Nov. 9, 2018; 6 pages.
Notice of Allowance for Korean Patent Application No. 10-2017-0053559 dated Aug. 24, 2018; 2 pages.
Notice of Allowance for Korean Patent Application No. 10-2017-0053560 dated Aug. 24, 2018; 2 pages.
Notice of Allowance for Korean Patent Application No. 10-2017-0053562 dated Aug. 24, 2018; 2 pages.
Notice of Allowance for Korean Patent Application No. 10-2017-0053561 dated May 21, 2019; 2 pages.
International Search Report with English Translation for International Patent Application No. PCT/KR2017/004824 dated Sep. 22, 2017; 5 pages.
International Search Report with English Translation for International Patent Application No. PCT/KR2017/004825 dated Sep. 22, 2017; 5 pages.
International Search Report with English Translation for International Patent Application No. PCT/KR2017/004829 dated Sep. 21, 2017; 5 pages.
International Search Report with English Translation for International Patent Application No. PCT/KR2017/004830 dated Sep. 21, 2017; 5 pages.

METHOD FOR PRODUCING SEMICONDUCTOR PACKAGE

CROSS-REFERENCE TO RELATED APPLICATION(S)

This application is a continuation of PCT/KR2017/004830, filed on May 10, 2017, which claims priority to both Korean Patent Application No. 10-2017-0008190 filed on Jan. 17, 2017, and Korean Patent Application No. 10-2017-0053562 filed on Apr. 26, 2017; this application is a continuation of PCT/KR2017/004824, filed on May 10, 2017, which claims priority to Korean Patent Application No. 10-2017-0008190 filed on Jan. 17, 2017, and Korean Patent Application No. 10-2017-0053559 filed on Apr. 26, 2017; this application is a continuation of PCT/KR2017/004825, filed on May 10, 2017, which claims priority to Korean Patent Application No. 10-2017-0008190 filed on Jan. 17, 2017, and Korean Patent Application No. 10-2017-0053560 filed on Apr. 26, 2017; this application is a continuation of PCT/KR2017/004829, filed on May 10, 2017, which claims priority to Korean which claims priority to Korean Patent Application No. 10-2017-0008190 filed on Jan. 17, 2017, and Korean Patent Application No. 10-2017-0053561 filed on Apr. 26, 2017; all of which are incorporated by reference herein in their entirety.

TECHNICAL FIELD

A technical concept of the present disclosure relates to a method of producing a semiconductor package, and more particularly, to a method of producing a semiconductor package using wafer level package technology.

BACKGROUND ART

In general, semiconductor packages are produced by performing a semiconductor package process on semiconductor chips manufactured by performing various semiconductor processes on a wafer. Recently, to reduce the production cost of semiconductor packages, wafer level package technology of performing a semiconductor package process in a wafer level and separating a wafer level semiconductor package subject to the semiconductor package process into semiconductor chips has been proposed.

Because the wafer level package does not require a printed circuit board, the total thickness of semiconductor packages can be reduced, and semiconductor packages with an excellent heat-dissipating effect can be manufactured due to their small thickness. However, there is a demand for methods of further reducing the cost of the semiconductor package process and improving productivity of the semiconductor package process in using the wafer level package technology.

DESCRIPTION OF TECHNICAL PROBLEM

The present disclosure is directed to provide a method of producing a semiconductor package, which is capable of improving productivity of a semiconductor package process.

SOLUTION TO TECHNICAL PROBLEM

According to a technical concept of the present disclosure for solving the above-described problem, there is provided a method of producing a semiconductor package, the method including arranging a plurality of wafers on a tray, forming an interconnect structure on the tray and the plurality of wafers, and separating the plurality of wafers from the tray.

Also, according to a technical concept of the present disclosure for solving the above-described problem, there is provided a method of producing a semiconductor package, including operations of: preparing a plurality of wafers having pads arranged on first surfaces, arranging the plurality of wafers in a plurality of cavities such that the first surfaces are exposed, forming an interconnect structure on a tray and the plurality of wafers, and separating the plurality of wafers from the tray, wherein the operation of forming the interconnect structure includes forming a first insulating layer having an opening exposing the pads of the plurality of wafers, a distribution layer electrically connected to the pads of the plurality of wafers, and a second insulating layer covering the distribution layer, sequentially, on the tray and the plurality of wafers accommodated in the cavities, and when the interconnect structure is formed, a space between side walls of the cavities and the wafers accommodated in the cavities is covered by the first insulating layer.

ADVANTAGEOUS EFFECTS OF DISCLOSURE

By a method of producing a semiconductor package according to embodiments of the present disclosure, a compact semiconductor package with excellent heat dissipation efficiency can be produced by using wafer level package technology.

Further, by a method of producing a semiconductor package according to embodiments of the present disclosure, the cost of a semiconductor package process can be reduced and the productivity of the semiconductor package process can be improved by arranging a plurality of wafers on a tray to perform the semiconductor package process in a panel level.

BRIEF DESCRIPTION OF DRAWINGS

FIGS. 6A-6J are in the order of processes.

FIG. 6B is a cross-sectional view showing a method of producing a semiconductor package according to some embodiments of a technical concept of the present disclosure, where FIGS. 6A-6J are in the order of processes.

FIG. 6C is a cross-sectional view showing a method of producing a semiconductor package according to some embodiments of a technical concept of the present disclosure, where FIGS. 6A-6J are in the order of processes.

FIG. 6D is a cross-sectional view showing a method of producing a semiconductor package according to some embodiments of a technical concept of the present disclosure, where FIGS. 6A-6J are in the order of processes.

FIG. 6E is a cross-sectional view showing a method of producing a semiconductor package according to some embodiments of a technical concept of the present disclosure, where FIGS. 6A-6J are in the order of processes.

FIG. 6F is a cross-sectional view showing a method of producing a semiconductor package according to some embodiments of a technical concept of the present disclosure, where FIGS. 6A-6J are in the order of processes.

FIG. 6G is a cross-sectional view showing a method of producing a semiconductor package according to some embodiments of a technical concept of the present disclosure, where FIGS. 6A-6J are in the order of processes.

FIG. 6H is a cross-sectional view showing a method of producing a semiconductor package according to some embodiments of a technical concept of the present disclosure, where FIGS. 6A-6J are in the order of processes.

FIG. 6I is a cross-sectional view showing a method of producing a semiconductor package according to some embodiments of a technical concept of the present disclosure, where FIGS. 6A-6J are in the order of processes.

FIG. 6J is a cross-sectional view showing a method of producing a semiconductor package according to some embodiments of a technical concept of the present disclosure, where FIGS. 6A-6J are in the order of processes.

FIGS. 7A-7D are in the order of processes.

FIG. 7B is a cross-sectional view showing a method of producing a semiconductor package according to some embodiments of a technical concept of the present disclosure, where FIGS. 7A-7D are in the order of processes.

FIG. 7C is a cross-sectional view showing a method of producing a semiconductor package according to some embodiments of a technical concept of the present disclosure, where FIGS. 7A-7D are in the order of processes.

FIG. 7D is a cross-sectional view showing a method of producing a semiconductor package according to some embodiments of a technical concept of the present disclosure, where FIGS. 7A-7D are in the order of processes.

FIGS. 10A-10K are in the order of processes.

FIG. 10B is a cross-sectional view showing a method of producing a semiconductor package according to some embodiments of a technical concept of the present disclosure, where FIGS. 10A-10K are in the order of processes.

FIG. 10C is a cross-sectional view showing a method of producing a semiconductor package according to some embodiments of a technical concept of the present disclosure, where FIGS. 10A-10K are in the order of processes.

FIG. 10D is a cross-sectional view showing a method of producing a semiconductor package according to some embodiments of a technical concept of the present disclosure, where FIGS. 10A-10K are in the order of processes.

FIG. 10E is a cross-sectional view showing a method of producing a semiconductor package according to some embodiments of a technical concept of the present disclosure, where FIGS. 10A-10K are in the order of processes.

FIG. 10F is a cross-sectional view showing a method of producing a semiconductor package according to some embodiments of a technical concept of the present disclosure, where FIGS. 10A-10K are in the order of processes.

FIG. 10G is a cross-sectional view showing a method of producing a semiconductor package according to some embodiments of a technical concept of the present disclosure, where FIGS. 10A-10K are in the order of processes.

FIG. 10H is a cross-sectional view showing a method of producing a semiconductor package according to some embodiments of a technical concept of the present disclosure, where FIGS. 10A-10K are in the order of processes.

FIG. 10I is a cross-sectional view showing a method of producing a semiconductor package according to some embodiments of a technical concept of the present disclosure, where FIGS. 10A-10K are in the order of processes.

FIG. 10J is a cross-sectional view showing a method of producing a semiconductor package according to some embodiments of a technical concept of the present disclosure, where FIGS. 10A-10K are in the order of processes.

FIG. 10K is a cross-sectional view showing a method of producing a semiconductor package according to some embodiments of a technical concept of the present disclosure, where FIGS. 10A-10K are in the order of processes.

FIGS. 12A-12F are in the order of processes.

FIG. 12B is a cross-sectional view showing a method of producing a semiconductor package, according to some embodiments of a technical concept of the present disclosure, where FIGS. 12A-12F are in the order of processes.

FIG. 12C is a cross-sectional view showing a method of producing a semiconductor package, according to some embodiments of a technical concept of the present disclosure, where FIGS. 12A-12F are in the order of processes.

FIG. 12D is a cross-sectional view showing a method of producing a semiconductor package, according to some embodiments of a technical concept of the present disclosure, where FIGS. 12A-12F are in the order of processes.

FIG. 12E is a cross-sectional view showing a method of producing a semiconductor package, according to some embodiments of a technical concept of the present disclosure, where FIGS. 12A-12F are in the order of processes.

FIG. 12F is a cross-sectional view showing a method of producing a semiconductor package, according to some embodiments of a technical concept of the present disclosure, where FIGS. 12A-12F are in the order of processes.

FIGS. 14A-14F are in the order of processes.

FIG. 14B is a cross-sectional view showing a method of producing a semiconductor package, according to some embodiments of a technical concept of the present disclosure, where FIGS. 14A-14F are in the order of processes.

FIG. 14C is a cross-sectional view showing a method of producing a semiconductor package, according to some embodiments of a technical concept of the present disclosure, where FIGS. 14A-14F are in the order of processes.

FIG. 14D is a cross-sectional view showing a method of producing a semiconductor package, according to some embodiments of a technical concept of the present disclosure, where FIGS. 14A-14F are in the order of processes.

FIG. 14E is a cross-sectional view showing a method of producing a semiconductor package, according to some embodiments of a technical concept of the present disclosure, where FIGS. 14A-14F are in the order of processes.

FIG. 14F is a cross-sectional view showing a method of producing a semiconductor package, according to some embodiments of a technical concept of the present disclosure, where FIGS. 14A-14F are in the order of processes.

DETAILED DESCRIPTION

Figure 1:
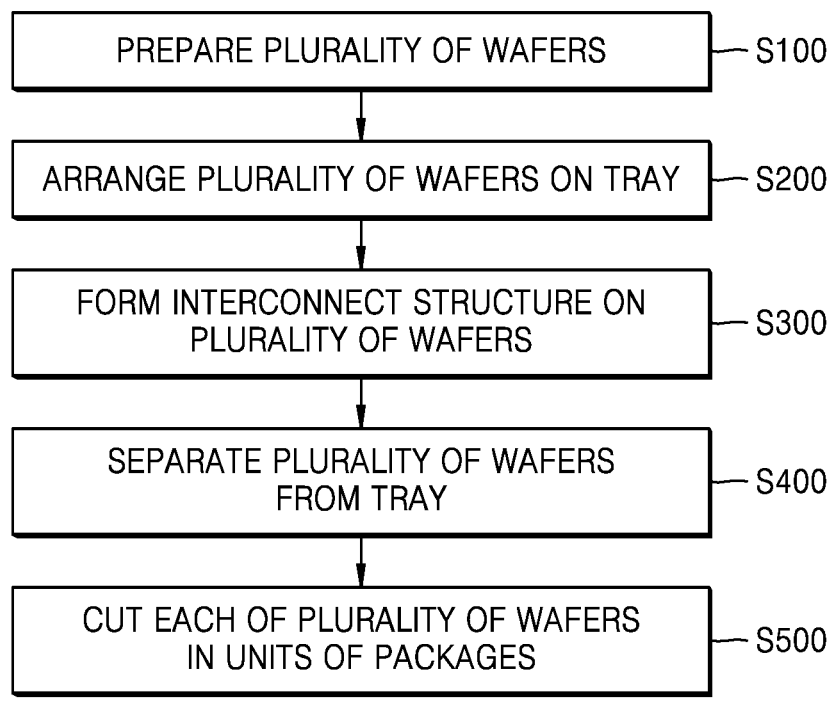
FIG. 1 is a flowchart showing a method of producing a semiconductor package, according to some embodiments of a technical concept of the present disclosure.

A method of producing a semiconductor package, according to the present disclosure, includes arranging a plurality of wafers on a tray, forming an interconnect structure on the tray and the plurality of wafers, and separating the plurality of wafers from the tray.

Hereinafter, preferred embodiments of a concept of the present disclosure will be described in detail with reference to the accompanying drawings. However, the embodiments of the concept of the present disclosure can be modified in many different forms, and it should be not interpreted that the scope of the concept of the present disclosure is limited to embodiments which will be described below. The embodiments of the concept of the present disclosure should be preferably interpreted to be provided to more completely describe the concept of the present disclosure to those having ordinary skill in the art. Like reference numerals refer to like elements throughout the specification. Further, various elements and areas in the drawings are schematically shown. Accordingly, the concept of the present disclosure is not limited by relative sizes and intervals shown in the drawings.

It will be understood that, although the terms "first", "second", etc. may be used herein to describe various components, these components should not be limited by these terms. These terms are only used to distinguish one component from another. For example, a first component could be termed a second component, and, similarly, a second component could be termed a first component, without departing from the scope of the present disclosure.

The terms used in the present specification are used to describe the embodiments of the present disclosure, not for the purpose of limiting the present disclosure. It is to be understood that the singular forms "a," "an," and "the" include plural referents unless the context clearly dictates otherwise. It will be understood that when the terms "includes," "comprises," "including," and/or "comprising," when used in this specification, specify the presence of stated features, figures, steps, components, or combination thereof, but do not preclude the presence or addition of one or more other features, figures, steps, components, members, or combinations thereof.

Unless otherwise defined, all terms, including technical terms and scientific terms, used herein have the same meaning as how they are generally understood by those of ordinary skill in the art to which the concept of the present disclosure pertains. Any term that is defined in a general dictionary should be construed to have the same meaning in the context of the relevant art, and, unless otherwise defined explicitly, should not be interpreted to have an idealistic or excessively formalistic meaning.

FIG. 1 is a flowchart showing a method of producing a semiconductor package, according to some embodiments of a technical concept of the present disclosure.

Referring to FIG. 1, a method of producing a semiconductor package, according to embodiments of the present disclosure, may sequentially perform operation S100 of preparing a plurality of wafers, operation S200 of arranging the plurality of wafers on a tray, operation S300 of forming an interconnect structure on the plurality of wafers, operation S400 of separating the plurality of wafers from the tray, and operation S500 of cutting each of the plurality of wafers in units of packages.

More specifically, in operation S100 of preparing the plurality of wafers, a plurality of wafers each including a semiconductor substrate and a semiconductor device formed on the semiconductor substrate may be prepared.

The semiconductor substrate may include, for example, silicon (Si). Alternatively, the semiconductor substrate may include a semiconductor element such as germanium (Ge), or a compound semiconductor, such as silicon carbide (SiC), gallium arsenide (GaAs), indium arsenide (InAs), and indium phosphide (InP). Alternatively, the semiconductor substrate may have a silicon on insulator (SOI) structure. For example, the semiconductor substrate may include a buried oxide layer (BOX). The semiconductor substrate may include a conductive area, for example, an impurity-doped well. Also, the semiconductor substrate may have various isolation structures such as a shallow trench isolation (STI) structure.

The semiconductor device may include various kinds of individual devices. For example, the plurality of individual devices may include various microelectronic devices, for example, a metal-oxide-semiconductor field effect transistor (MOSFET) (e.g., a complementary metal-insulator-semiconductor (CMOS) transistor), an image sensor (e.g., system large scale integration (LSI) and a CMOS imaging sensor (CIS)), a micro-electro-mechanical system (MEMS), an active device, a passive device, etc. The plurality of individual devices may be electrically connected to the conductive area of the semiconductor substrate. The semiconductor device may further include a conductive wire or a conductive plug electrically connecting at least two of the plurality of individual devices to each other or electrically connecting the plurality of individual devices to the conductive area of the semiconductor substrate. Also, each of the plurality of individual devices may be electrically insulated from the neighboring individual devices by insulating films.

Successively, in operation S200 of arranging the plurality of wafers on the tray, a tray (for example, see 100 of FIG. 2a) having an appropriate structure to arrange the plurality of wafers thereon may be prepared, and the plurality of wafers may be arranged at predetermined positions on the tray. According to some embodiments, a plurality of cavities may be formed to accommodate the plurality of wafers to easily arrange the plurality of wafers on the tray. When the wafers are arranged in the cavities of the tray, upper surfaces of the wafers on which pads are formed may face upward, and lower surfaces of the wafers, which are opposite to the upper surfaces thereof, may contact a surface of the tray.

Then, in operation S300 of forming the interconnect structure on the plurality of wafers, an interconnect structure may be formed simultaneously on the plurality of wafers arranged on the tray. Herein, the interconnect structure (see 200 of FIG. 6i) may mean a structure formed on the wafers to electrically connect pads of semiconductor devices formed on the wafers with an external device. Operation S300 of forming the interconnect structure on the wafers will be described in more detail with reference to FIGS. 6b to 6h, later.

Thereafter, in operation S400 of separating the plurality of wafers from the tray, a portion of a structure formed through operation S300 of forming the interconnect structure on the plurality of wafers may be removed, and then the plurality of wafers may be separated from the tray. Each of the plurality of wafers separated from the tray may be a semiconductor package that is in the form of a wafer level package including an interconnect structure formed thereon. Operation S400 of separating the plurality of wafers from the tray will be described in more detail with reference to FIG. 6i, later.

Then, in operation S500 of cutting each of the plurality of wafers in units of packages, a process of sawing each wafer level semiconductor package separated from the tray may be performed to singulate the wafer level semiconductor package into a plurality of package unit semiconductor packages.

By the method of producing the semiconductor package, according to embodiments of the present disclosure, a compact semiconductor package with excellent heat-dissipating efficiency may be manufactured by using wafer level package technology.

Further, by the method of producing the semiconductor package, according to embodiments of the present disclosure, a plurality of wafers may be arranged on a tray so that at least a part of unit processes of a semiconductor package process may be performed in a panel level. Accordingly, a semiconductor package process may be performed simultaneously on the plurality of wafers, thereby simplifying the semiconductor package process and improving the productivity.

Figure 2A:
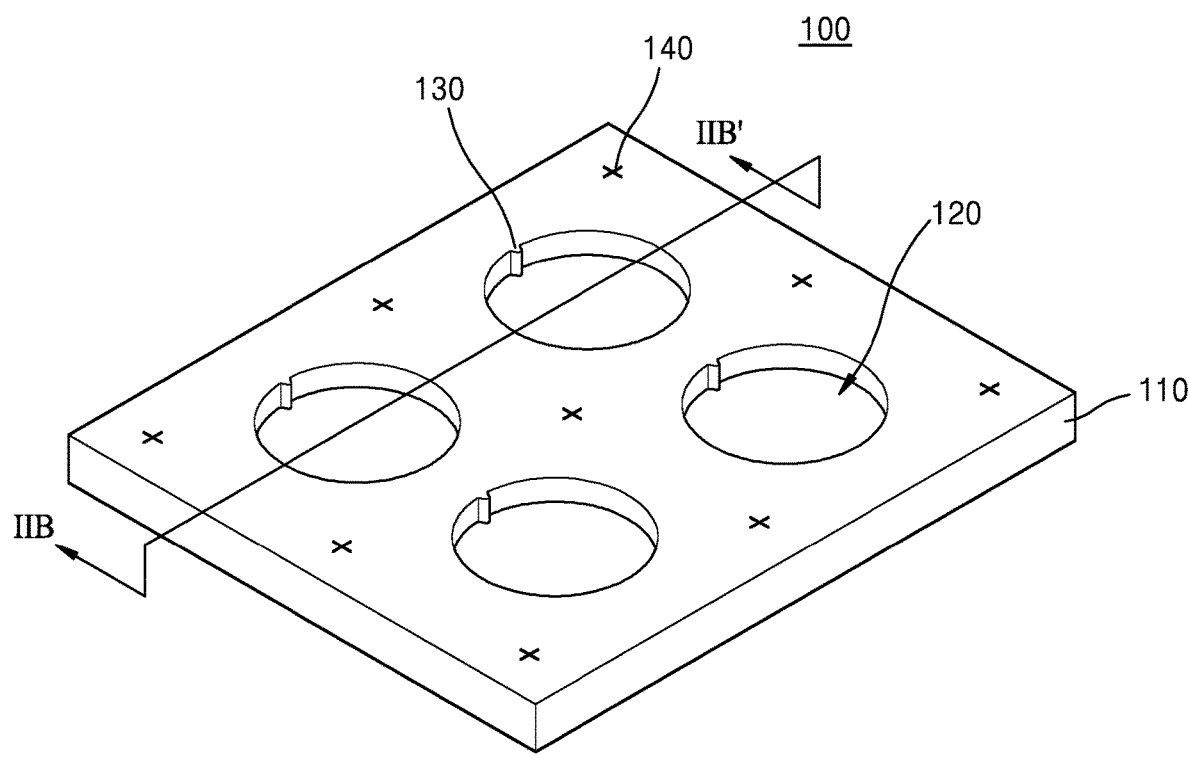
FIG. 2A is a perspective view of a tray according to some embodiments of the present disclosure.
Figure 2B:
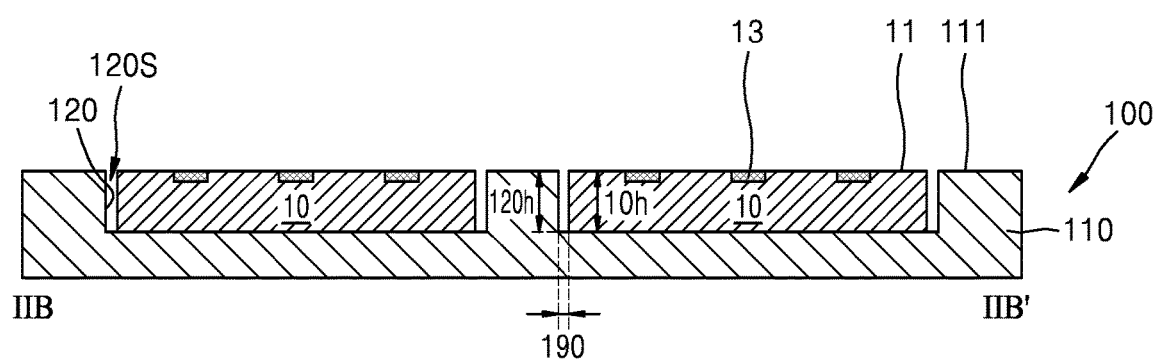
FIG. 2B is a cross-sectional view of a tray taken along line IIB-IIB' of FIG. 2A, showing a state in which a plurality of wafers are arranged on a tray.

FIG. 2a is a perspective view of a tray 100 according to some embodiments of the present disclosure. FIG. 2b is a cross-sectional view of the tray 100 taken along line IIB-IIB' of FIG. 2a, showing a state in which a plurality of wafers 10 are arranged on the tray 100.

Referring to FIGS. 2a and 2b, the tray 100 may be in the shape of a plate and include a body 110 and a plurality of cavities 120.

The tray 100 may have a sufficient horizontal area to arrange all of the plurality of wafers 10 thereon. The tray 100 may support the plurality of wafers 10 while a semiconductor package process is performed on the plurality of wafers 10. An outer circumference of the tray 100 may be in the shape of a rectangle, as shown in FIG. 2a, although not limited thereto.

The body 110 may form an entire outer appearance of the tray 100 and have a sufficient horizontal area to arrange all of the plurality of wafers 10 thereon, like the tray 100.

The plurality of cavities 120 may provide spaces to accommodate the plurality of wafers 10, respectively. That is, each cavity 120 may be a recess provided in the body 110 and include a bottom surface facing a lower surface of the corresponding wafer 10 and a side wall facing a side surface of the wafer 10.

The plurality of cavities 120 may have shapes corresponding to the wafers 10. For example, when the tray 100 is seen from above, each cavity 120 may be in the shape of a circle. In FIGS. 2a and 2b, the plurality of cavities 120 are shown to have substantially the same dimension. However, the dimensions of the plurality of cavities 120, for example, horizontal areas and/or depths 120h of the plurality of cavities 120 may be different from each other. Further, in FIG. 2a, four cavities 120 are shown to be formed in the tray 100. However, the number of cavities 120 formed in a single tray 100 may be two or more.

In some embodiments, the tray 100 may include a notch portion 130. The notch portion 130 may be positioned at each of the plurality of cavities 120. For example, the notch portion 120 may be positioned at the side wall of each cavity 120. The notch portion 130 may be provided to locate the wafer 100 at a predetermined position on the tray 100. Through the notch portion 130, the wafer 10 may be aligned in a predetermined direction in the cavity 120. In some embodiments, the notch portion 130 may contact a notch of the wafer 10 to fix the wafer 10 in the cavity 120.

In some embodiments, the tray 100 may include an align mark 140. The align mark 140 may be located around each of the plurality of cavities 120 on a upper surface 111 of the body 110. The align mark 140 may locate the wafers 10 at predetermined positions on the tray 100. Also, semiconductor manufacturing equipment for performing a plurality of unit processes during a semiconductor package process may recognize positions of the cavities 120 and/or the wafers 10 positioned in the cavities 120 through the align mark 140.

As shown in FIG. 2b, the wafer 10 may be positioned in the cavity 120 such that an upper surface 11 of the wafer 10, on which a pad 13 is formed, faces upward and a lower surface of the wafer 10, which is opposite to the upper surface 11 thereof, faces the bottom surface of the cavity 120. In other words, when the wafer 10 is disposed in the cavity 120, an active surface of the wafer 10 may be exposed to the outside and an inactive surface of the wafer 10 may face the bottom surface of the cavity 120. A horizontal width of the cavity 120, for example, a horizontal width traversing a diameter of the cavity 120, may be greater than a horizontal width of the wafer 10, and accordingly, the side wall of the cavity 120 may be spaced a predetermined distance 190 from an edge of the wafer 10. The distance 190 between the side wall of the cavity 120 and the edge of the wafer 10 may be adjusted appropriately such that, when an insulating layer (for example, see 211 of FIG. 6b) is formed on the plurality of wafers 10 and the surface of the tray 100, for example, by a laminating method, a space 120S between the side wall of the cavity 120 and the edge of the wafer 10 is not filled by the insulating layer.

In some embodiments, the depth 120h of the cavity 120 may be substantially equal to a thickness 10h of the wafer 10. In other words, when the wafer 10 is located in the cavity 120, the upper surface 111 of the body 110 may be in the same level as the upper surface 11 of the wafer 10. That is, the upper surface 111 of the body 110 may be co-planar with the upper surface 11 of the wafer 10. When the upper surface 111 of the body 110 is in the same level as the upper surface 11 of the wafer 10, an insulating layer formed to cover the upper surface 111 of the body 110 and the upper surface 11 of the wafer 10 may have little stepped portion.

In the embodiments of the present disclosure, because at least a part of a semiconductor package manufacturing process is performed in the state in which the plurality of wafers 10 are arranged on the tray 100, the tray 100 may be made of a material having chemical resistance and thermal resistance.

In some embodiments, the tray 100 may be made of a metal material, for example, iron, nickel, cobalt, titanium, or an alloy thereof.

In some embodiments, the tray 100 may be made of a ceramic material, for example, alumina or silicon carbide.

In some embodiments, the tray 100 may be made of carbon fiber. Alternatively, the tray 100 may be made of prepreg, which is an insulator. For example, the tray 100 may be made of a material resulting from absorbing a thermosetting resin into reinforced fiber or the like before molding to harden to B-stage (a semi-hardened state of a resin).

Figure 3:
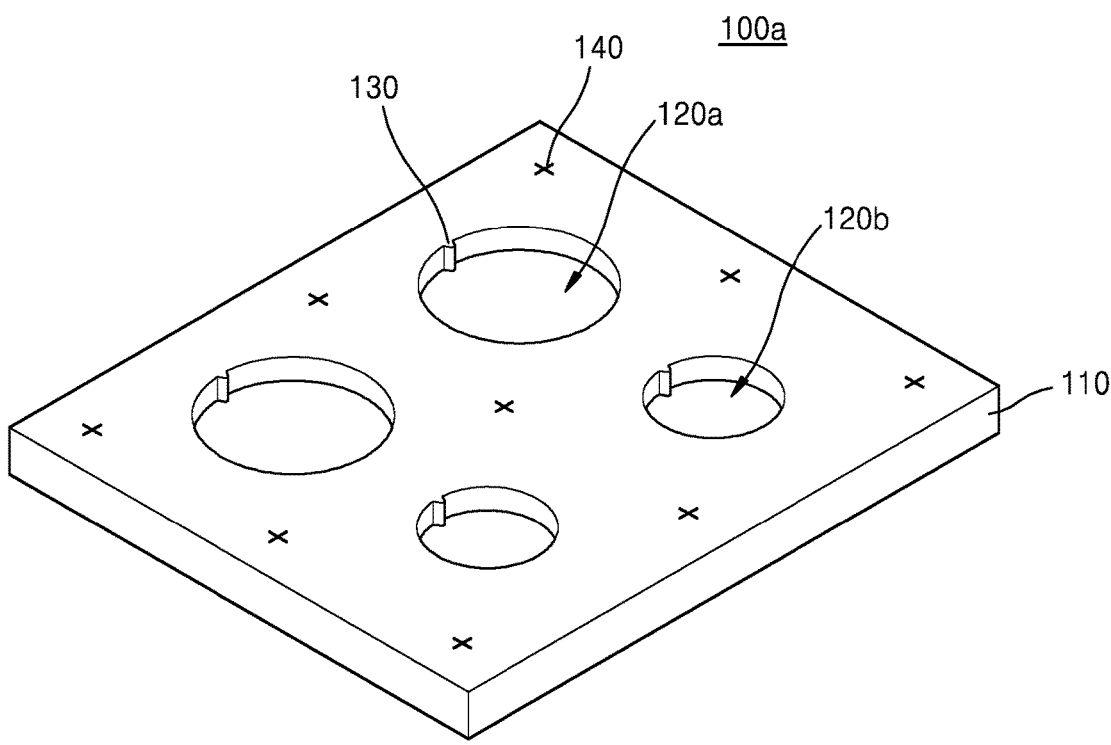
FIG. 3 is a perspective view of a tray according to some embodiments of a technical concept of the present disclosure.

FIG. 3 is a perspective view of a tray 100a according to some embodiments of a technical concept of the present disclosure. The tray 100a shown in FIG. 3 may have substantially the same configuration as the tray 100 shown in FIGS. 2a and 2b except that a plurality of cavities 120a and 120b have different horizontal widths. In FIG. 3, the same reference numerals as those used in FIGS. 2a and 2b indicate the same components, and therefore, detailed descriptions about the components will be omitted or briefly given.

Referring to FIG. 3, the tray 100a may include a first cavity 120a and a second cavity 120b having different horizontal widths. For example, a diameter of the first cavity 120a may be greater than that of the second cavity 120b. Because the tray 100a includes the first cavity 120a and the second cavity 120b having different horizontal widths, wafers having different diameters may be mounted on the tray 100a, simultaneously. Accordingly, the tray 100a may be used to simultaneously perform a semiconductor package process on wafers having different diameters.

In the drawings, the tray 100a is shown to include cavities having two different horizontal widths. However, the tray 100a may include cavities having three different horizontal widths or more.

Figure 4:
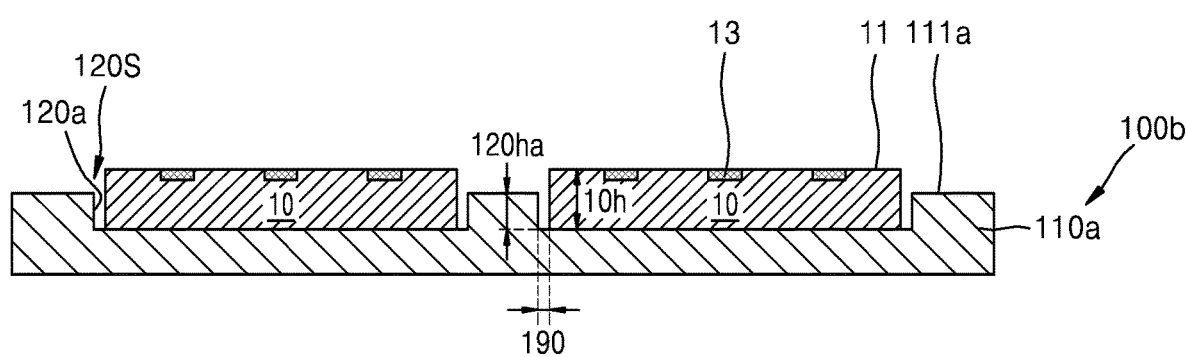
FIG. 4 is a cross-sectional view showing a state in which a plurality of wafers are arranged on a tray according to some embodiments of a technical concept of the present disclosure.

FIG. 4 is a cross-sectional view showing a state in which the plurality of wafers 10 are arranged on a tray 100b according to some embodiments of a technical concept of the present disclosure. The tray 100b shown in FIG. 4 may have substantially the same configuration as the tray 100 shown in FIGS. 2a and 2b except for a depth 120ha of cavities 120a. In FIG. 4, the same reference numerals as those used in FIGS. 2a and 2b indicate the same components, and therefore, detailed descriptions about the components will be omitted or briefly given.

Referring to FIG. 4, the depth 120ha of the cavities 120a provided in the tray 100b may be less than a thickness 10h of the wafers 10. Accordingly, when the wafers 10 are arranged in the cavities 120a, at least a portion of each wafer 10 may protrude from an upper surface 111a of a body 110a. That is, when the wafers 10 are arranged in the cavities 120a, the upper surface 11a of the body 110a may be in a level that is lower than the upper surfaces 11 of the wafers 10. In other words, a vertical distance between bottom surfaces of the cavities 120a and the upper surface 111a of the body 110 may be less than a vertical distance between the bottom surfaces of the cavities 120a and the upper surfaces 11 of the wafers 10 accommodated in the cavities 120a.

Although not shown in the drawing, the tray 100b may include a notch portion (see 130 of FIG. 2a) positioned on a side wall of each cavity 120a and/or an align mark (see 140 of FIG. 2a) provided on the upper surface 111a of the body 110a.

When the upper surface 111a of the body 110a is in a level that is lower than the upper surfaces 11 of the wafers 10, an insulating layer (for example, see 211 of FIG. 6b) formed to cover the upper surface 111a of the body 110a and the upper surfaces 11 of the wafers 10 may have stepped portions around the edges of the wafers 10. Also, the insulating layer may be formed to cover a portion of the side surfaces of the wafers 10.

Figure 5:
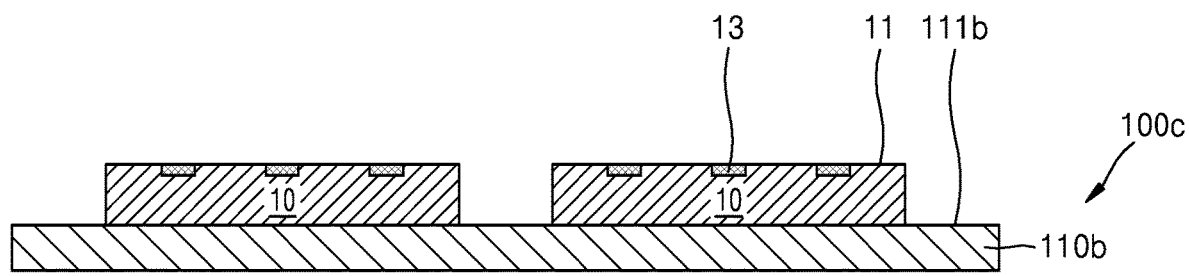
FIG. 5 is a cross-sectional view showing a state in which a plurality of wafers are arranged on a tray according to some embodiments of a technical concept of the present disclosure.

FIG. 5 is a cross-sectional view showing a state in which the plurality of wafers 10 are arranged on a tray 100c according to some embodiments of a technical concept of the present disclosure. The tray 100c shown in FIG. 5 may have substantially the same configuration as the tray 100 shown in FIGS. 2a and 2b except that the tray 100c has no cavity. In FIG. 5, the same reference numerals as those used in FIGS. 2a and 2b indicate the same components, and therefore, detailed descriptions about the components will be omitted or briefly given.

Referring to FIG. 5, the tray 100c may provide a flat upper surface 111b on which the plurality of wafers 10 may be arranged. The plurality of wafers 10 may be arranged at predetermined positions on an upper surface 111b of a body 110b.

Although not shown in the drawing, the tray 100c may include an align mark (see 140 of FIG. 2a) provided on the upper surface 111b of the body 110.

When the tray 100c has the flat upper surface 111b, an insulating layer (for example, see 211 of FIG. 6b) formed along the surface of the tray 100c and the surfaces of the wafers 10 may cover the upper surface 111b of the tray 100c, and cover the upper surfaces 11 of the wafers 10 and at least a portion of the side surfaces of the wafers 10. By the insulation layer, the wafers 10 arranged on the tray 100c may be fixed during a semiconductor package process.

FIGS. 6a to 6j are cross-sectional views showing a method of producing a semiconductor package, according to some embodiments of a technical concept of the present disclosure, in the order of processes. In FIGS. 6a to 6j, a method of producing a semiconductor package by using the tray 100 shown in FIGS. 2a and 2b will be described.

Figure 6A:
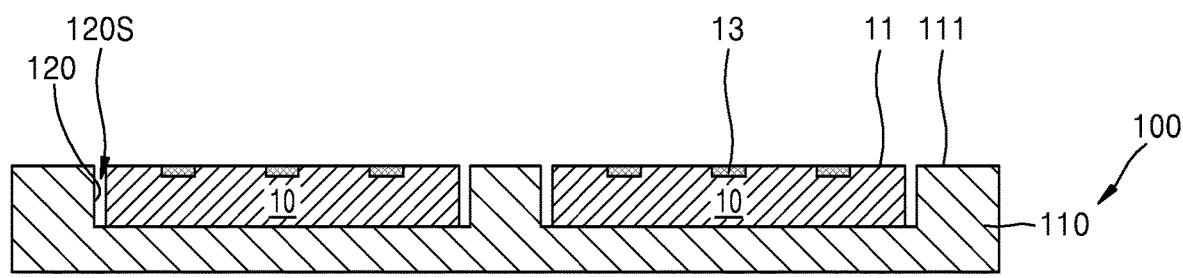
FIG. 6A is a cross-sectional view showing a method of producing a semiconductor package according to some embodiments of a technical concept of the present disclosure, where

Referring to FIG. 6a, a plurality of wafers 10 may be arranged on a tray 100. The respective wafers 10 may be accommodated in different cavities 120 provided in the tray 100. Each wafer 10 may be positioned in the cavity 120 such that an upper surface 11 of the wafer 10, on which a pad 13 is formed, is exposed. In other words, the wafer 10 may be positioned in the cavity 120 such that a lower surface of the wafer 10, which is opposite to the upper surface 11, faces a bottom surface of the cavity 120. In other words, an active surface of the wafer 10 may be exposed, and an inactive surface of the wafer 10 may contact a surface of the tray 100.

The wafer 10 may be positioned in the cavity 120 in such a way to be spaced from a side wall of the cavity 120. Because the side surface of the wafer 10 is spaced from the side wall of the cavity 120, a space 120S that opens in an up direction may be formed between the side surface of the wafer 10 and the side wall of the cavity 120.

As shown in FIG. 6a, a depth of the cavity 120 may be substantially equal to a thickness of the wafer 10, and accordingly, the upper surface 11 of the wafer 10 positioned in the cavity 120 and the upper surface 111 of the body 110 may have the same height level.

However, when the wafer 10 is positioned in the cavity 120, the upper surface of the body 110 may have a height level that is different from the upper surface 11 of the wafer 10. For example, the upper surface of the body 110 may have a level that is lower than the upper surface 11 of the wafer 10.

Figure 6B:
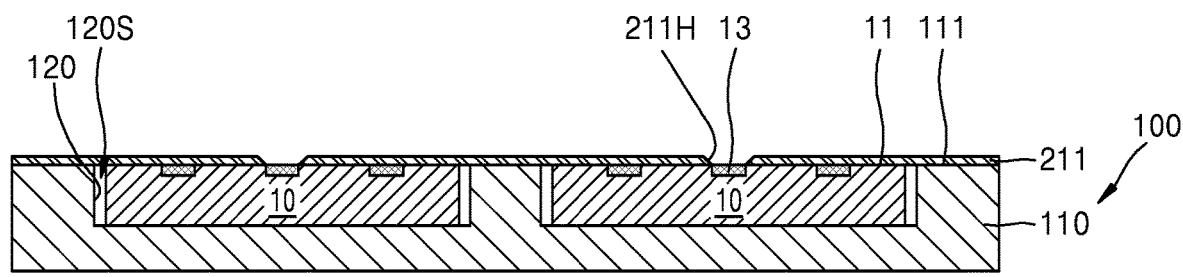

Referring to FIG. 6b, a first insulating layer 211 may be formed on the tray 100 and the plurality of wafers 10. The first insulating layer 211 may have an opening 211H to expose at least a portion of the pad 13. The first insulating layer 211 may cover the upper surface 111 of the body 110 and the upper surfaces 11 of the plurality of wafers 10.

The first insulating layer 211 may fix the wafers 10 positioned in the cavities 120 during a subsequent process. Also, the first insulating layer 211 may cover the space 120S between the wafers 10 and the side walls of the cavities 120. For example, the space 120S between the wafers 10 and the side walls of the cavities 120 may be sealed by the first insulating layer 211. When an interconnect structure is formed, the first insulating layer 211 may cover the space 120S between the wafers 10 and the side walls of the cavities 120 to prevent foreign materials from entering the space 120S.

In some embodiments, the first insulating layer 211 may cover a top area of the space 120S between the side surfaces of the wafers 10 and the side walls of the cavities 120 such that a material forming the first insulating layer 211 is not filled in the space 120S between the side surfaces of the wafers 10 and the side walls of the cavities 120. Because the material forming the first insulating layer 211 is not filled in the space 120S between the side surfaces of the wafers 10 and the side walls of the cavities 120, the wafers 10 may be easily separated from the tray 100, later.

In some embodiments, the first insulating layer 211 may be formed through a film process using an insulating film. More specifically, to form the first insulating layer 211, a photosensitive film may be attached on the upper surface 111 of the body 110 and the upper surfaces 11 of the plurality of wafers 10 by a laminating method, and then, a portion of the photosensitive film may be removed through exposure and development processes to expose the pads 13 of the wafers 10.

Also, in some embodiments, the first insulating layer 211 may include a non-photosensitive material. For example, to form the first insulating layer 211, a non-photosensitive film may be attached on the upper surface 111 of the body 110 and the upper surfaces 11 of the plurality of wafers 10, and then, a portion of the non-photosensitive film may be removed by a laser cutting apparatus to expose the pads 13 of the wafers 10.

The first insulating layer 211 may be formed with a polymer material such as, for example, polyimide.

Meanwhile, in other embodiments, the first insulating layer 211 may be formed by a spin-coating method.

Figure 6C:
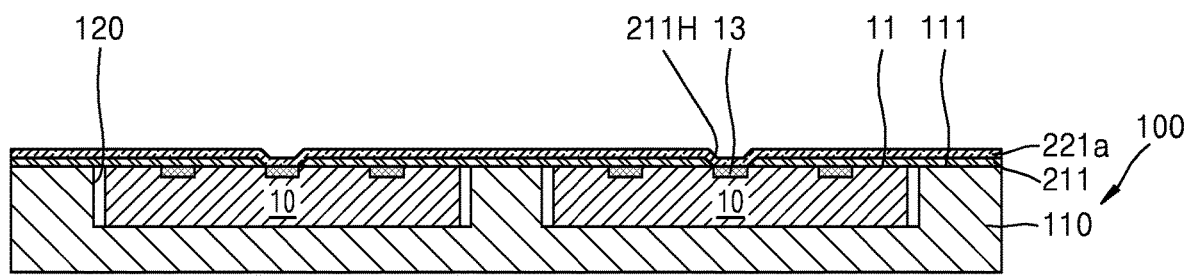

Referring to FIG. 6c, a seed metal layer 221a may be formed to cover a surface of the first insulating layer 211 and surfaces of the pads 13 exposed through openings 211H of the first insulating layer 211. The seed metal layer 221a may be deposited by, for example, a sputtering method. However, a method of forming the seed metal layer 221a is not limited to the sputtering method. The seed metal layer 221a may include any one of, for example, Ti, Cu, Ni, Al, Pt, Au, Ag, W, Ta, Co, or a combination thereof.

Figure 6D:
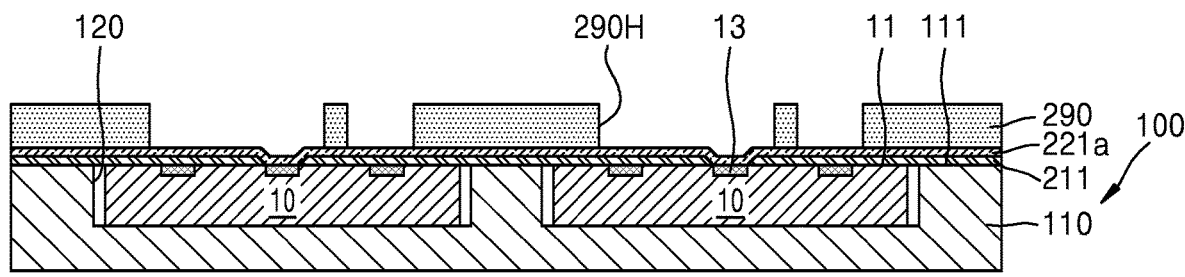

Referring to FIG. 6d, a first mask pattern 290 having a first mask opening 290H may be formed on the seed metal layer 221a. A portion of the seed metal layer 221a may be exposed by the first mask opening 290H.

The first mask pattern 290 may be formed by forming a photosensitive material film on the seed metal layer 221a and then performing a patterning process using photolithography technology on the photosensitive material film. For the photolithography process, an exposure mask on which a predetermined pattern is formed may be used, or a laser light source such as KrF or ArF may be used.

In some embodiments, the first mask pattern 290 may be formed by a film process. For example, a photosensitive film may be attached on the seed metal layer 221a to cover the seed metal layer 221a, and then, a portion of the seed metal layer 221a may be exposed through exposure and development processes to form the first mask opening 290H.

Figure 6E:
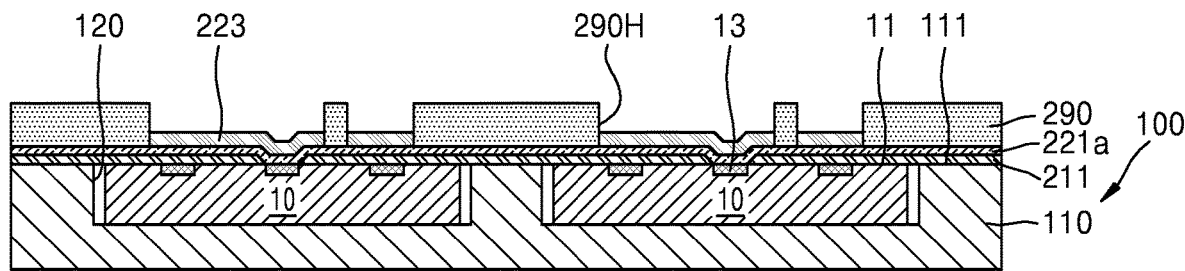

Referring to FIG. 6e, a first metal layer 223 may be formed to fill at least a portion of the first mask opening 290H. The first metal layer 223 may cover a surface of the seed metal layer 221a exposed through the first mask opening 290H.

The first metal layer 223 may be formed through, for example, a plating method. For example, the first metal layer 223 may be formed with copper. In some embodiments, the first metal layer 223 may be formed by a plating method using the seed metal layer 221a as a seed. For example, the first metal layer 223 may be formed by immersion plating, electroless plating, electroplating, or a combination thereof.

In some embodiments, the seed metal layer 221a may be formed with a substantially uniform thickness on the upper surface 111 of the tray 100 and the plurality of wafers 10. Particularly, when the depth of the cavities 120 is substantially equal to the thickness of the wafers 10 accommodated in the cavities 120, the seed metal layer 221a may be formed without any stepped portion even around the space (see 120S of FIG. 6b) between the side walls of the cavities 120 and the wafers 10 accommodated in the cavities 120. In this case, around the space between the side walls of the cavities 120 and the wafers 10 accommodated in the cavities 120, the seed metal layer 221a may be parallel to the upper surface 111 of the tray 100. Also, a thickness of the seed metal layer 221a on the space between the side walls of the cavities 120 and the wafers 10 accommodated in the cavities 120 may be substantially equal to a thickness of portions of the seed metal layer 221a on the plurality of wafers 10. Accordingly, in a plating process of applying power to the seed metal layer 221a by a plating jig (not shown), the power may be more uniformly transferred to the entirety of the seed metal layer 221a. For example, even when the plating jig contacts a portion of the seed metal layer 221a around an edge of the upper surface 111 of the tray 100, power applied through the plating jig may be uniformly transferred to the entirety of the seed metal layer 221a having a uniform thickness.

Figure 6F:
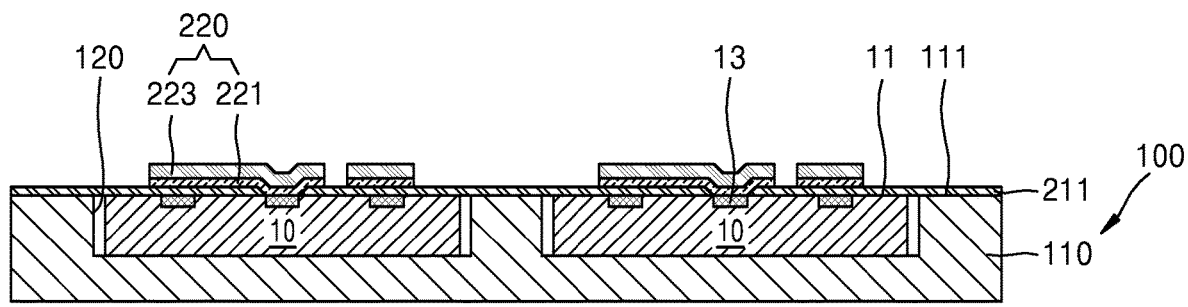

Referring to FIG. 6f, after the first metal layer 223 is formed, the first mask pattern 290 and the seed metal layer (221a of FIG. 6e) located below the first mask pattern 290 may be removed from the resultant structure of FIG. 6e.

To remove the first mask pattern 290, an ashing or strip process may be used. Also, after the first mask pattern 290 is removed, a chemical etching method may be used to remove the seed metal layer (221a of FIG. 6e) located below the first mask pattern 290.

In some embodiments, the first metal layer 223 and the seed metal layer 221a may be combined into one body to construct a distribution layer 220.

Figure 6G:
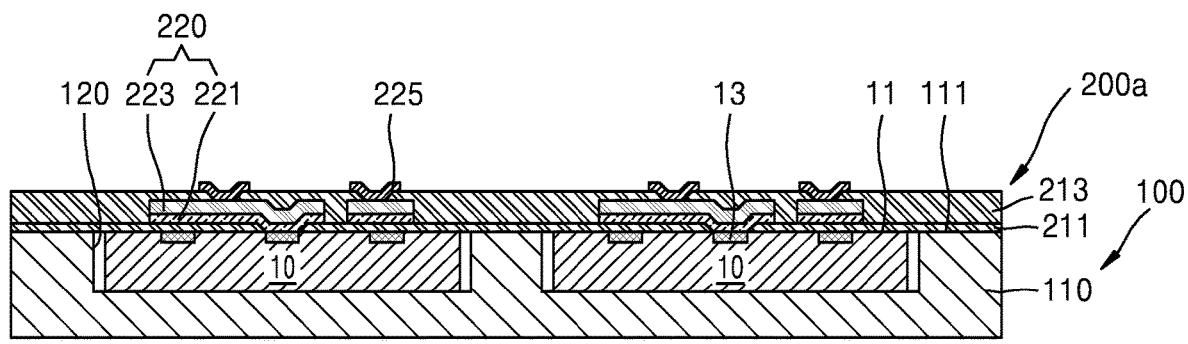

Referring to FIG. 6g, a second insulating layer 213 may be formed to cover the first metal layer 223, and successively, a second metal layer 225 may be formed to penetrate the second metal layer 213 to be connected to the first metal layer 223. In some embodiments, the first insulating layer 211, the distribution layer 220, the second insulating layer 213, and the second metal layer 225 may construct an interconnect structure 200a.

In some embodiments, the second insulating layer 213 may be formed by a film process, like the first insulating layer 211 described above with reference to FIG. 6b. The second insulating layer 213 may include a photosensitive material or a non-photosensitive material.

In some embodiments, the second metal layer 225 may be a under bump metal (UBM). In other embodiments, the second metal layer 225 may be omitted.

Figure 6H:
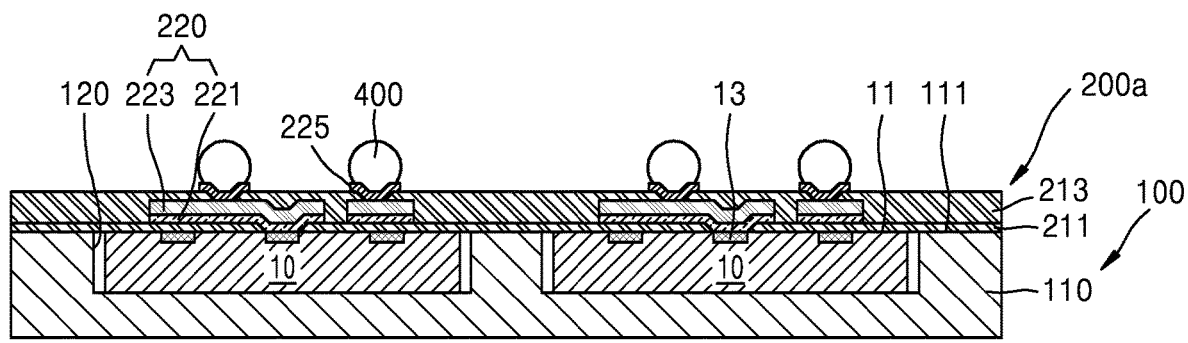

Referring to FIG. 6h, an external connection terminal 400 may be formed on the second metal layer 225. The external connection terminal 400 may be, for example, a solder ball or a solder bump. The external connection terminal 400 may electrically connect the semiconductor package with an external device. The external connection terminal 400 may be electrically connected to the pads 13 of the wafers 10 via the seed metal layer 221, the first metal layer 223, and the second metal layer 225. Meanwhile, when the second metal layer 225 is omitted, the external connection terminal 400 may be attached on the first metal layer 223 exposed by the second insulating layer 213.

Figure 6I:
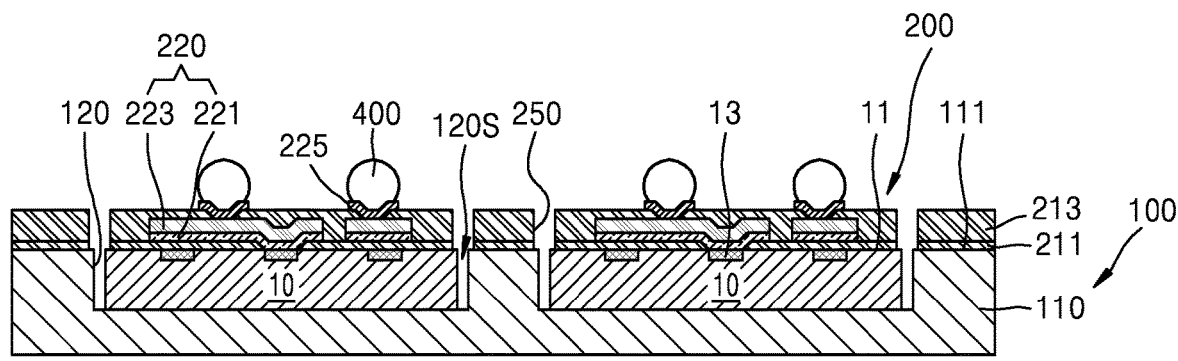

Referring to FIG. 6i, to separate the plurality of wafers 10 from the tray 100, a portion of a structure stacked on the tray 100 and/or the plurality of wafers 10 may be removed. At this time, a material remaining between the side walls of the cavities 120 and the wafers 120 accommodated in the cavities 120 may be also removed.

For example, by removing the portion of the structure stacked on the tray 100 and/or the plurality of wafers 10, a separation lane 250 may be formed in the interconnection structure 200. The separation lane 250 may penetrate the first insulating layer 211 and the second insulating layer 213 perpendicularly, and be formed along the edge of each of the plurality of wafers 10. The separation lane 250 may be in the shape of a ring, as seen from above. By the separation lane 250, the space 120S between the side walls of the cavities 120 and the edges of the wafers 10 may be exposed. Further, a portion of the edges of the wafers 10 and/or a portion of the surface of the tray 100 may also be exposed. By the separation lane 250, wafer level semiconductor packages including the wafers 10 and the interconnect structure 200 formed on the wafers 10 may be separated from each other.

The separation lane 250 may be formed by, for example, a laser drilling method.

Figure 6J:
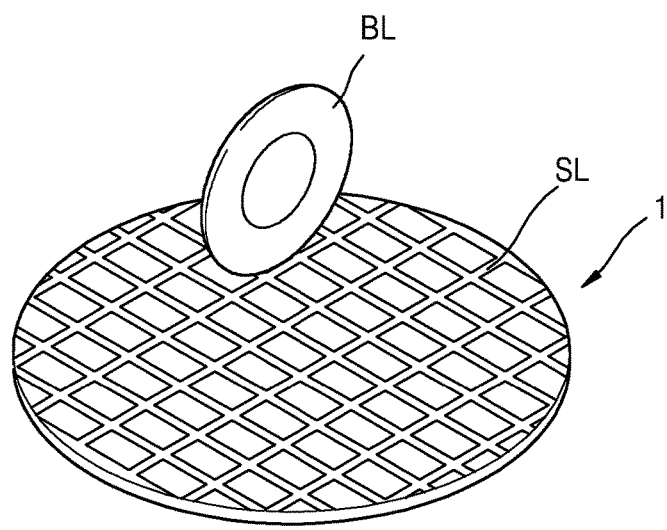

Referring to FIG. 6*j*, a wafer level semiconductor package 1 may be separated from the tray (100 of FIG. 6*i*), and the wafer level semiconductor package 1 may be singulated into a plurality of package unit semiconductor packages through a sawing process. In other words, a sawing blade BL may cut the wafer level semiconductor package 1 along a scribe lane SL to separate the wafer level semiconductor package 1. As a result, the wafer level semiconductor package 1 may be singulated into a plurality of package unit semiconductor packages.

FIGS. 7*a* to 7*d* are cross-sectional views showing a method of producing a semiconductor package, according to some embodiments of a technical concept of the present disclosure, in the order of processes. In FIGS. 7*a* to 7*d*, a method of producing a semiconductor package by using the tray 100*c* shown in FIG. 5 will be described, and descriptions overlapping with those given above with reference to FIGS. 6*a* to 6*j* will be omitted or briefly given.

Figure 7A:
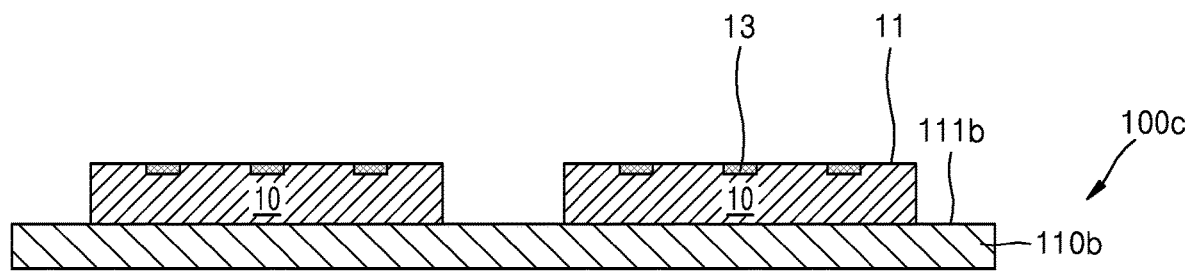
FIG. 7A is a cross-sectional view showing a method of producing a semiconductor package according to some embodiments of a technical concept of the present disclosure, where

Referring to FIG. 7*a*, a plurality of wafers 10 may be arranged on the tray 100*c*. An upper surface 11 of each of the plurality of wafers 10, on which a pad 13 is formed, may be exposed upward, and a lower surface of the wafer 10, which is opposite to the upper surface 11, may face a surface of the tray 100*c*. To arrange the plurality of wafers 10 at predetermined positions on the tray 100*c*, an align mark (see 140 of FIG. 2*a*) provided on the tray 100*c* may be used.

Figure 7B:
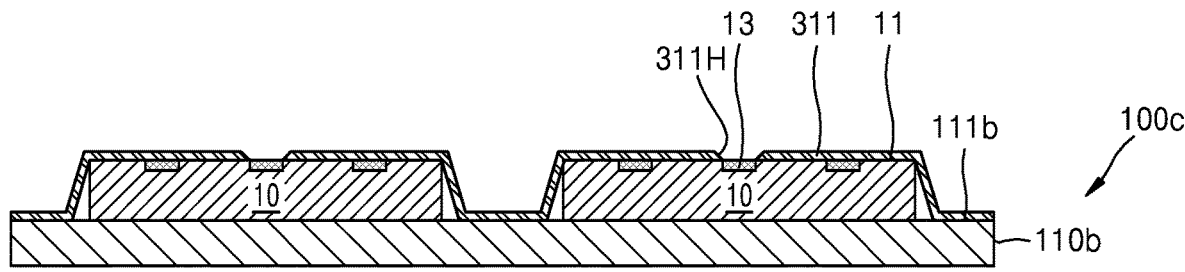

Referring to FIG. 7*b*, a first insulating layer 311 covering the surface of the tray 100*c* and the surface of the wafer 10 and having an opening 311H exposing the pad 13 of the wafer 10 may be formed. Because the upper surface 11 of the wafer 10 has a level that is higher than the surface of the tray 100*c*, the first insulating layer 311 may have a stepped shape. The first insulating layer 311 may fix the plurality of wafers 10 at predetermined positions on the tray 100*c* during a subsequent process.

Figure 7C:
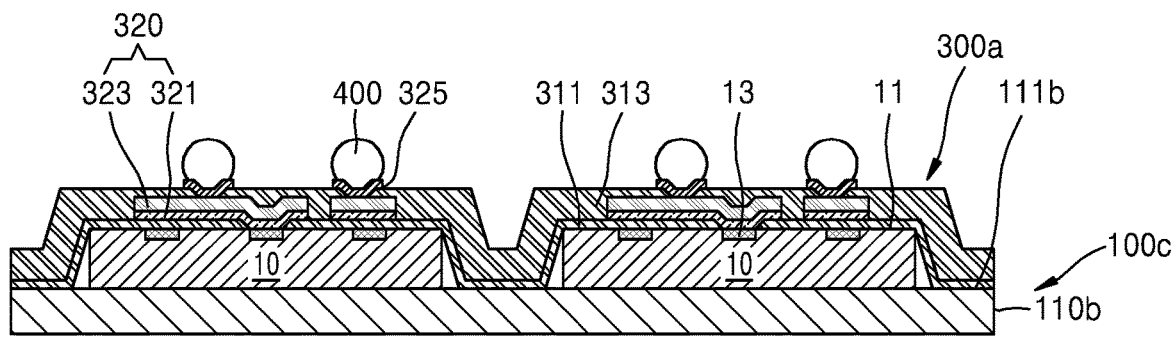

Referring to FIG. 7*c*, an interconnect structure 300*a* may be formed on the plurality of wafers 10 and the tray 100*c* through the substantially same process as that described above with reference to FIGS. 6*c* to 6*g*, and an external connection terminal 400 connected to a second metal layer 325 may be formed.

Figure 7D:
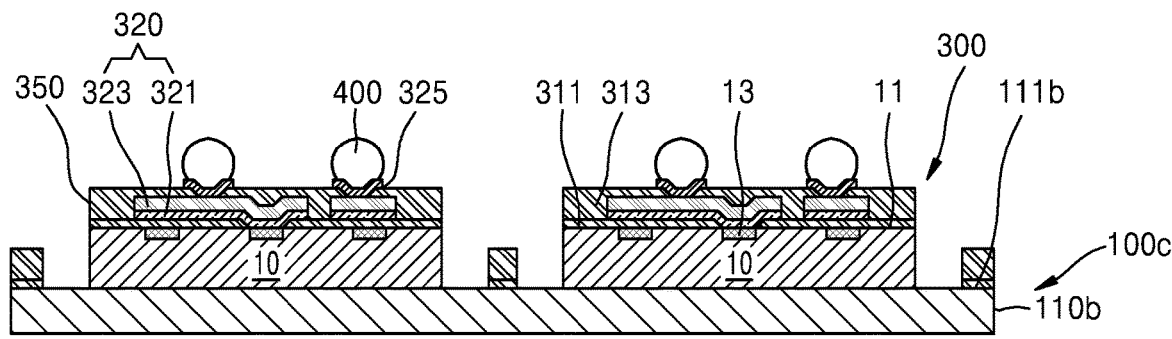

Referring to FIG. 7*d*, to separate the plurality of wafers 10 from the tray 100*c*, a portion of the first insulating layer 311 and a portion of a second insulating layer 313 may be removed along the edges of the plurality of wafers 10.

Because a portion of the first insulating layer 311 and a portion of the second insulating layer 313 are removed along the edges of the plurality of wafers 10, a separation lane 350 may be formed in the interconnect structure 300. By the separation lane 350, wafer level semiconductor packages including the wafers 10 and the interconnect structure 300 formed on the wafers 10 may be separated from each other.

After the separation lane 350 is formed, the wafer level semiconductor packages may be separated from the tray 100*c*. Each of the separated wafer level semiconductor packages may be singulated into a plurality of package unit semiconductor packages through a sawing process.

By the method of producing the semiconductor package, according to the embodiments of the present disclosure, a plurality of unit processes of a semiconductor package process may be performed by using a tray capable of supporting a plurality of wafers. That is, because the semiconductor package process is performed by arranging a plurality of wafers on a tray, a plurality of wafer level semiconductor packages may be manufactured in a panel level. Accordingly, by the technical concept of the present disclosure, semiconductor package processes for a plurality of wafers can be performed at the same time, which leads to improving productivity.

Figure 8:
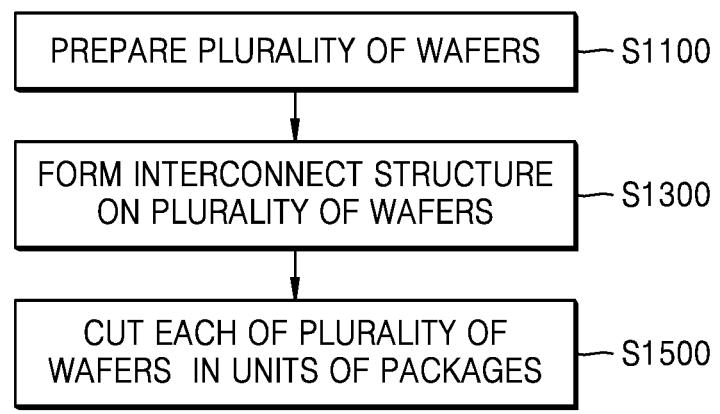
FIG. 8 is a flowchart showing a method of producing a semiconductor package, according to some embodiments of a technical concept of the present disclosure.

FIG. 8 is a flowchart showing a method of producing a semiconductor package, according to some embodiments of a technical concept of the present disclosure.

Referring to FIG. 8, the method of producing the semiconductor package, according to the embodiments of the present disclosure, may sequentially perform operation S1100 of preparing a plurality of wafers, operation S1300 of forming an interconnect structure on the plurality of wafers, and operation S1500 of cutting each of the plurality of wafers in units of packages.

More specifically, in operation S1100 of preparing the plurality of wafers, a plurality of wafers including a semiconductor substrate and a semiconductor device formed on the semiconductor substrate may be prepared.

The semiconductor substrate may include, for example, silicon (Si). Alternatively, the semiconductor substrate may include a semiconductor element such as germanium (Ge), or a compound semiconductor, such as silicon carbide (SiC), gallium arsenide (GaAs), indium arsenide (InAs), and indium phosphide (InP). Alternatively, the semiconductor substrate may have a silicon on insulator (SOI) structure. For example, the semiconductor substrate may include a buried oxide layer (BOX). The semiconductor substrate may include a conductive area, for example, an impurity-doped well. Also, the semiconductor substrate may have various isolation structures such as a shallow trench isolation (STI) structure.

The semiconductor device may include various kinds of individual devices. For example, the plurality of individual devices may include various microelectronic devices, for example, a metal-oxide-semiconductor field effect transistor (MOSFET) (e.g., a complementary metal-insulator-semiconductor (CMOS) transistor), an image sensor (e.g., system large scale integration (LSI) and a CMOS imaging sensor (CIS)), a micro-electro-mechanical system (MEMS), an active device, a passive device, etc. The plurality of individual devices may be electrically connected to the conductive area of the semiconductor substrate. The semiconductor device may further include a conductive wire or a conductive plug electrically connecting at least two of the plurality of individual devices to each other, or electrically connecting the plurality of individual devices to the conductive area of the semiconductor device. Also, each of the plurality of individual devices may be electrically insulated from the neighboring individual devices by insulating films.

Then, in operation S1300 of forming the interconnect structure on the plurality of wafers, an interconnect structure may be formed simultaneously on the plurality of wafers arranged on the tray. Herein, the interconnect structure (see 200 of FIG. 10*j*) may mean a structure formed on a wafer to electrically connect a pad of a semiconductor device formed on the wafer with an external device.

In operation S1300 of forming the interconnect structure on the plurality of wafers, some processes may be performed in the state in which the plurality of wafers are arranged on the tray, and the other processes may be performed in the state in which the plurality of wafers are separated from the tray. That is, operation S1300 of forming the interconnect structure on the plurality of wafers may include an operation of arranging the plurality of wafers on the tray and/or an operation of separating the plurality of wafers from the tray between unit processes for a semiconductor package.

In the operation of arranging the plurality of wafers on the tray, a tray (for example, see 100 of FIG. 2a) having an appropriate structure to arrange the plurality of wafers thereon may be prepared, and the plurality of wafers may be arranged at predetermined positions on the tray. In some embodiments, a plurality of cavities for accommodating the plurality of wafers may be formed to facilitate an arrangement of the plurality of wafers. When the wafers are arranged in the cavities of the tray, the upper surfaces of the wafers, on which pads are formed, may face upward, and the lower surfaces of the wafers, which are opposite to the upper surfaces thereof, may contact the surface of the tray.

Also, in the operation of separating the plurality of wafers from the tray, a portion of a structure formed through the operation of forming the interconnect structure on the plurality of wafers may be removed, and then, the plurality of wafers may be separated from the tray.

Operation S1300 of forming an interconnect structure on the plurality of wafers will be described in more detail, below.

Thereafter, in operation S1500 of cutting the plurality of wafers in units of packages, a sawing process may be performed on a wafer level semiconductor package including the interconnect structure to singulate the wafer level semiconductor package into a plurality of package unit semiconductor packages.

By the method of producing the semiconductor package, according to the embodiments of the present disclosure, a compact semiconductor package with excellent heat-dissipating efficiency may be manufactured by using wafer level package technology.

Further, by the method of producing the semiconductor package, according to embodiments of the present disclosure, a plurality of wafers may be arranged on a tray so that at least a part of unit processes of a semiconductor package process may be performed in a panel level. Accordingly, a semiconductor package process may be performed simultaneously on the plurality of wafers, thereby simplifying the semiconductor package process and improving productivity.

Figure 9:
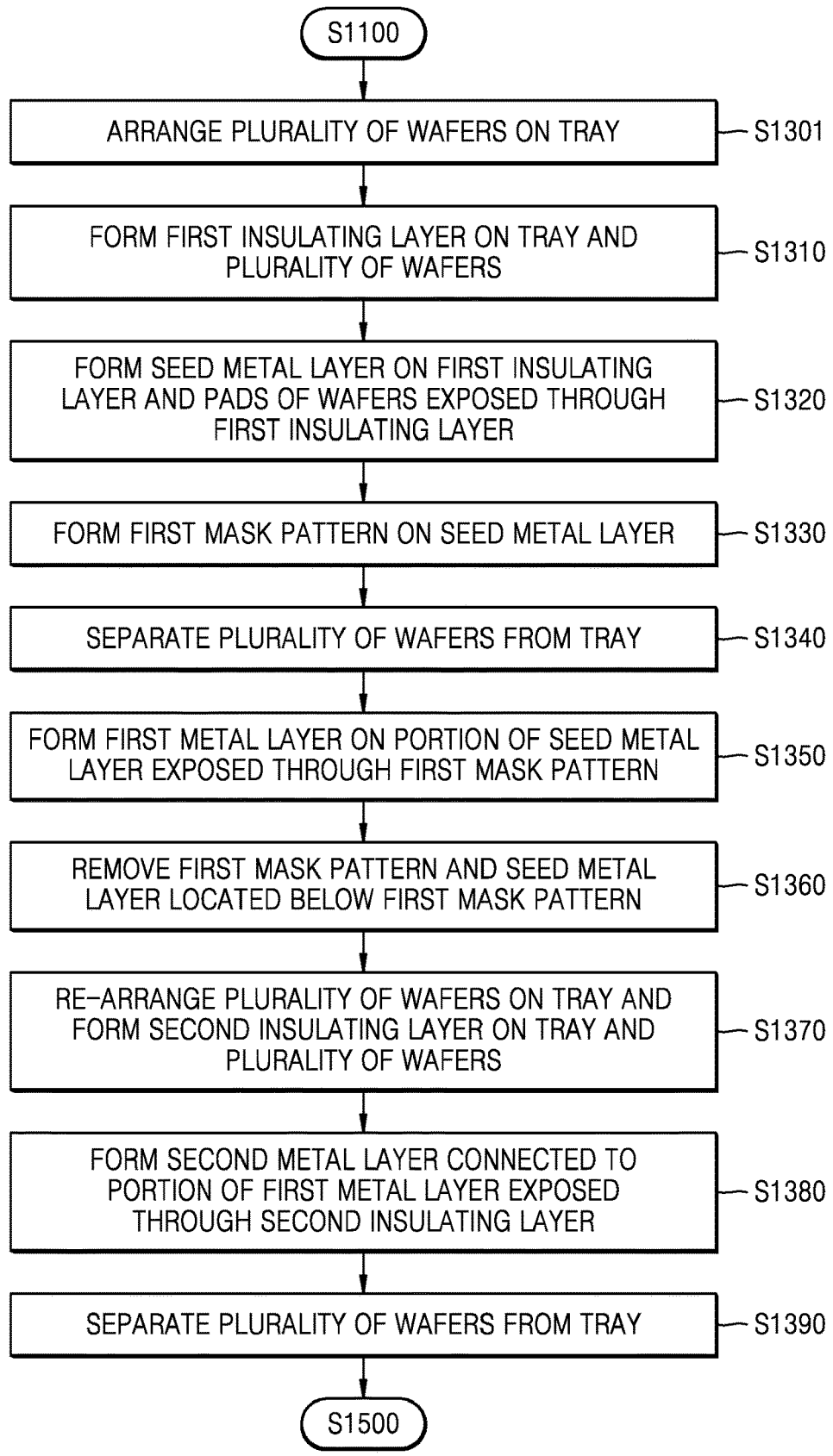
FIG. 9 is a flowchart showing a method of producing a semiconductor package, according to some embodiments of the present disclosure.

FIG. 9 is a flowchart showing a method of producing a semiconductor package, according to some embodiments of the present disclosure. FIGS. 10a to 10k are cross-sectional views showing a method of producing a semiconductor package, according to some embodiments of a technical concept of the present disclosure, in the order of processes. Hereinafter, a method of producing a semiconductor package using the tray 100 shown in FIGS. 2a and 2b will be described with reference to FIGS. 9 and 10a to 10k.

Figure 10A:
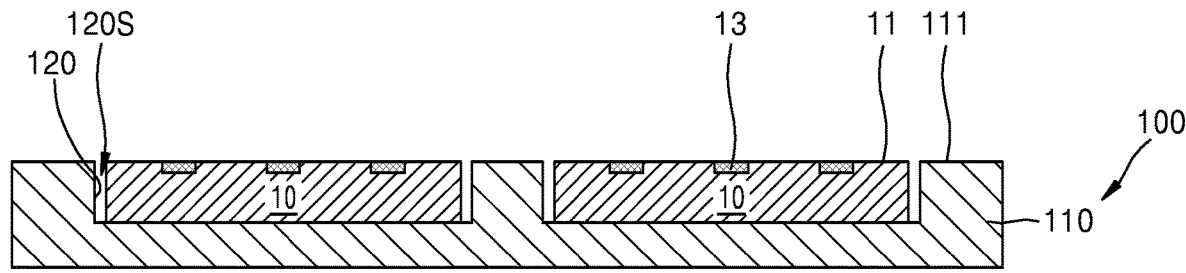
FIG. 10A is a cross-sectional view showing a method of producing a semiconductor package according to some embodiments of a technical concept of the present disclosure, where

Referring to FIGS. 9 and 10a, a plurality of wafers 10 may be arranged on the tray 100 (S1301). The respective wafers 10 may be accommodated in different cavities 120 provided in the tray 100. Each wafer 10 may be positioned in the cavity 120 such that an upper surface 11 of the wafer 10, on which a pad 13 is formed, is exposed upward, and a lower surface of the wafer 10, which is opposite to the upper surface 11, faces a bottom surface of the cavity 120. In other words, an active surface of the wafer 10 may be exposed, and an inactive surface of the wafer 10 may contact a surface of the tray 100.

The wafer 10 may be positioned in the cavity 120 in such a way to be spaced from a side wall of the cavity 120. Because a side surface of the wafer 10 is spaced from the side wall of the cavity 120, a space 120S that opens in an up direction may be formed between the side surface of the wafer 10 and the side wall of the cavity 120.

As shown in FIG. 10a, a depth of the cavity 120 may be substantially equal to a thickness of the wafer 10, and accordingly, the upper surface 11 of the wafer 10 positioned in the cavity 120 and an upper surface 111 of the body 110 may have the same height level.

However, when the wafer 10 is positioned in the cavity 120, the upper surface of the body 110 may have a height level that is different from the upper surface 11 of the wafer 10. For example, the upper surface of the body 110 may have a level that is lower than the upper surface 11 of the wafer 10.

In some embodiments, to arrange the wafers 10 at predetermined positions in the cavities 120, a notch portion (see 130 of FIG. 2a) and/or an align mark (see 140 of FIG. 2a) provided on the tray 100 may be used.

Figure 10B:
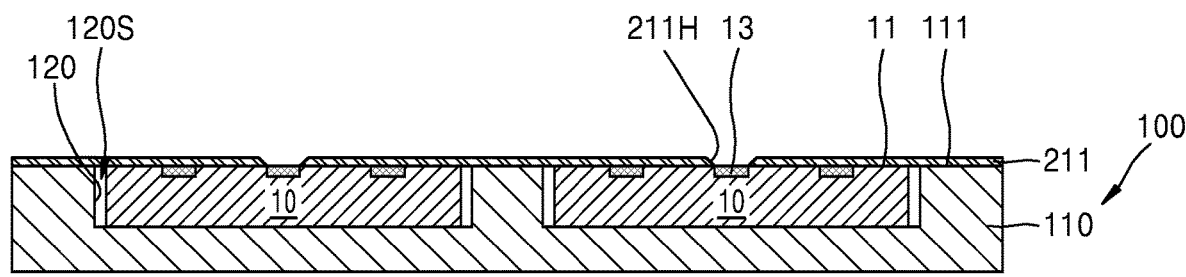

Referring to FIGS. 9 and 10b, a first insulating layer 211 may be formed on the tray 100 and the plurality of wafers 10 (S1310). The first insulating layer 211 may have an opening 211H to expose at least a portion of the pad 13. The first insulating layer 211 may cover the upper surface 111 of the body 110 and the upper surfaces 11 of the plurality of wafers 10.

The first insulating layer 211 may fix the wafers 10 positioned in the cavities 120 during a subsequent process. Also, the first insulating layer 211 may cover the space 120S between the wafers 10 and the side walls of the cavities 120. For example, the space 120S between the wafers 10 and the side walls of the cavities 120 may be sealed by the first insulating layer 211. When an interconnect structure is formed, the first insulating layer 211 may cover the space 120S between the wafers 10 and the side walls of the cavities 120 to prevent foreign materials from entering the space 120S.

In some embodiments, the first insulting layer 211 may cover a top area of the space 120S between the side surfaces of the wafers 10 and the side walls of the cavities 120 such that a material forming the first insulating layer 211 is not filled in the space 120S between the side surfaces of the wafers 10 and the side walls of the cavities 120. Because the material forming the first insulating layer 211 is not filled in the space 120S between the side surfaces of the wafers 10 and the side walls of the cavities 120, the wafers 10 may be easily separated from the tray 100, later.

In some embodiments, the first insulating layer 211 may be formed through a film process. More specifically, to form the first insulating layer 211, an insulating film may be attached on the upper surface 111 of the body 110 and the upper surfaces 11 of the plurality of wafers 10 by a laminating method, and then, a portion of the insulating film may be removed to expose the pads 13 of the wafers 10. The insulating film may be a photosensitive film, and exposure and development processes may be performed to remove a portion of the photosensitive film.

Also, in some embodiments, the first insulating layer 211 may include a non-photosensitive material. For example, to form the first insulating layer 211, a non-photosensitive film may be attached on the upper surface 111 of the body 110 and the upper surfaces 11 of the plurality of wafers 10, and then, a portion of the non-photosensitive film may be removed by a laser cutting apparatus to expose the pads 13 of the wafers 10.

The first insulating layer 211 may be formed with a polymer material such as, for example, polyimide.

Meanwhile, in other embodiments, the first insulating layer 211 may be formed by a spin-coating method.

Figure 10C:
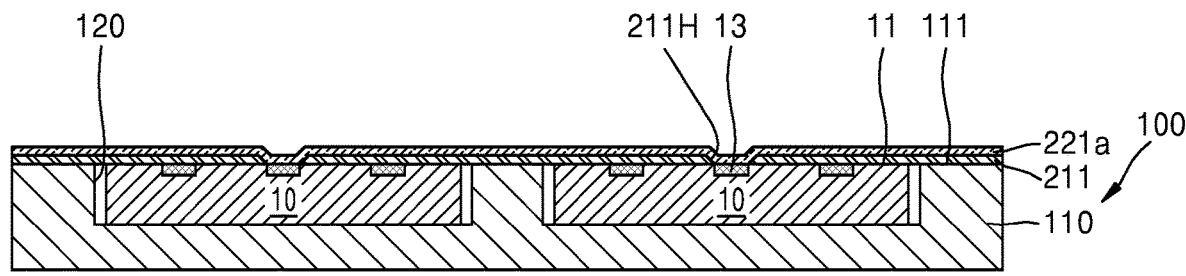

Referring to FIGS. 9 and 10c, a seed metal layer 221a may be formed to cover a surface of the first insulating layer 211 and a surface of the pad 13 exposed through the opening 211H of the first insulating layer 211 (S1320). The seed metal layer 221a may be deposited by, for example, a sputtering method. However, a method of forming the seed metal layer 221a is not limited to the sputtering method. The seed metal layer 221a may include any one of, for example, Ti, Cu, Ni, Al, Pt, Au, Ag, W, Ta, Co, or a combination thereof.

Figure 10D:
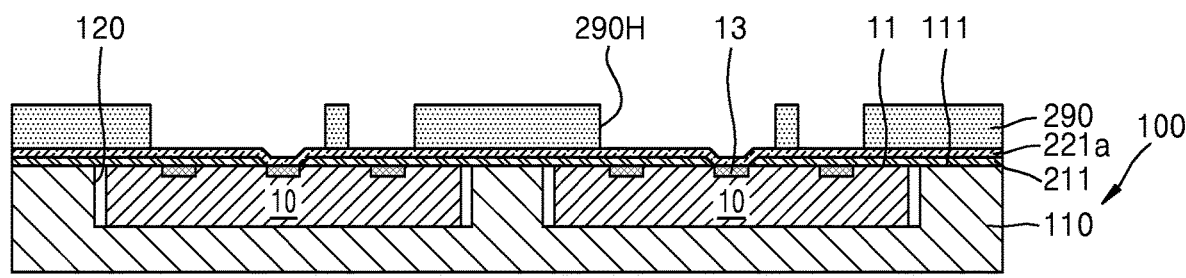

Referring to FIGS. 9 and 10d, a first mask pattern 290 having a first mask opening 290H may be formed on the seed metal layer 221a (S1330). A portion of the seed metal layer 221a may be exposed by the first mask opening 290H.

The first mask pattern 290 may be formed, for example, by forming an insulating film on the seed metal layer 221a and then performing a patterning process on the insulating film.

In some embodiments, the first mask pattern 290 may be formed by a film process. For example, to form the first mask pattern 290, a photosensitive film may be attached on the seed metal layer 221a to cover the seed metal layer 221a, and then, a portion of the seed metal layer 221a may be exposed through exposure and development processes to form the first mask opening 290H.

Figure 10E:
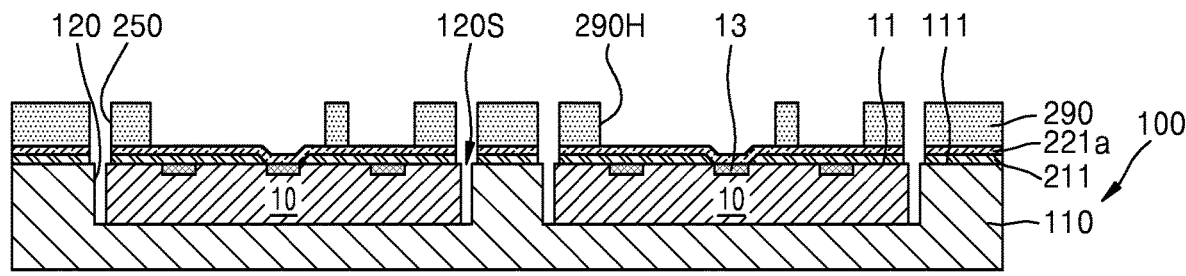

Referring to FIGS. 9 and 10e, to separate the plurality of wafers 10 from the tray 100, a portion of a structure stacked on the tray 100 and/or the plurality of wafers 10 may be removed, and the plurality of wafers 10 may be separated from the tray 100 (S1340). At this time, a material remaining between the side walls of the cavities 120 and the wafers 120 accommodated in the cavities 120 may be also removed.

For example, by removing the portion of the structure stacked on the tray 100 and/or the plurality of wafers 10, a separation lane 250 may be formed. For example, the separation lane 250 may penetrate the first insulating layer 211, the seed metal layer 221a, and the first mask pattern 290 perpendicularly, and extend along the edge of each of the plurality of wafers 10. The separation lane 250 may be in the shape of a ring, as seen from above. By the separation lane 250, the space 120S between the side walls of the cavities 120 and the edges of the wafers 10 may be exposed upward. Further, by the separation lane 250, a portion of the edges of the wafers 10 and/or a portion of the surface of the tray 100 may also be exposed. The separation lane 250 may be formed by, for example, a laser drilling method.

Figure 10F:
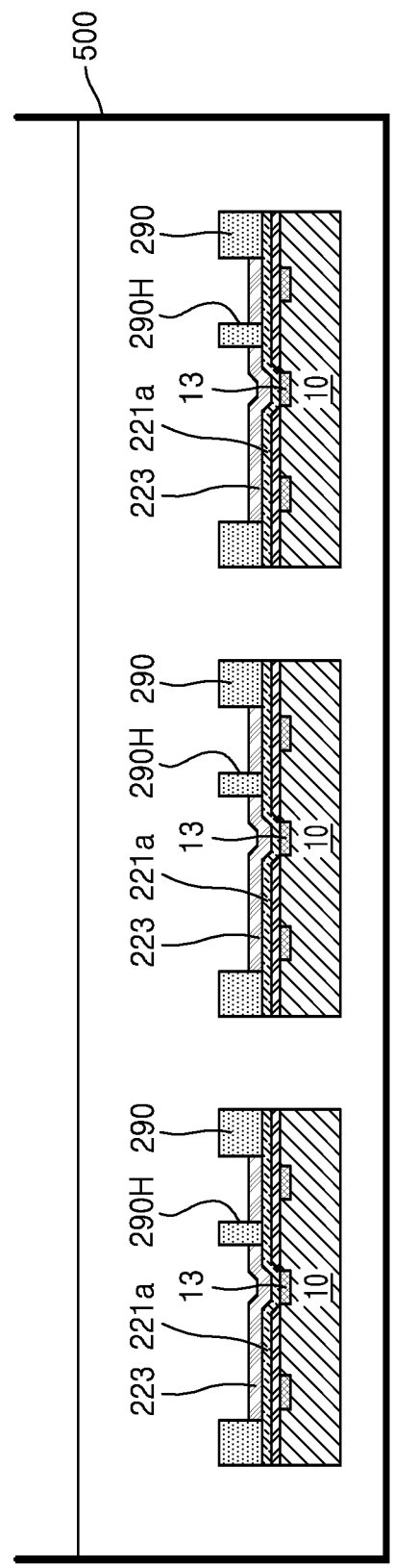

Referring to FIGS. 9 and 10f, a first metal layer 223 may be formed on each of the separated wafers 10 to fill at least a portion of the first mask opening 290H (S1350). The first metal layer 223 may cover a surface of a portion of the seed metal layer 221a exposed through the first mask opening 290H.

The first metal layer 223 may be formed by, for example, a plating method. For example, the first metal layer 223 may be formed with copper. In some embodiments, the first metal layer 223 may be formed by a plating method using the seed metal layer 221a as a seed. For example, the first metal layer 223 may be formed by immersion plating, electroless plating, electroplating, or a combination thereof.

In some embodiments, a plating process for forming the first metal layer 223 may be performed simultaneously on a large number of wafers 10 than a number (hereinafter, referred to as a 'tray unit') of wafers 10 that can be accommodated in a single tray. For example, the plating process may be performed by immersing a larger number of wafers 10 than the tray unit in a plating bath 500 in which an electrolyte is stored. Therefore, a plating process may be performed more efficiently than a case in which a plating process is performed in a tray unit.

Figure 10G:
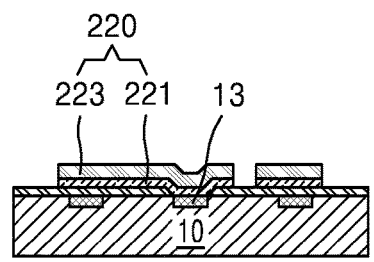

Referring to FIGS. 9 and 10g, after the first metal layer 223 is formed, the first mask pattern 290 and the seed metal layer (221a of FIG. 10f) located below the first mask pattern 290 may be removed from the resultant structure of FIG. 10f (S1360).

To remove the first mask pattern 290, an ashing or strip process may be used. Also, after the first mask pattern 290 is removed, a chemical etching method may be used to remove the seed metal layer (221a of FIG. 10f) located below the first mask pattern 290.

In some embodiments, the first metal layer 223 and the seed metal layer 221 may be combined into one body to construct a distribution layer 220.

Figure 10H:
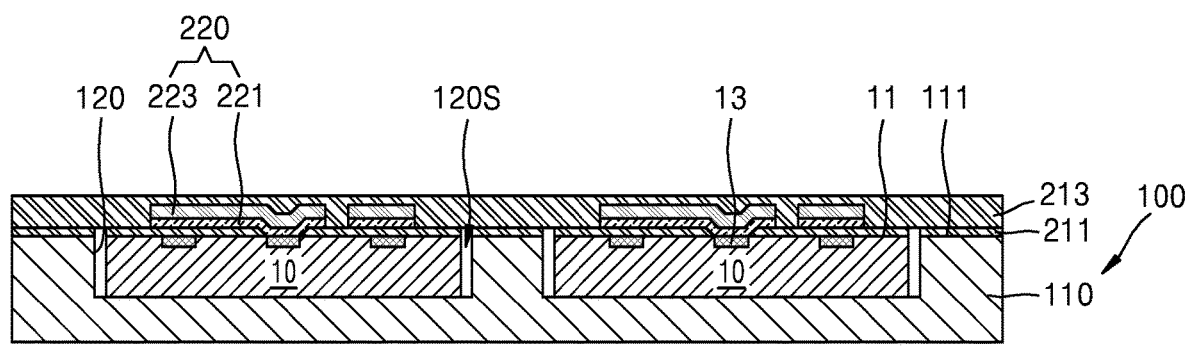

Referring to FIGS. 9 and 10h, a plurality of wafers 10 each being a resultant structure shown in FIG. 10g may be arranged on the tray 100 (S1370). The plurality of wafers 10 may be arranged on the tray 100 such that the first metal layer 223 is exposed upward, and the respective wafers 10 may be accommodated in different cavities 120 formed in the tray 100. In some embodiments, to arrange the wafers 10 at predetermined positions in the cavities 120, a notch portion (see 130 of FIG. 2a) and/or an align mark (see 140 of FIG. 2a) provided on the tray 100 may be used.

Meanwhile, in FIG. 10h, the first insulating layer 211 is shown to remain on the upper surface 111 of the tray 100. However, unlike this, a first mask pattern (see 290 of FIG. 10e) may remain on the first insulating layer 211. Alternatively, the tray 100 from which the first insulating layer 211 has been removed may be used.

After the plurality of wafers 10 are arranged on the tray 100, a second insulating layer 213 may be formed to cover the upper surface 111 of the tray 100 and the plurality of wafers 10. The second insulating layer 213 may cover the first insulating layer 211 on the tray 100, the first insulating layer 211 on the plurality of wafers 10, and the first metal layer 223. The second insulating layer 213 may include an opening to expose a portion of the first metal layer 223.

The second insulating layer 213 may fix the wafers 10 on the tray 100 during a subsequent process. Also, the second insulating layer 213 may cover the space 120S between the edges of the wafers 10 and the side walls of the cavities 120. For example, the second insulating layer 213 may seal up the space 120S between the side walls of the cavities 120 and the edges of the wafers 10.

In some embodiments, the second insulating layer 213 may be formed by a film process, similarly to the first insulating layer 211 described above with reference to FIG. 10b. The second insulating layer 213 may include a photosensitive material or a non-photosensitive material.

Figure 10I:
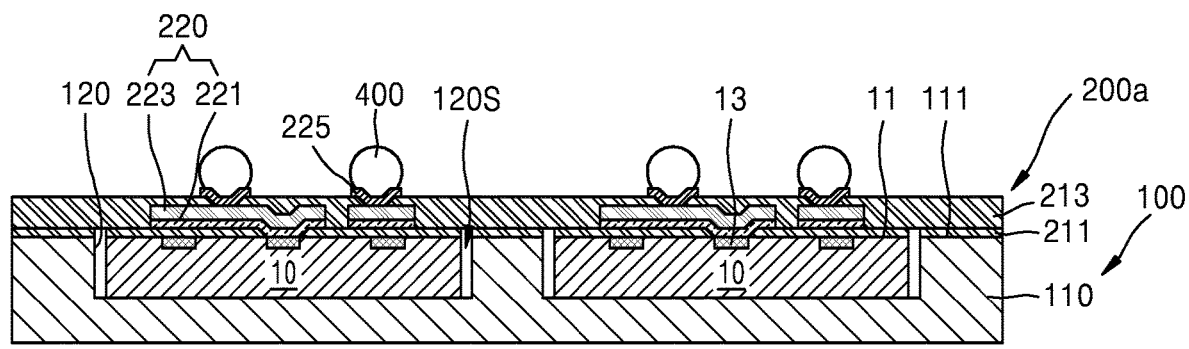

Referring to FIGS. 9 and 10i, the second metal layer 225 may be formed to be connected to a portion of the first metal layer 223 exposed through the second insulating layer 213 (S1380). In some embodiments, the first insulating layer 211, the distribution layer 220, the second insulating layer 213, and the second metal layer 225 may construct an interconnect structure 200a.

In some embodiments, the second metal layer 225 may be a under bump metal (UBM). In other embodiments, the second metal layer 225 may be omitted.

After the second metal layer 225 is formed, an external connection terminal 400 may be formed on the second metal layer 225. The external connection terminal 400 may be, for example, a solder ball or a solder bump. The external connection terminal 400 may electrically connect the semiconductor package with an external device. The external connection terminal 400 may be electrically connected to the pads 13 of the wafers 10 via the seed metal layer 221, the first metal layer 223, and the second metal layer 225. Meanwhile, when the second metal layer 225 is omitted, the external connection terminal 400 may be attached on the first metal layer 223 exposed by the second insulating layer 213.

Figure 10J:
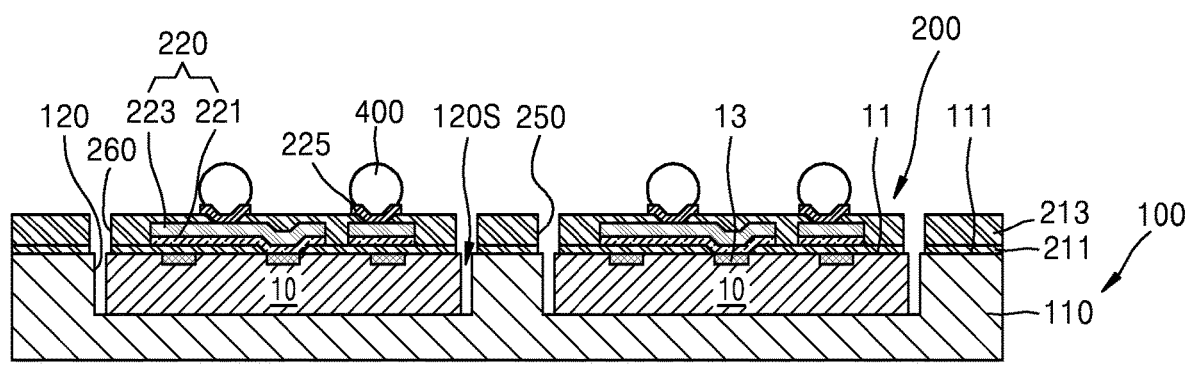

Referring to FIGS. 9 and 10j, the plurality of wafers 10 may be separated from the tray 100 (S1390). To separate the plurality of wafers 10 from the tray 100, a portion of a structure stacked on the tray 100 and/or the plurality of wafers 10 may be removed to form a separation lane 260.

For example, the separation lane 260 may penetrate the second insulation layer 213 perpendicularly, and be formed along the edges of each of the plurality of wafers 10. By the separation lane 260, the space 120S between the side walls of the cavities 120 and the edges of the wafers 10 may be exposed upward. By the separation lane 260, wafer level semiconductor packages including the wafers 10 and the interconnect structure 200 formed on the wafers 10 may be separated from each other. The separation lane 260 may be formed by, for example, a laser drilling method.

Figure 10K:
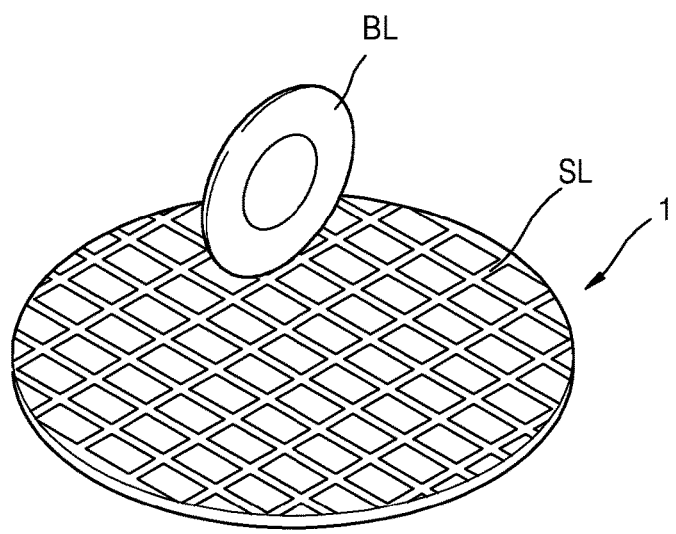

Referring to FIG. 10k, a wafer level semiconductor package 1 may be separated from the tray (100 of FIG. 10j), and then singulated into a plurality of package unit semiconductor packages through a sawing process. In other words, a sawing blade BL may cut the wafer level semiconductor package 1 along a scribe lane SL to separate the wafer level semiconductor package 1, so that the wafer level semiconductor package 1 may be singulated into a plurality of package unit semiconductor packages.

Meanwhile, a method of producing the semiconductor package, according to some embodiments of the present disclosure, may perform the substantially same processes as those described above with reference to FIGS. 10a to 10g, and then, the subsequent processes may be performed on each of the plurality of wafers. That is, the subsequent processes may be performed in the state in which the plurality of wafers are not arranged on the tray. For example, by sequentially forming the second insulating layer covering the distribution layer, the second metal layer connected to the distribution layer through the second insulating layer, and the external connection terminal on the second metal layer on the resultant structure shown in FIG. 10g, a semiconductor package process for each of the plurality of wafers may be performed.

Figure 11:
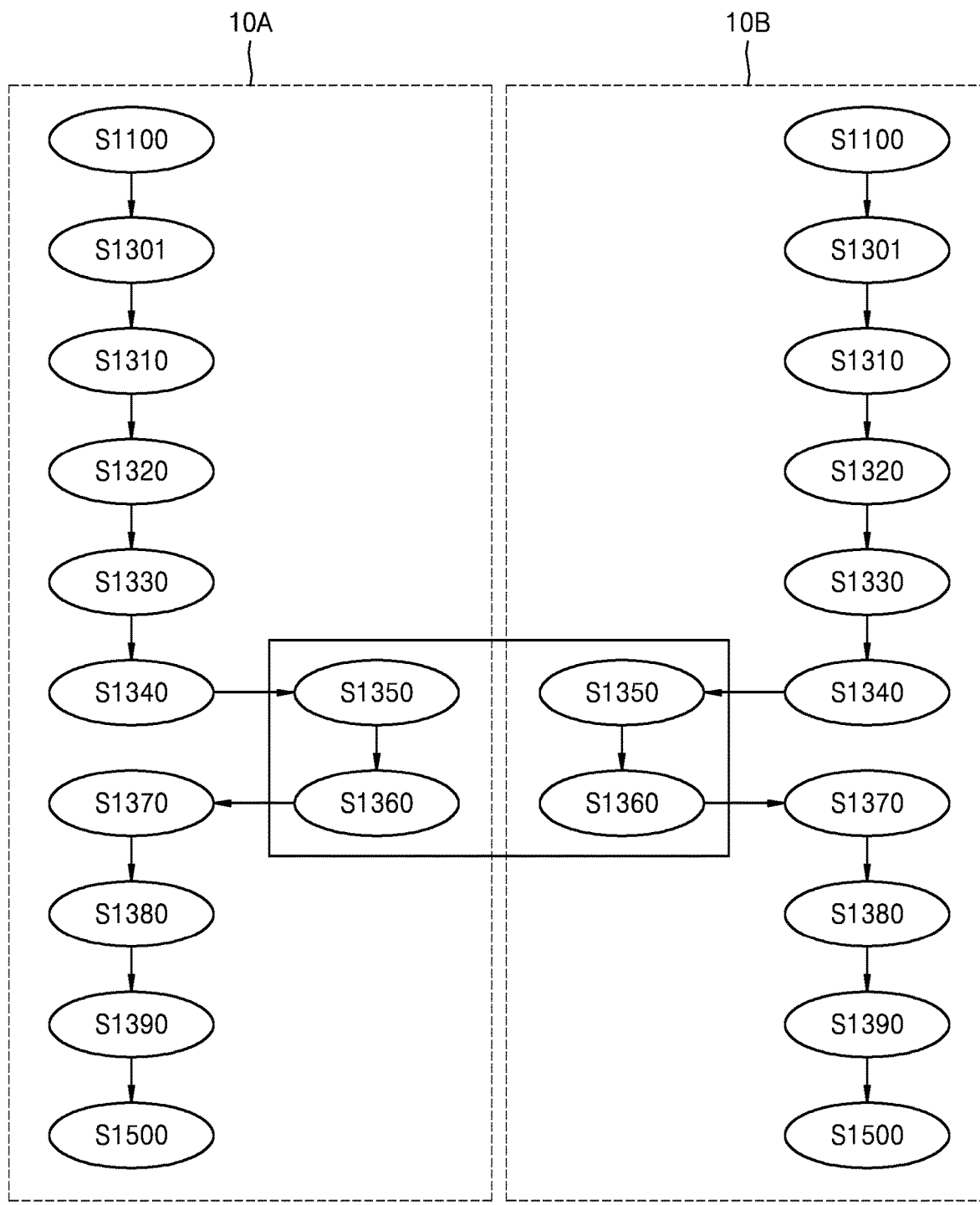
FIG. 11 is a flowchart showing a method of producing a semiconductor package, according to some embodiments of a technical concept of the present disclosure.

FIG. 11 is a flowchart showing a method of producing a semiconductor package, according to some embodiments of a technical concept of the present disclosure.

Referring to FIGS. 9 and 11, a part of semiconductor package processes may be performed on wafers in a tray unit, and the other part of the semiconductor package processes may be performed on a larger number of wafers than the tray unit. As described above, semiconductor package processes for a first group of wafers 10A in a tray unit and a second group of wafers 10B in a tray unit may be performed through operations S100 to S500.

In the semiconductor package processes for the first group of wafers 10A and the second group of wafers 10B, processes that are performed in the state that wafers are arranged on a tray may be performed on each of the first group of wafers 10A and the second group of wafers 10B, and processes that are performed in the state that the wafers are separated from the tray may be performed on both of the first group of wafers 10A and the second group of wafers 10B. For example, operation S1350 of forming the first metal layer on the seed metal layer exposed through the first mask pattern, and/or operation S1360 of removing the first mask pattern and the seed metal layer below the first mask pattern may be performed on both of the first group of wafers 10A and the second group of wafers 10B.

Meanwhile, in the drawings, operation S350 and/or operation S360 are shown to process two tray units of wafers at the same time. However, the present disclosure is not limited to this, and operation S350 and/or operation S360 may be performed on a larger number of wafers than two tray units.

FIGS. 12a to 12f are cross-sectional views showing a method of producing a semiconductor package according to some embodiments of a technical concept of the present disclosure, in the order of processes. In FIGS. 12a to 12f, a method of producing a semiconductor package by using the tray 100c shown in FIG. 5 will be described, and descriptions overlapping with those given above with reference to FIGS. 10a to 10k will be omitted or briefly given.

Figure 12A:
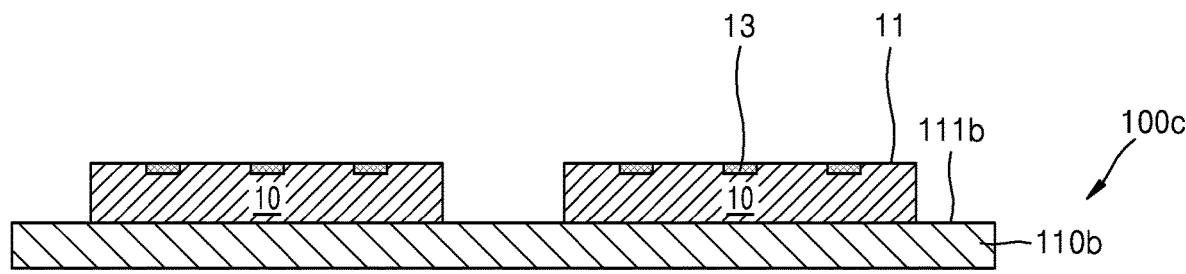
FIG. 12A is a cross-sectional view showing a method of producing a semiconductor package, according to some embodiments of a technical concept of the present disclosure, where

Referring to FIG. 12a, a plurality of wafers 10 may be arranged on the tray 100c. An upper surface 11 of each of the plurality of wafers 10, on which a pad 13 is formed, may be exposed upward, and a lower surface of the wafer 10, which is opposite to the upper surface 11, may face a surface of the tray 100c. To arrange the plurality of wafers 10 at predetermined positions on the tray 100c, an align mark (see 140 of FIG. 2a) provided on the tray 100c may be used.

Figure 12B:
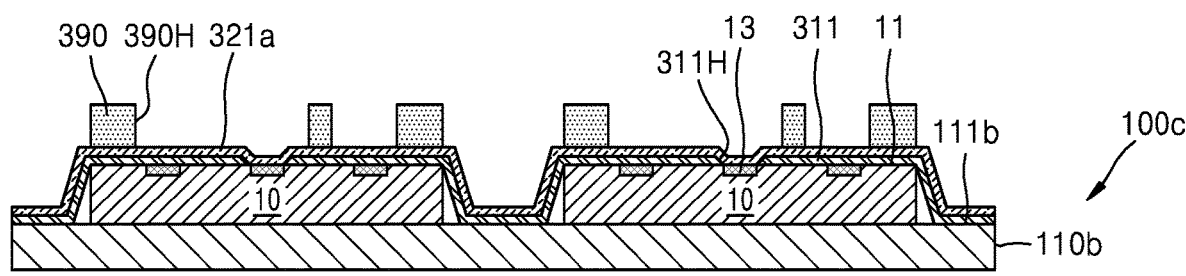

Referring to FIG. 12b, a first insulating layer 311 covering the surface of the tray 100c and the surface of the wafer 10 and having an opening 311H exposing the pad 13 of the wafer 10 may be formed. Because the upper surface 11 of the wafer 10 has a level that is higher than the surface of the tray 100c, the first insulating layer 311 may have a stepped portion. The first insulating layer 311 may fix the plurality of wafers 10 at predetermined positions on the tray 100c during a subsequent process.

After the first insulating layer 311 is formed, a seed metal layer 321a may be formed on the first insulating layer 311 and the pads 13 of the wafers 10 exposed through the opening 311H of the first insulating layer 311, and a second mask pattern 390 having a second mask opening 3900H may be formed on the seed metal layer 321a.

Figure 12C:
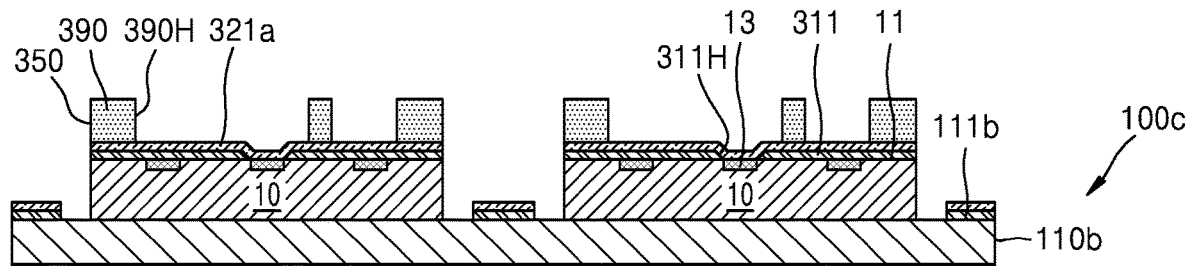

Referring to FIG. 12c, to separate the plurality of wafers 10 from the tray 100c, a portion of a structure stacked on the tray 100c and/or the plurality of wafers 10 may be removed to form a separation lane 350. For example, the separation lane 350 may extend along edges of the plurality of wafers 10, and penetrate the first insulating layer 311 and the seed metal layer 321a perpendicularly.

After the portion of the structure stacked on the tray 100c and/or the plurality of wafers 10 is removed by the separation lane 350, the plurality of wafers 10 may be separated from the tray 100c.

Figure 12D:
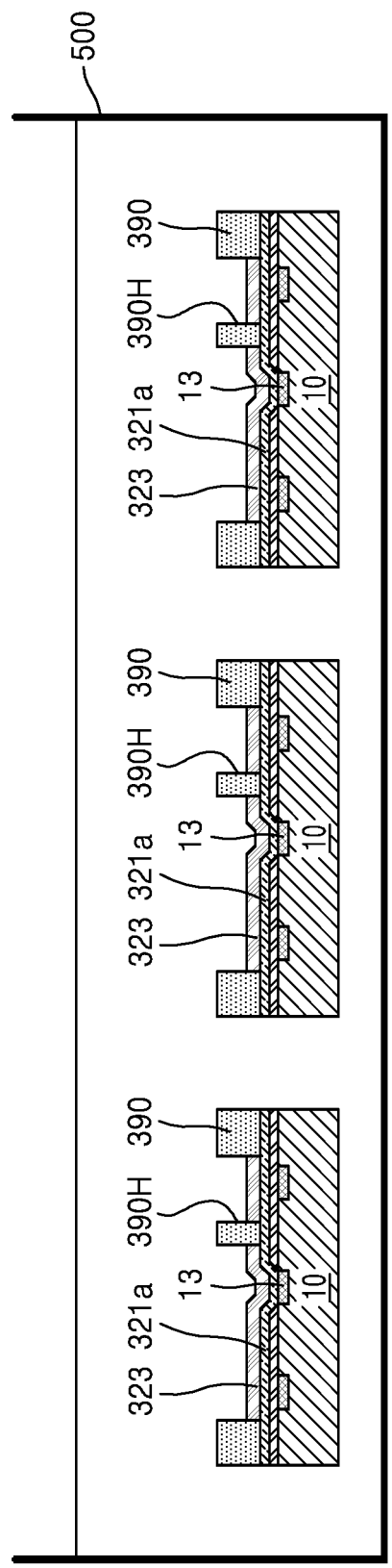

Referring to FIG. 12d, the substantially same method as the method of forming the first metal layer (223 of FIG. 10f) described above with reference to FIG. 10f may be performed to form a first metal layer 323 filling at least one portion of the first mask opening 390H for each of the separated wafers 10.

Then, the second mask pattern 390 and the seed metal layer 321a located below the second mask pattern 390 may be removed by the substantially same method as that described above with reference to FIG. 10g. In some embodiments, the seed metal layer 321a and the first metal layer 323 may construct a distribution layer 320.

Figure 12E:
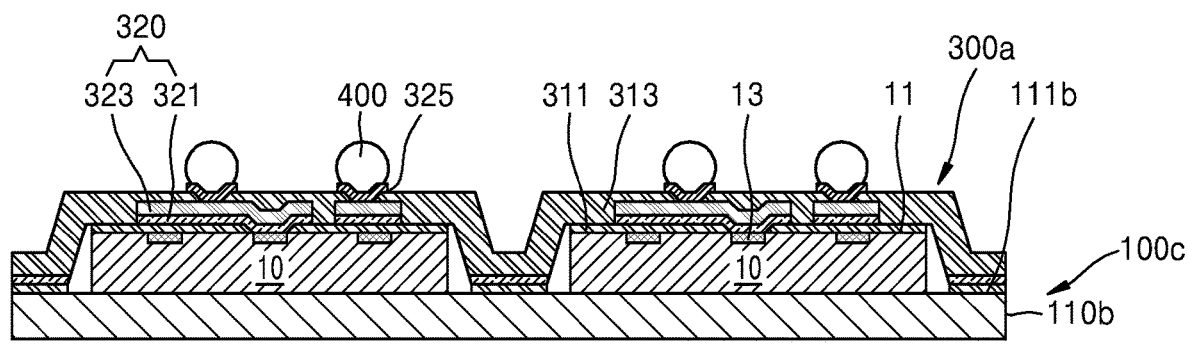

Referring to FIG. 12e, the plurality of wafers 10 including a predetermined structure may be arranged on the tray 100c, and a second insulating layer 313 covering the tray 100c, the first insulating layer 311 on the plurality of wafers 10, and the distribution layer 320 may be formed. By the second insulating layer 313, the plurality of wafers 10 may be fixed on the tray 100.

Successively, at least a portion of the first metal layer 323 may be exposed through the second insulating layer 313, a second metal layer 325 connected to the exposed first metal layer 323 may be formed, and an external connection terminal 400 may be formed on the second metal layer 325.

Figure 12F:
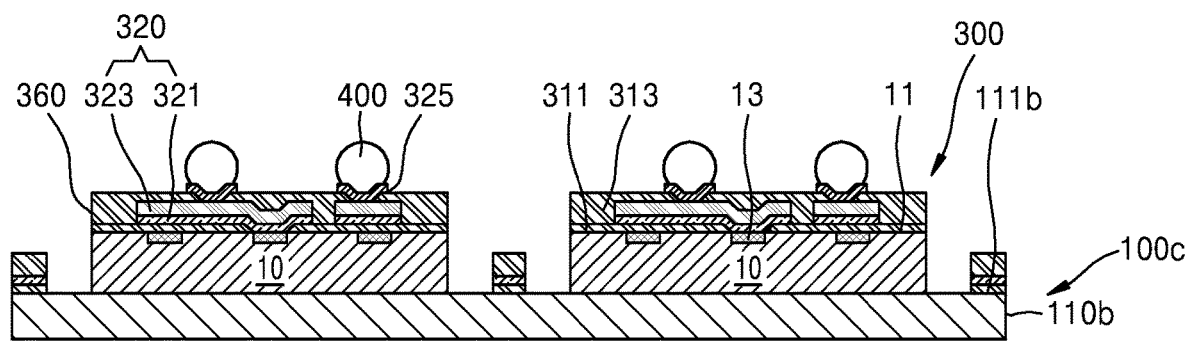

Referring to FIG. 12f, a portion of a structure stacked on the tray 100c and/or the plurality of wafers 10 may be removed along the edges of the plurality of wafers 10 to form a separation lane 360. For example, the separation lane 360 may penetrate the second insulating layer 213 perpendicularly.

After the separation lane 360 is formed, the wafer level semiconductor package may be separated from the tray 100c, and then singulated into a plurality of package unit semiconductor packages through a sawing process.

Figure 13:
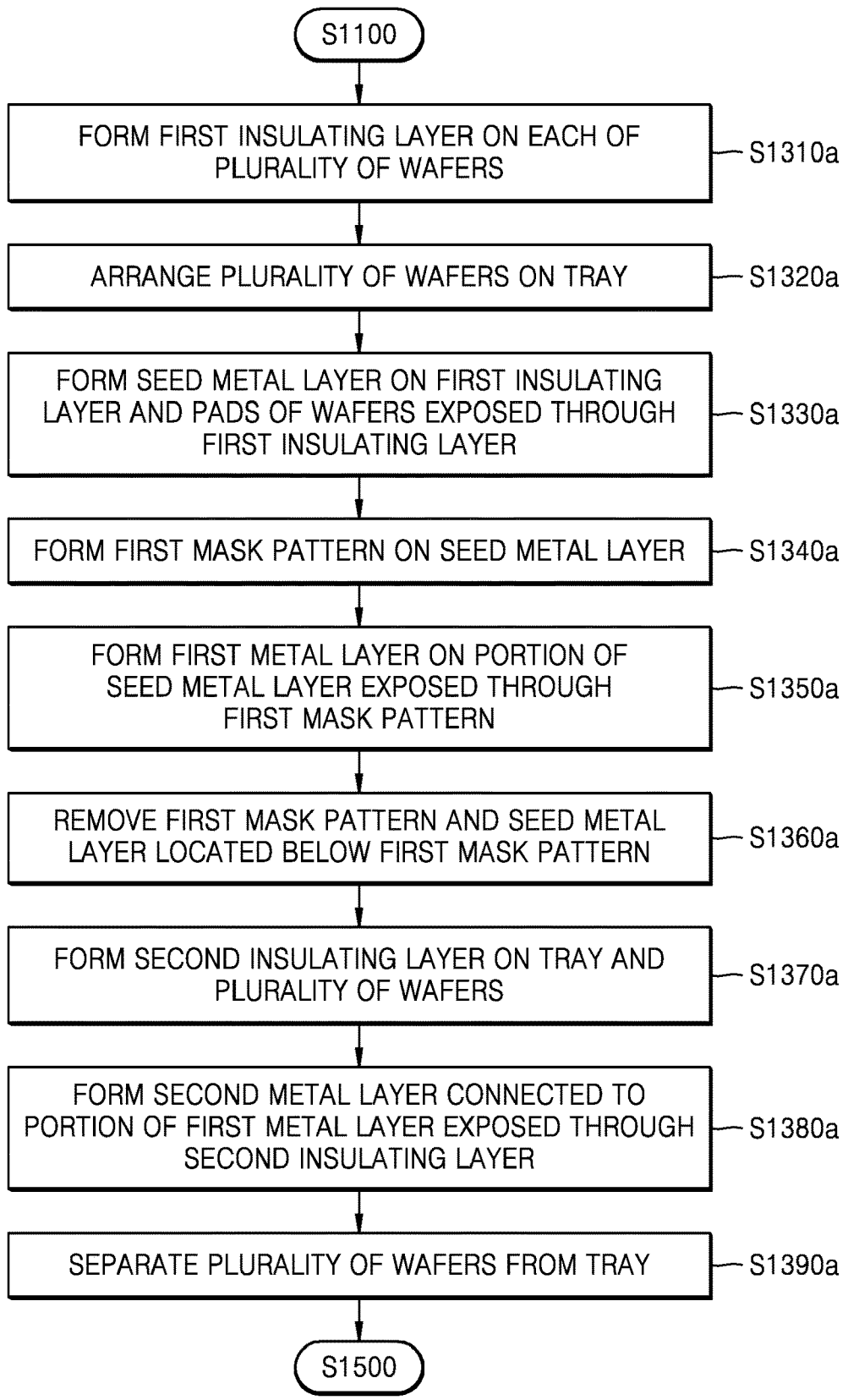
FIG. 13 is a flowchart of a method of producing a semiconductor package, according to some embodiments of a technical concept of the present disclosure.

FIG. 13 is a flowchart of a method of producing a semiconductor package according to some embodiments of a technical concept of the present disclosure. FIGS. 14a to 14f are cross-sectional views showing a method of producing a semiconductor package according to some embodiments of a technical concept of the present disclosure, in the order of processes. Hereinafter, a method of producing a semiconductor package by using the tray 100 shown in FIGS. 2a and 2b will be described with reference to FIGS. 13 and 14a to 14f, and descriptions overlapping with those given above with reference to FIGS. 10a to 10k will be omitted or briefly given.

Figure 14A:
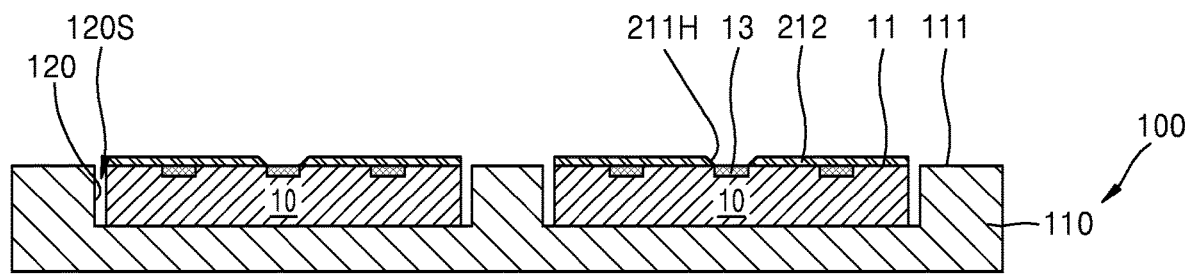
FIG. 14A is a cross-sectional view showing a method of producing a semiconductor package, according to some embodiments of a technical concept of the present disclosure, where

Referring to FIGS. 13 and 14a, a first insulating layer 212 may be formed on each of a plurality of wafers 10 (S1310a), and the plurality of wafers 10 may be arranged on the tray 100 (S1320a). More specifically, the first insulating layer 212 may be formed on upper surfaces 11 of the plurality of wafers 10 on which pads 13 are formed, and the plurality of wafers 10 may be accommodated in cavities 120 such that lower surfaces of the wafers 10 face bottom surfaces of the cavities 120.

Figure 14B:
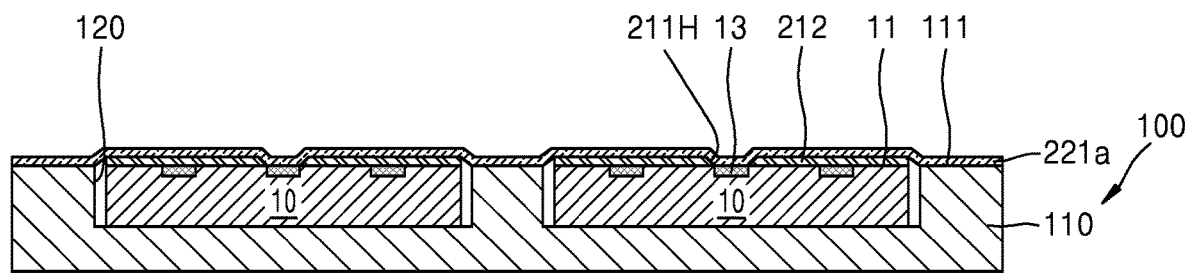

Referring to FIGS. 13 and 14b, a seed metal layer 221a may be formed to be electrically connected with the pads 13 of the plurality of wafers 10 (S1330a). For example, the seed metal layer 221a may cover a surface of the tray 100 and a surface of the first insulating layer 212, and be connected to the pads 13 exposed through an opening 211H of the first insulating layer 212.

Figure 14C:
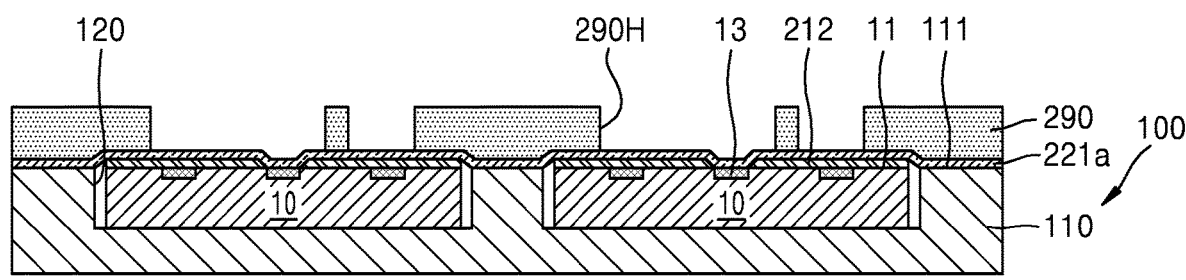

Referring to FIGS. 13 and 14c, a first mask pattern 290 having a first mask opening 290H may be formed on the seed metal layer 221a (S1340a). In some embodiments, to form the first mask pattern 290, a photosensitive film may be attached on the seed metal layer 221a to cover the seed metal layer 221a, and then, a portion of the seed metal layer 221a may be exposed through exposure and development processes to form the first mask opening 290H. In this case, the first mask pattern 290 may fix the plurality of wafers 10 on the tray 100.

Figure 14D:
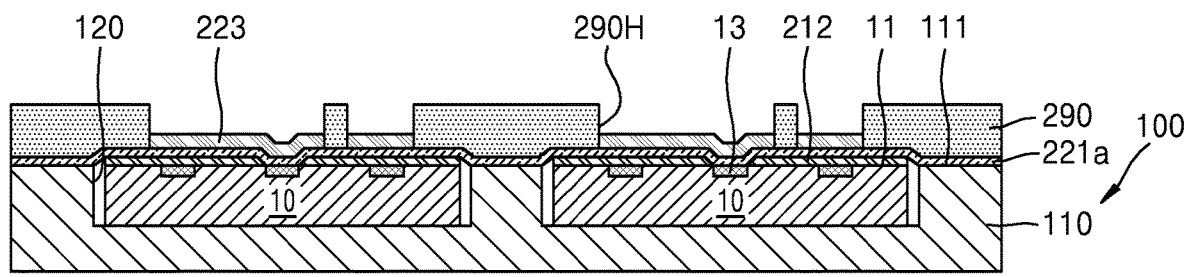

Referring to FIGS. 13 and 14d, a first metal layer 223 may be formed on the portion of the seed metal layer 221a exposed through the first mask pattern 290 (S1350a). In some embodiments, the first metal layer 223 may be formed by a plating method using the seed metal layer 221a as a seed. For example, to perform a plating process of making a plating jig contact the seed metal layer 221a to apply a voltage to the seed metal layer 221a, the plating jig may contact the seed metal layer 221a provided on the plurality of wafers 10.

Figure 14E:
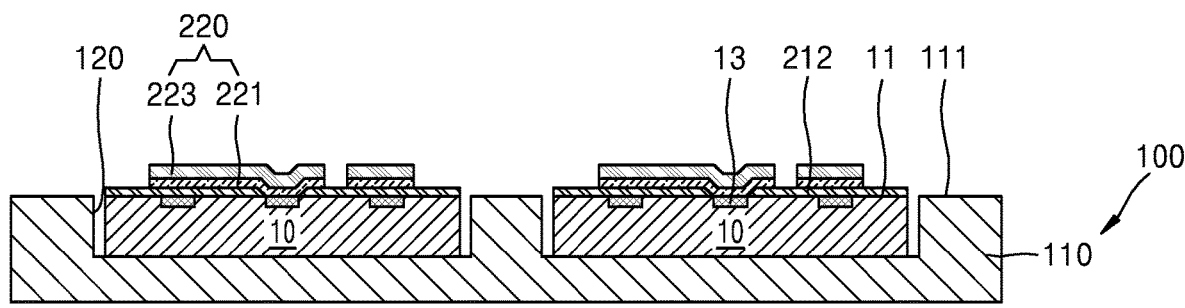

Referring to FIGS. 13 and 14e, the first mask pattern 290 and the seed metal layer (221a of FIG. 14d) located below the first mask pattern 290 may be removed from the resultant structure of FIG. 14d (S1360a). In some embodiments, the seed metal layer 221 and the first metal layer 223 may construct a distribution layer 220.

Figure 14F:
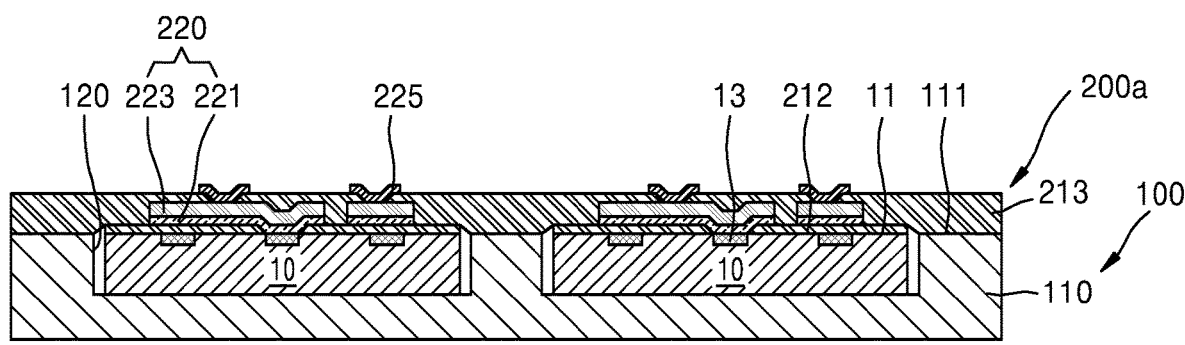

Referring to FIGS. 13 and 14f, a second insulating layer 213 may be formed on the tray 100 and the plurality of wafers 10 (S1370a). The second insulating layer 213 may cover the seed metal layer 221 formed on the upper surface 111 of the tray 100, and also cover the first insulating layer 212 and the distribution layer 220 formed on the plurality of wafers 10. In some embodiments, the second insulating layer 213 may fix the plurality of wafers 10 on the tray 100 during a subsequent process.

Successively, a second metal layer 225 may be formed to be connected to a portion of the first metal layer 223 exposed through the second insulating layer 213 (S1380a). In some embodiments, the first insulating layer 212, the distribution layer 220, the second insulating layer 213, and the second metal layer 225 may construct an interconnect structure 200a. Thereafter, an external connection terminal may be formed on the second metal layer 225.

Thereafter, the plurality of wafers 10 may be separated from the tray 100 (S1390a). For example, to separate the plurality of wafers 10, a portion of the second insulating layer 213 may be removed to expose the edges of the plurality of wafers 10. The plurality of wafers 10 separated from the tray 100 may be singulated into a plurality of package unit semiconductor packages through a sawing process.

Meanwhile, a method of producing the semiconductor package, according to some embodiments of the present disclosure, may perform the substantially same processes as those described above with reference to FIGS. 14a to 14e, and then, the subsequent processes may be performed on each of the plurality of wafers. That is, the subsequent processes may be performed in the state in which the plurality of wafers are not arranged on the tray. That is, by separating the plurality of wafers from the tray in the resultant structure of FIG. 14e, and sequentially forming the second insulating layer covering the distribution layer, the second metal layer connected to the distribution layer through the second insulating layer, and the external connection terminal on the second metal layer for each of the plurality of wafers, a semiconductor package process for each of the plurality of wafers may be performed.

Meanwhile, in FIGS. 13 to 14f, a method of producing a semiconductor package by using the tray 100 shown in FIGS. 2a and 2b has been described, however, methods of producing semiconductor packages by using the trays 100a, 100b, and 100c described above with reference to FIGS. 3 to 5 may be performed in the substantially same way as those described above with reference to FIGS. 13 to 14f.

Figure 15:
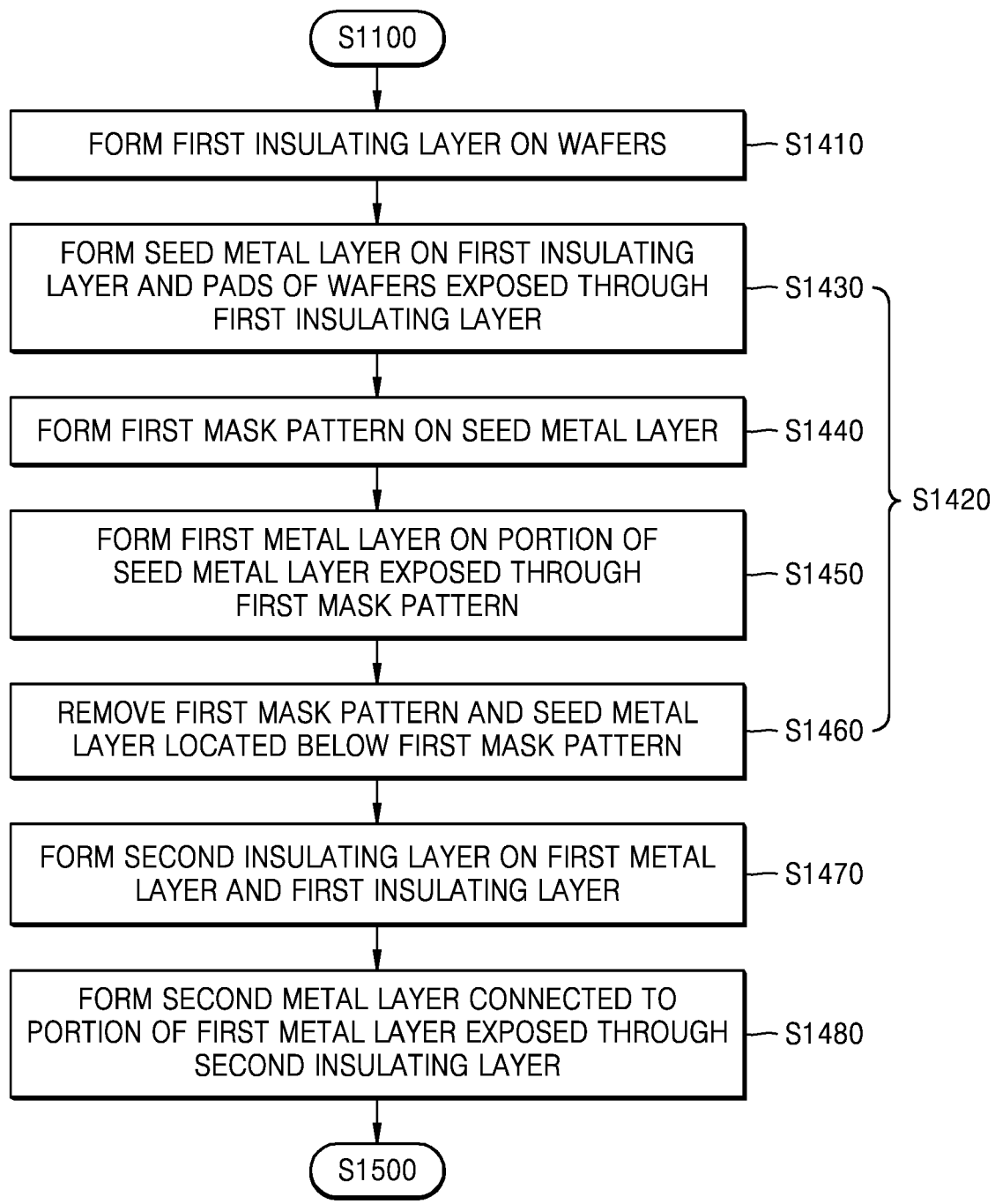
FIG. 15 is a flowchart of a method of producing a semiconductor package, according to some embodiments of the present disclosure.

Meanwhile, at least a part of semiconductor package manufacturing processes may be performed in the state in which a plurality of wafers are arranged on a tray. Hereinafter, a method of producing a semiconductor package according to some embodiments of the present disclosure will be described with reference to FIG. 15.

As described above, a method of producing a semiconductor package may include operation S1410 of forming a first insulating layer on a wafer, operation S1420 of forming a distribution layer connected to a pad of the wafer exposed through the first insulating layer on the first insulating layer, operation S1470 of forming a second insulating layer on the distribution layer and the first insulating layer, and operation S1480 of forming a second metal layer connected to the distribution layer exposed through the second insulating layer. Operation S1420 of forming the distribution layer may include operation S1430 of forming a seed metal layer on the first insulating layer and the pad of the wafer exposed through the first insulating layer, operation S1440 of forming a first mask pattern on the seed metal layer, operation S1450 of forming a first metal layer on a portion of the seed metal layer exposed through the first mask pattern, and operation S1460 of removing the first mask pattern and the seed metal layer located below the first mask pattern.

In some embodiments of the present disclosure, a part of operations S410 and S480 may be performed in the state in which a plurality of wafers are arranged on a tray, and the other part may be performed on each of the plurality of wafers in the state in which the plurality of wafers are separated from the tray. Accordingly, before and/or after each of operations S410 to S480, an operation of arranging the plurality of wafers on the tray or operation of separating the plurality of wafers from the tray may be performed.

By the method of producing the semiconductor package, according to embodiments of the present disclosure, a plurality of unit processes of a semiconductor package process may be performed by using a tray capable of supporting a plurality of wafers. That is, because the semiconductor package process is performed by arranging a plurality of wafers on a tray, a plurality of wafer level semiconductor packages may be manufactured in a panel level. Accordingly, by a technical concept of the present disclosure, semiconductor package processes for a plurality of wafers can be performed at the same time, and therefore, productivity may be improved.

Further, by the method of producing the semiconductor package, according to embodiments of the present disclosure, a part of the plurality of unit processes of the semiconductor package process may process the wafers using a tray, and the other part may be performed in the state in which the wafers are separated from the tray. Therefore, the productivity of the semiconductor package process may be further improved.

FIGS. 16a to 16i are cross-sectional views showing a method of producing a semiconductor package according to some embodiments of a technical concept of the present disclosure. In FIGS. 16a to 16i, a method of producing a semiconductor package by using the tray 100 shown in FIGS. 2a and 2b will be described.

Figure 16A:
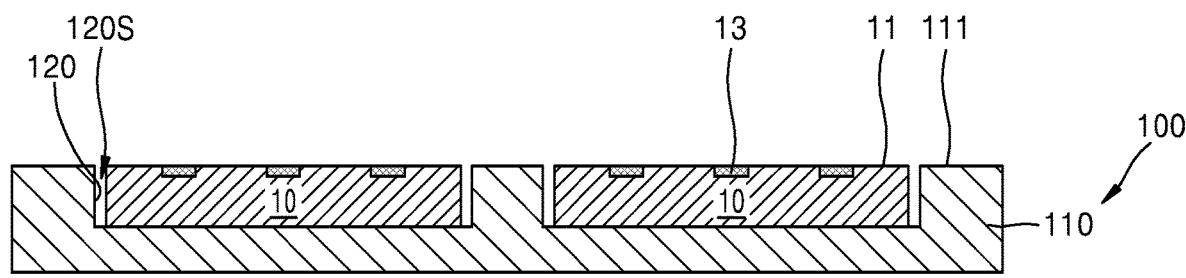
FIG. 16A is a cross-sectional view showing a method of producing a semiconductor package, according to some embodiments of a technical concept of the present disclosure.

Referring to FIG. 16a, a plurality of wafers 10 may be arranged on the tray 100. The plurality of wafers 10 may be respectively accommodated in different cavities 120 provided in the tray 100. Each wafer 10 may be positioned in the cavity 120 such that an upper surface 11 of the wafer 10 on which a pad 13 is formed is exposed upward. In other words, the wafer 10 may be positioned in the cavity 120 such that a lower surface of the wafer 10, which is opposite to the upper surface 11, faces a bottom surface of the cavity 120. In other words, an active surface of the wafer 10 may be exposed, and an inactive surface of the wafer 10 may contact a surface of the tray 100.

The wafer 10 may be positioned in the cavity 120 in such a way to be spaced from a side wall of the cavity 120. Because the side surface of the wafer 10 is spaced from the side wall of the cavity 120, a space 120S that opens in an up direction may be formed between the side surface of the wafer 10 and the side wall of the cavity 120.

As shown in FIG. 16a, a depth of the cavity 120 may be substantially equal to a thickness of the wafer 10, and accordingly, the upper surface 11 of the wafer 10 positioned in the cavity 120 and the upper surface 111 of the body 110 may have the same height level.

However, when the wafer 10 is positioned in the cavity 120, an upper surface of the body 110 may have a height level that is different from the upper surface 11 of the wafer 10. For example, the upper surface of the body 110 may have a level that is lower than the upper surface 11 of the wafer 10.

Figure 16B:
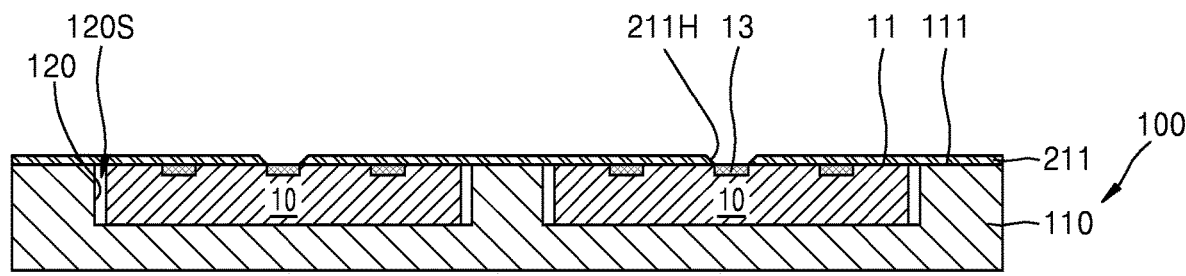
FIG. 16B is a cross-sectional view showing a method of producing a semiconductor package, according to some embodiments of a technical concept of the present disclosure.

Referring to FIG. 16b, a first insulating layer 211 may be formed on the tray 100 and the plurality of wafers 10. The first insulating layer 211 may have an opening 211H to expose at least a portion of the pad 13. The first insulating layer 211 may cover the upper surface 111 of the body 110 and the upper surfaces 11 of the plurality of wafers 10.

The first insulating layer 211 may fix the wafers 10 positioned in the cavities 120 during a subsequent process. Also, the first insulating layer 211 may cover the space 120S between the wafers 10 and the side walls of the cavities 120. For example, the space 120S between the wafers 10 and the side walls of the cavities 120 may be sealed by the first insulating layer 211. When an interconnect structure is formed, the first insulating layer 211 may cover the space 120S between the wafers 10 and the side walls of the cavities 120 to prevent foreign materials from entering the space 120S.

In some embodiments, the first insulating layer 211 may cover a top area of the space 120S between the side surfaces of the wafers 10 and the side walls of the cavities 120 such that a material forming the first insulating layer 211 is not filled in the space 120S between the side surfaces of the wafers 10 and the side walls of the cavities 120. Because the material forming the first insulating layer 211 is not filled in the space 120S between the side surfaces of the wafers 10 and the side walls of the cavities 120, the wafers 10 may be easily separated from the tray 100, later.

In some embodiments, the first insulating layer 211 may be formed by a laminating method. For example, the first insulating layer 211 may include a photosensitive material. More specifically, to form the first insulating layer 211, a photosensitive film may be attached on the upper surface 111 of the body 110 and the upper surfaces 11 of the plurality of wafers 10 by a laminating method, and then, a portion of the photosensitive film may be removed through exposure and development processes to expose the pads 13 of the wafers 10.

Also, in some embodiments, the first insulating layer 211 may include a non-photosensitive material. For example, to form the first insulating layer 211, a non-photosensitive film may be attached on the upper surface 111 of the body 110 and the upper surfaces 11 of the plurality of wafers 10, and then, a portion of the non-photosensitive film may be removed by a laser cutting apparatus to expose the pads 13 of the wafers 10.

The first insulating layer 211 may be formed with a polymer material such as, for example, polyimide.

Meanwhile, in other embodiments, the first insulating layer 211 may be formed by a spin-coating method.

Figure 16C:
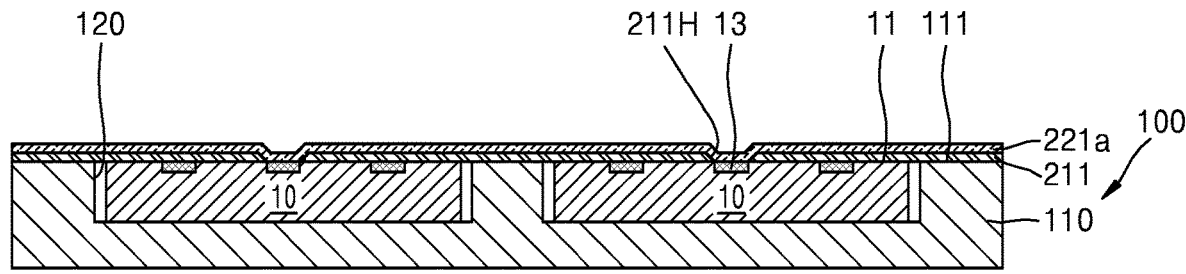
FIG. 16C is a cross-sectional view showing a method of producing a semiconductor package, according to some embodiments of a technical concept of the present disclosure.

Referring to FIG. 16c, a seed metal layer 221a may be formed to cover a surface of the first insulating layer 211 and a surface of the pad 13 exposed through the opening 211H of the first insulating layer 211. The seed metal layer 221a may be deposited by, for example, a sputtering method, however a method of forming the seed metal layer 221a is not limited to the sputtering method. The seed metal layer 221a may include any one of, for example, Ti, Cu, Ni, Al, Pt, Au, Ag, W, Ta, Co, or a combination thereof.

Figure 16D:
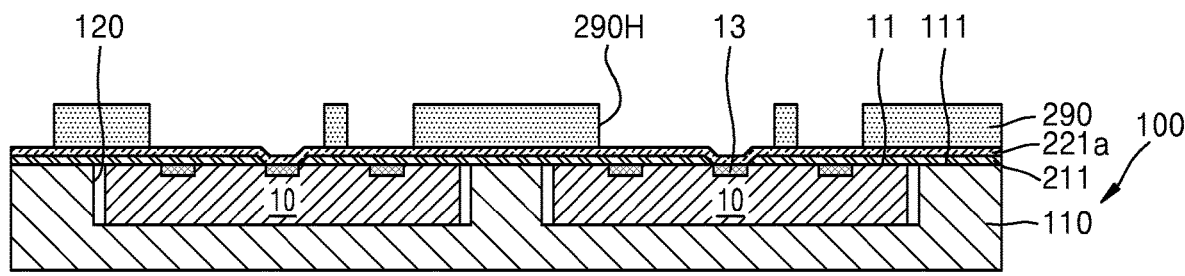
FIG. 16D is a cross-sectional view showing a method of producing a semiconductor package, according to some embodiments of a technical concept of the present disclosure.

Referring to FIG. 16d, a first mask pattern 290 having a first mask opening 290H may be formed on the seed metal layer 221a. A part of the seed metal layer 221a may be exposed by the first mask opening 290H.

The first mask pattern 290 may be formed, for example, by forming a photosensitive material film on the seed metal layer 221a and then performing a patterning process using photolithography technology on the photosensitive material film. For the photolithography process, an exposure mask on which a predetermined pattern is formed may be used, and a laser light source such as KrF or ArF may be used.

In some embodiments, the first mask pattern 290 may be formed by a laminating method. For example, a photosensitive film may be attached on the seed metal layer 221a to cover the seed metal layer 221a, and then, a portion of the seed metal layer 221a may be exposed through exposure and development processes to form a first mask opening 290H.

Figure 16E:
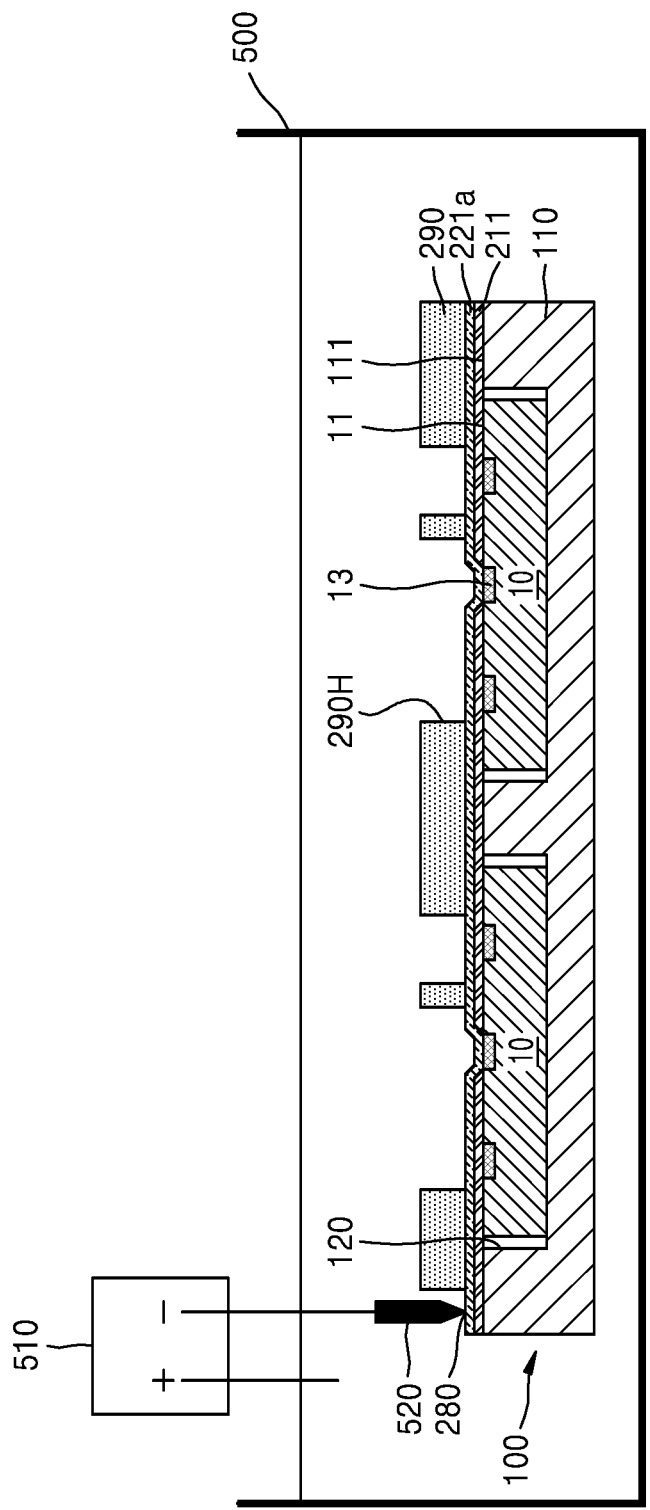
FIG. 16E is a cross-sectional view showing a method of producing a semiconductor package, according to some embodiments of a technical concept of the present disclosure.
Figure 16F:
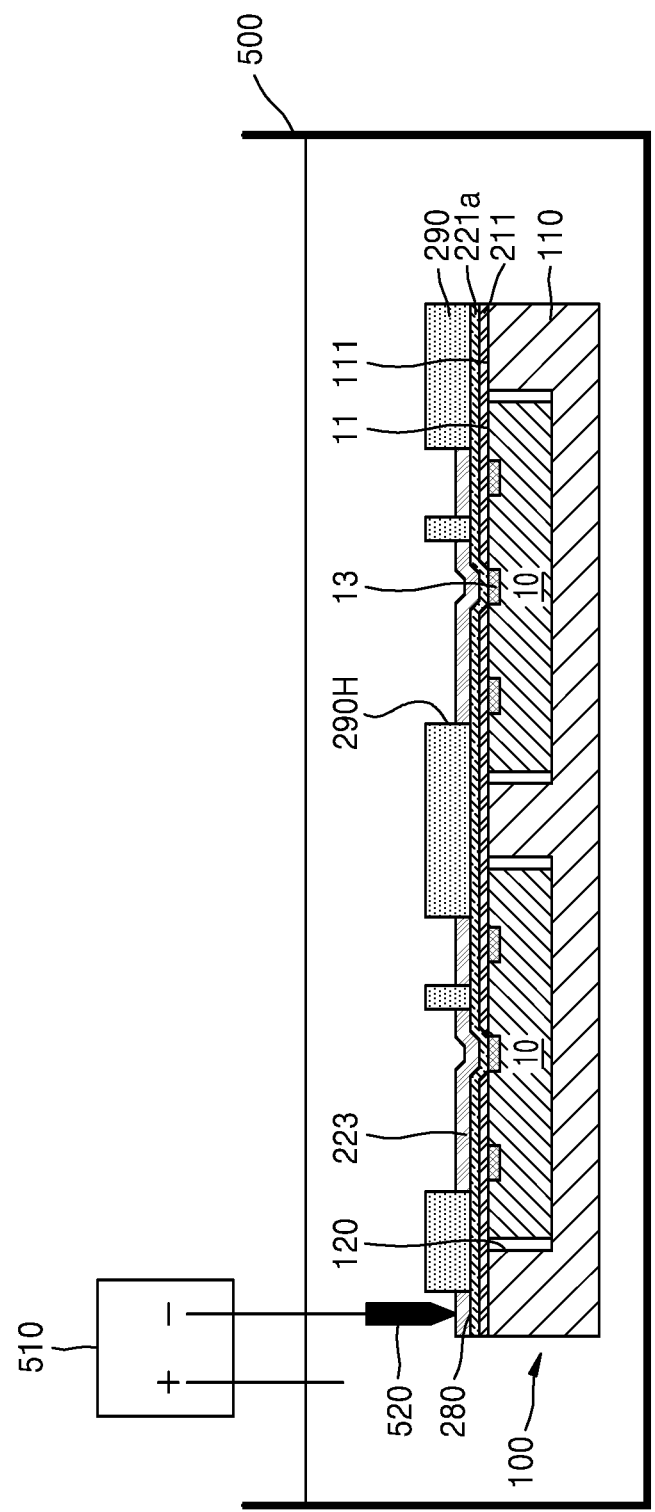
FIG. 16F is a cross-sectional view showing a method of producing a semiconductor package, according to some embodiments of a technical concept of the present disclosure.

Referring to FIGS. 16e and 16f, a first metal layer 223 may be formed to fill at least a portion of the first mask opening 290H. The first metal layer 223 may cover a surface of the portion of the seed metal layer 221a exposed through the first mask opening 290H.

The first metal layer 223 may be formed through, for example, a plating method. For example, the first metal layer 223 may be formed with copper. In some embodiments, the first metal layer 223 may be formed by a plating method using the seed metal layer 221a as a seed. For example, the first metal layer 223 may be formed by immersion plating, electroless plating, electroplating, or a combination thereof.

More specifically, as shown in FIG. 16e, the tray 100 on which the plurality of wafers 10 are arranged may be immersed in a plating bath 500, and a plating jig may contact at least one location 280 on the seed metal layer 221a. Successively, as shown in FIG. 16f, when a power supply 510 applies a voltage to the plating jig 520, the first metal layer 223 may be formed on the surface of the portion of the seed metal layer 221a exposed through the first mask opening 290H. That is, when power is supplied to an electrolyte stored in the plating bath 500 and the plating jig 520 by the power supply 510, metal ions contained in the electrolyte may be reduced to a metal to be plated on the portion of the seed metal layer 221a exposed through the first mask opening 290H. Because a portion of the seed metal layer 221a of an area perpendicularly overlapping the plurality of wafers 10 is electrically connected to the location 280 that the plating jig 520 contacts, the first metal layer 223 may be plated on the seed metal layer 221a of the area perpendicularly overlapping the plurality of wafers 10.

In some embodiments, the location 280 on the seed metal layer 22a which the plating jig 520 contacts may be spaced in a peripheral direction from a portion of the seed metal layer 221a on the plurality of wafers 10. In other words, the location 280 on the seed metal layer 22a which the plating jig 520 contacts may be spaced in a peripheral direction from a predetermined area of the seed metal layer 221a perpendicularly overlapping the plurality of wafers 10. For example, the location 280 on the seed metal layer 22a which the plating jig 520 contacts may be spaced in a peripheral direction from the cavity 120. In this case, a plating process may be more simplified than a case of making the plating jig 520 contact the portion of the seed metal layer 221 on the plurality of wafers 10 to perform a plating process.

Also, in some embodiments, the seed metal layer 221a formed on the upper surface 111 of the tray 100 and the plurality of wafers 10 and the seed metal layer 221a formed on the first insulating layer 211 may have a substantially uniform thickness. Particularly, when a depth of the cavities 120 is substantially equal to a thickness of the wafers 10 accommodated in the cavities 120, the seed metal layer 221a may be parallel to the upper surface 111 of the tray 100 around the space between the side walls of the cavities 120 and the wafers 10 accommodated in the cavities 120. Also, a thickness of a portion of the seed metal layer 221a above the space between the side walls of the cavities 120 and the wafers 10 accommodated in the cavities 120 may be substantially equal to that of the portion of the seed metal layer 221a on the plurality of wafers 10. Because the seed metal layer 221a has a substantially uniform thickness, power applied to the at least one location 280 on the seed metal layer 221a from the plating jig 520 may be more uniformly transferred to the entirety of the seed metal layer 221a.

Figure 16G:
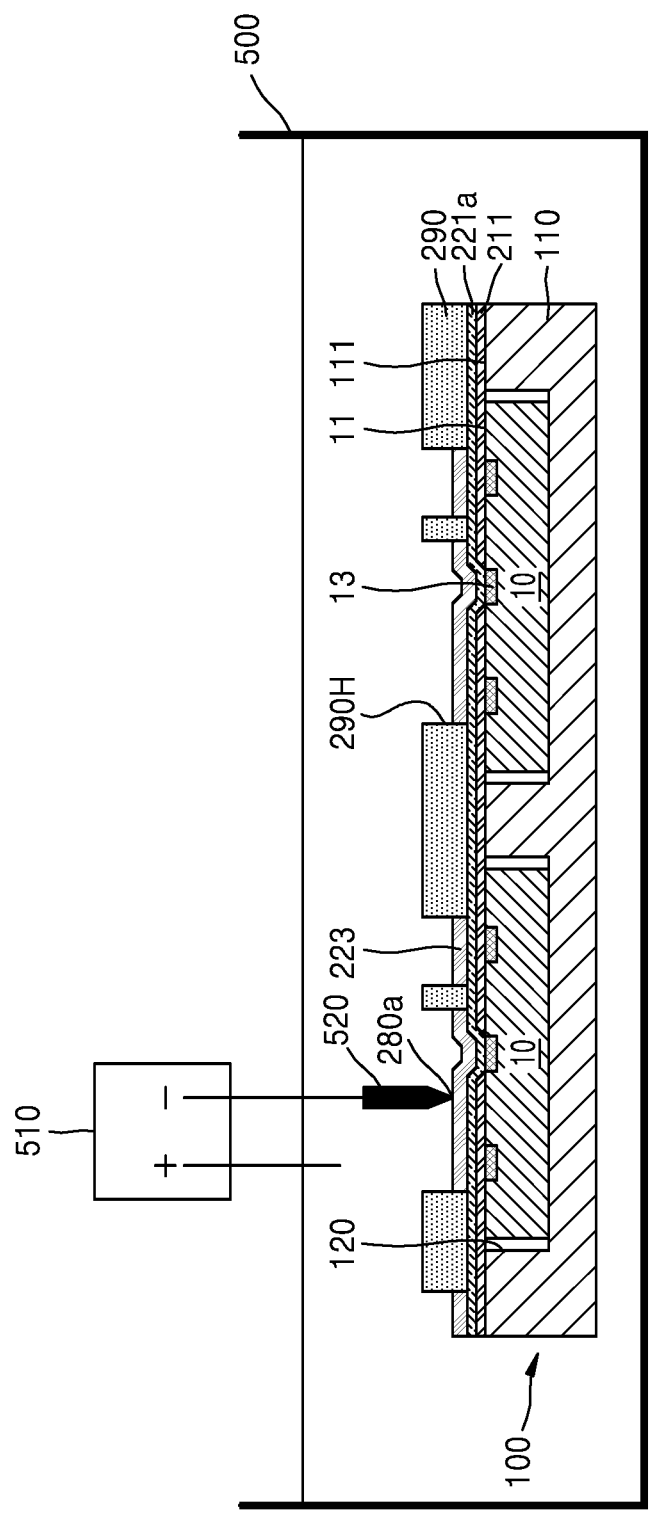
FIG. 16G is a cross-sectional view showing a method of producing a semiconductor package, according to some embodiments of a technical concept of the present disclosure.

Meanwhile, referring to FIG. 16g, in some embodiments, a location 280a on the seed metal layer 221 which the plating jig 520 contacts may be in the portion of the seed metal layer 221a on the plurality of wafers 10. In other words, the location 280a on the seed metal layer 221 which the plating jig 520 contacts may be in a predetermined area of the seed metal layer 221a perpendicularly overlapping the plurality of wafers 10. When the plating jig 520 contacts the location 280a in portions of the seed metal layer 221a on the plurality of wafers 10 and power is applied to the plating jig 520, the portions of the seed metal layers 221a on the plurality of wafers 10 may be electrically connected to each other so that the first metal layer 223 may be formed on the portions of the seed metal layer 221a on the plurality of wafers 10.

Figure 16H:
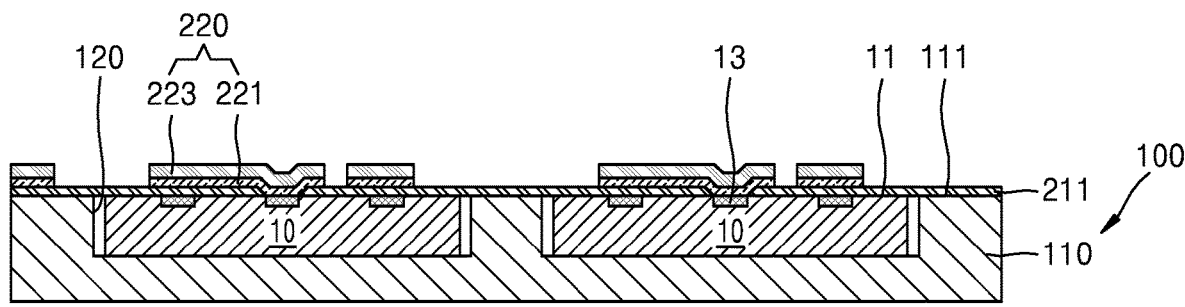
FIG. 16H is a cross-sectional view showing a method of producing a semiconductor package, according to some embodiments of a technical concept of the present disclosure.

Referring to FIG. 16h, after the first metal layer 223 is formed, the first mask pattern 290 and the seed metal layer (221a of FIG. 16g) located below the first mask pattern 290 may be removed from the resultant structure of FIG. 16e.

To remove the first mask pattern 290, an ashing or strip process may be used. Also, to remove the seed metal layer (221a of FIG. 16g) located below the first mask pattern 290 after the first mask pattern 290 is removed, a chemical etching method may be used.

In some embodiments, the first metal layer 223 and the seed metal layer 221 may be combined into one body to construct a distribution layer 220.

Figure 16I:
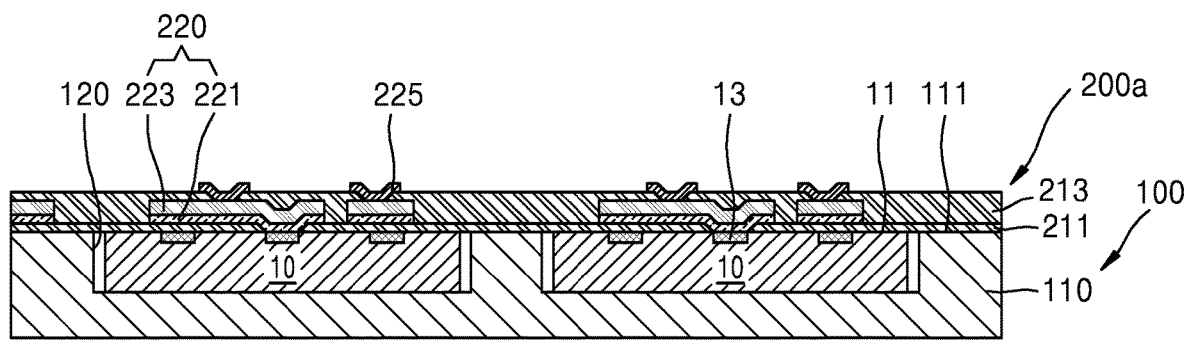
FIG. 16I is a cross-sectional view showing a method of producing a semiconductor package, according to some embodiments of a technical concept of the present disclosure.

Referring to FIG. 16i, a second insulating layer 213 covering the first metal layer 223 may be formed, and successively, a second metal layer 225 penetrating the second insulating layer 213 to be connected to the first metal layer 223 may be formed. In some embodiments, the first insulating layer 211, the distribution layer 220, the second insulating layer 213, and the second metal layer 225 may construct an interconnect structure 200a.

In some embodiments, the second insulating layer 213 may be formed by a laminating method, like the first insulating layer 211 described above with reference to FIG. 16b. The second insulating layer 213 may include a photosensitive material or a non-photosensitive material.

In some embodiments, the second metal layer 225 may be a UBM. In other embodiments, the second metal layer 225 may be omitted.

Figure 16J:
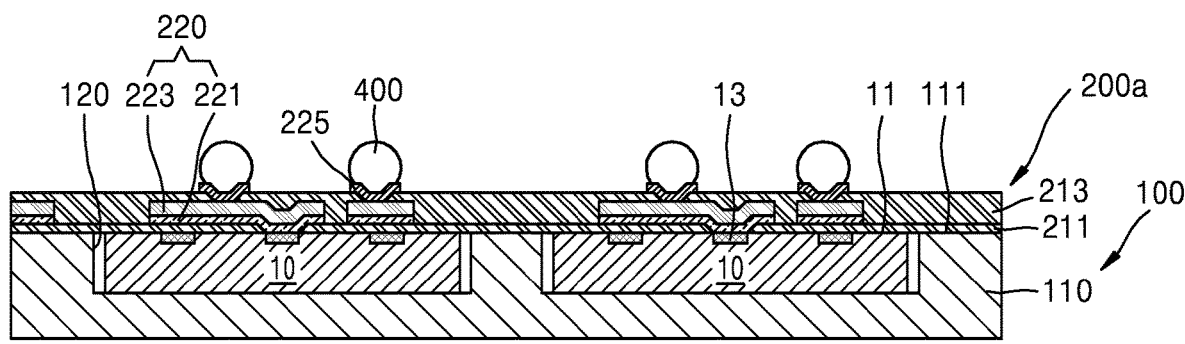
FIG. 16J is a cross-sectional view showing a method of producing a semiconductor package, according to some embodiments of a technical concept of the present disclosure.

Referring to FIG. 16j, an external connection terminal 400 may be formed on the second metal layer 225. The external connection terminal 400 may be, for example, a solder ball or a solder bump. The external connection terminal 400 may electrically connect the semiconductor package with an external device. The external connection terminal 400 may be electrically connected to the pad 13 of the wafer 10 via the seed metal layer 221, the first metal layer 223, and the second metal layer 225. Meanwhile, when the second metal layer 225 is omitted, the external connection terminal 400 may be attached on the first metal layer 223 exposed by the second insulating layer 213.

Figure 16K:
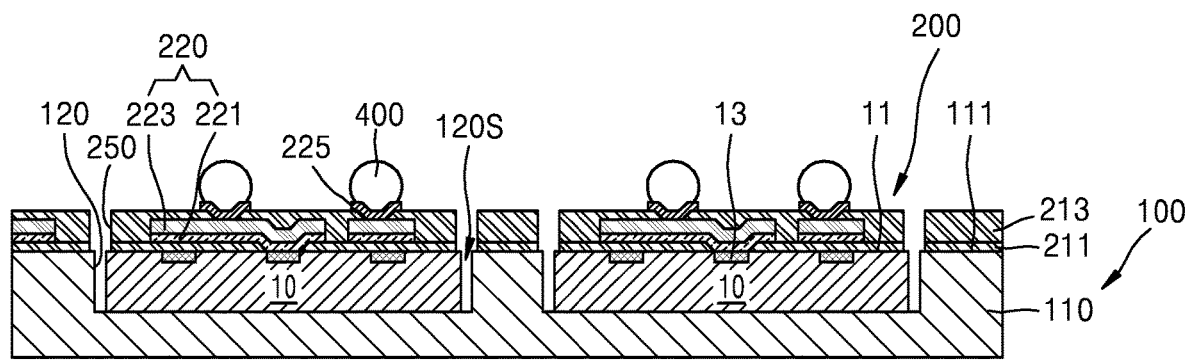
FIG. 16K is a cross-sectional view showing a method of producing a semiconductor package, according to some embodiments of a technical concept of the present disclosure.
Figure 16L:
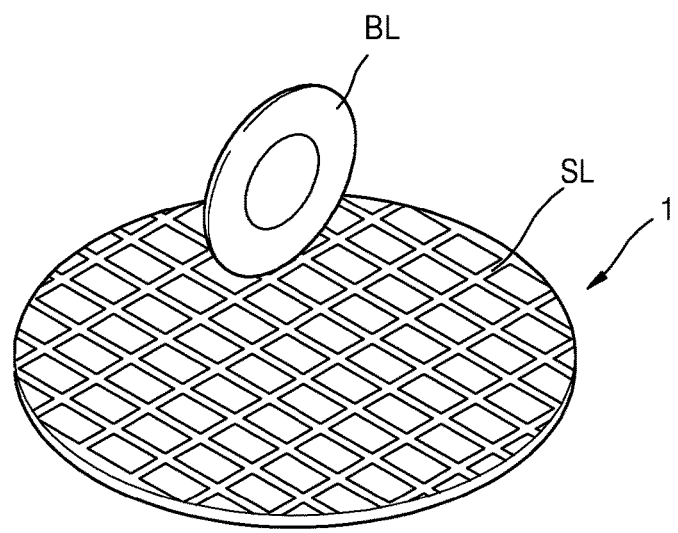
FIG. 16L is a cross-sectional view showing a method of producing a semiconductor package, according to some embodiments of a technical concept of the present disclosure.

Referring to FIG. 16k, to separate the plurality of wafers 10 from the tray 100, a portion of a structure stacked on the tray 100 and/or the plurality of wafers 10 may be removed. At this time, a material remaining between the side walls of the cavities 120 and the wafers 120 accommodated in the cavities 120 may be also removed.

For example, by removing a portion of the structure stacked on the tray 100 and/or the plurality of wafers 10, a separation lane 250 may be formed in the interconnection structure 200. The separation lane 250 may penetrate the first insulating layer 211 and the second insulating layer 213 perpendicularly, and be formed along the edges of each of the plurality of wafers 10. The separation lane 250 may be in the shape of a ring, as seen from above. By the separation lane 250, the space 120S between the side walls of the cavities 120 and the edges of the wafers 10 may be exposed upward. Further, a portion of the edges of the wafer 10 and/or a portion of the surface of the tray 100 may be exposed. By the separation lane 250, wafer level semiconductor packages including the wafers 10 and the interconnect structure 200 formed on the wafers 10 may be separated from each other.

The separation lane 250 may be formed by, for example, a laser drilling method.

Referring to FIG. 16I, a wafer level semiconductor package 1 may be separated from the tray 100, and then singulated into a plurality of package-unit semiconductor packages through a sawing process. In other words, a sawing blade BL may cut the wafer level semiconductor package 1 along a scribe lane SL to separate the wafer level semiconductor package 1. As a result, the wafer level semiconductor package 1 may be singulated into a plurality of package unit semiconductor packages.

FIGS. 17a to 17g are cross-sectional views showing a method of manufacturing a semiconductor package according to some embodiments of a technical concept of the present disclosure. In FIGS. 17a to 17g, a method of manufacturing a semiconductor package by using the tray 100c shown in FIG. 5 will be described, and descriptions overlapping with those given above with reference to FIGS. 16a to 16I will be omitted or briefly given.

Figure 17A:
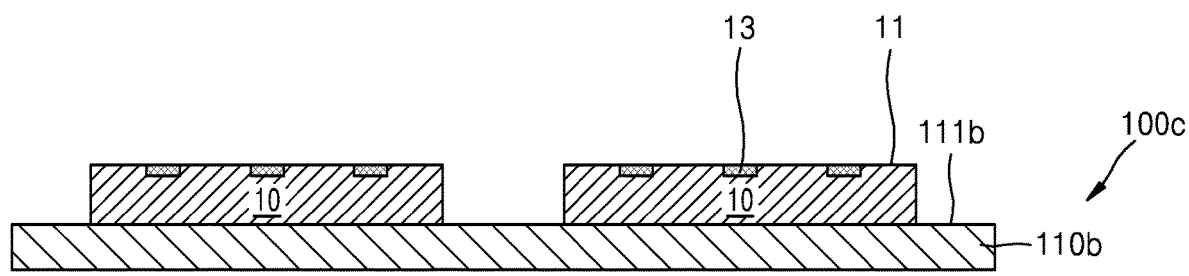
FIG. 17A is a cross-sectional view showing a method of producing a semiconductor package, according to some embodiments of a technical concept of the present disclosure.

Referring to FIG. 17a, a plurality of wafers 10 may be arranged on the tray 100c. An upper surface 11 of each wafer 10 on which a pad 13 is formed may be exposed, and a lower surface of the wafer 10, which is opposite to the upper surface 11, may face a surface of the tray 100c. To arrange the plurality of wafers 10 at predetermined locations on the tray 100c, an align mark (140 of FIG. 2a) provided on the tray 100c may be used.

Figure 17B:
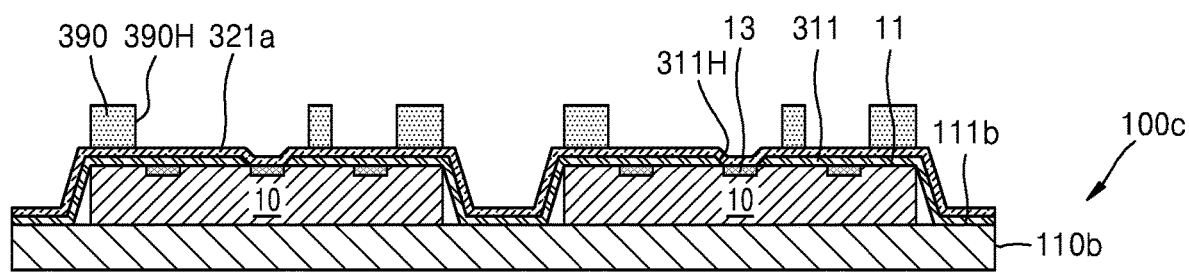
FIG. 17B is a cross-sectional view showing a method of producing a semiconductor package, according to some embodiments of a technical concept of the present disclosure.

Referring to FIG. 17b, a first insulating layer 311 covering the surface of the tray 100c and the surface of the wafer 10 and having an opening 311H exposing the pad 13 of the wafer 10 may be formed. Because the upper surface 11 of the wafer 10 has a level that is higher than the surface of the tray 100c, the first insulating layer 311 may have a stepped portion. The first insulating layer 311 may fix the plurality of wafers 10 at predetermined positions on the tray 100c during a subsequent process.

After the first insulating layer 311 is formed, a seed metal layer 321a may be formed on the first insulating layer 311 and the pads 13 of the wafers 10 exposed through the opening 311H of the first insulating layer 311, and a second mask pattern 390 having a second mask opening 3900H may be formed on the seed metal layer 321a.

Figure 17C:
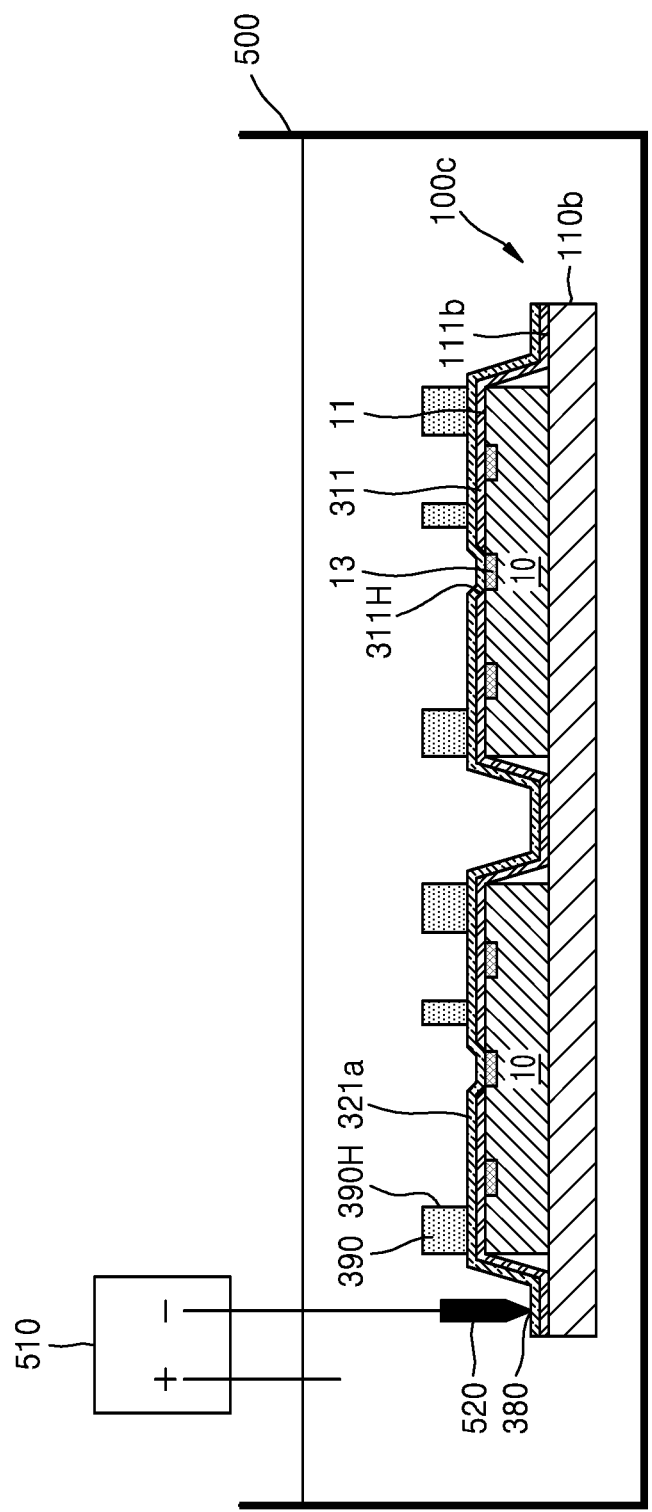
FIG. 17C is a cross-sectional view showing a method of producing a semiconductor package, according to some embodiments of a technical concept of the present disclosure.
Figure 17D:
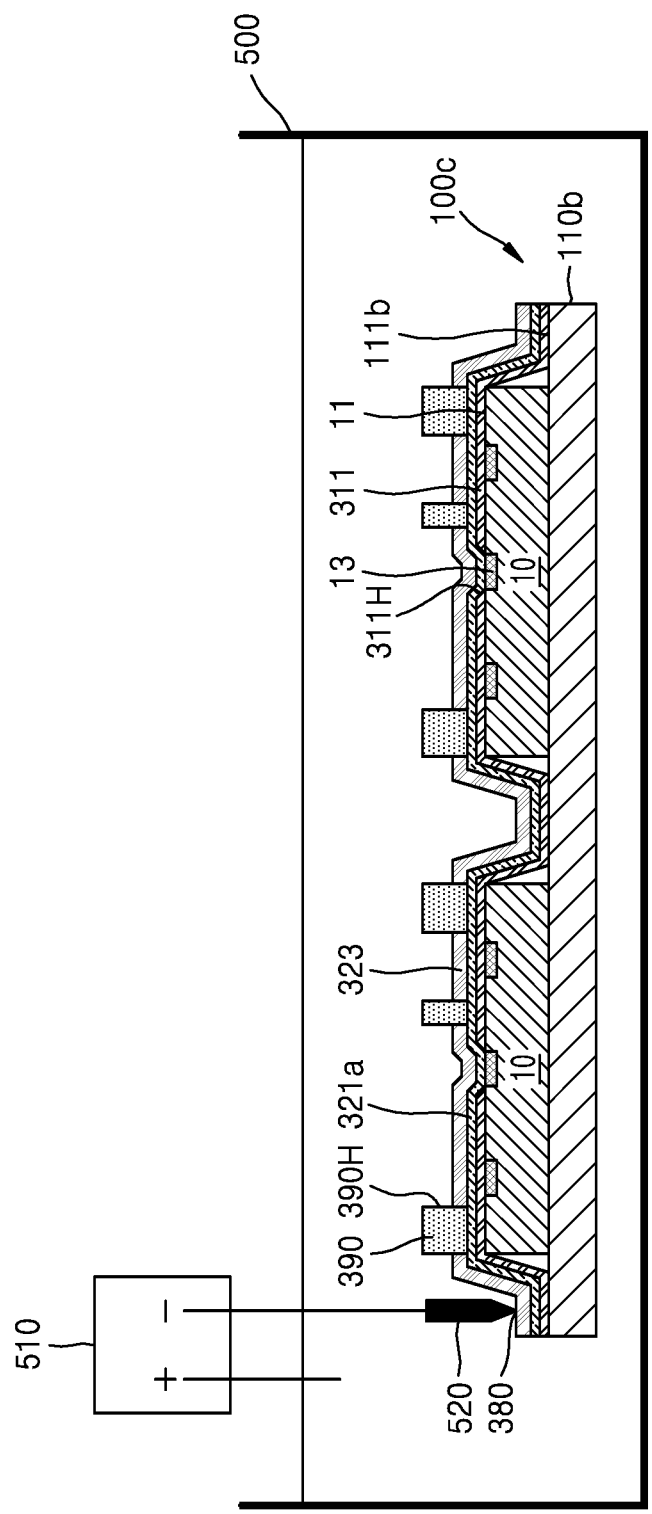
FIG. 17D is a cross-sectional view showing a method of producing a semiconductor package, according to some embodiments of a technical concept of the present disclosure.

Referring to FIGS. 17c and 17d, more specifically, the tray 100c on which the plurality of wafers 10 are arranged may be immersed in a plating bath 500, and a plating jig 520 may contact at least one location 380 on the seed metal layer 321a. Successively, when a power supply 510 applies a voltage to the plating jig 520, a first metal layer 323 may be formed on a surface of a portion of the seed metal layer 321a exposed through the first mask opening 390H.

In some embodiments, as shown in the drawings, the at least one location 380 on the seed metal layer 321a which the plating jig 520 contacts may be spaced in a peripheral direction from the portion of the seed metal layer 321a on the plurality of wafers 10. That is, the plating jig 520 may be located in another area except for an area where the plurality of wafers 10 are arranged, on an upper surface 111b of the tray 100c.

Figure 17E:
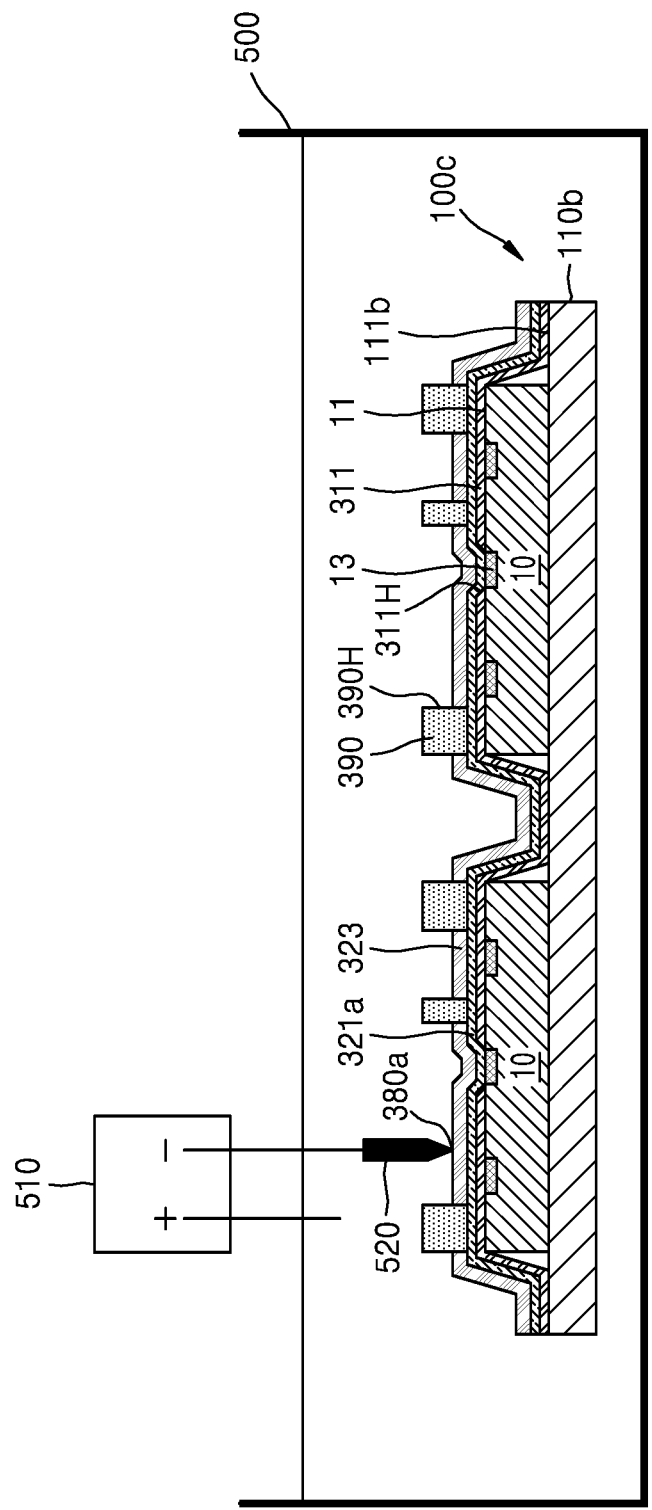
FIG. 17E is a cross-sectional view showing a method of producing a semiconductor package, according to some embodiments of a technical concept of the present disclosure.

Or, in other embodiments, as shown in FIG. 17e, at least one location 380a on the seed metal layer 321 which the plating jig 520 contacts may be in the portion of the seed metal layer 321a on the plurality of wafers 10.

Figure 17F:
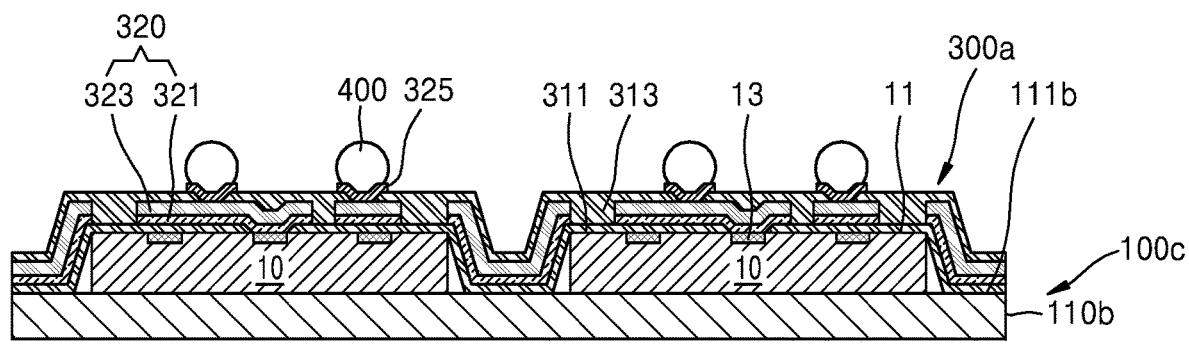
FIG. 17F is a cross-sectional view showing a method of producing a semiconductor package, according to some embodiments of a technical concept of the present disclosure.

Referring to FIG. 17f, the first mask pattern 390 and the portion of the seed metal layer 321a located below the first mask pattern 390 may be removed from the resultant structure of FIG. 17d. Thereafter, a second insulating layer 313, a second metal layer 323, and an external connection terminal 400 may be formed sequentially through the substantially same process as that described above with reference to FIGS. 16i and 16j.

Figure 17G:
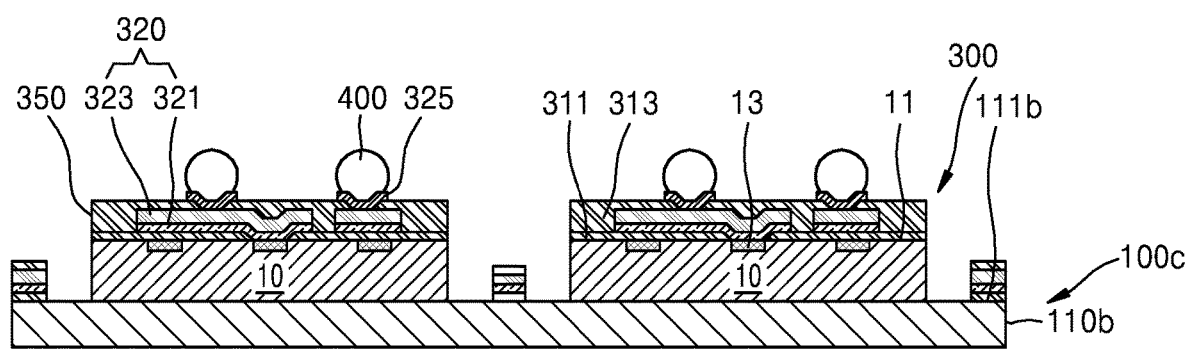
FIG. 17G is a cross-sectional view showing a method of producing a semiconductor package, according to some embodiments of a technical concept of the present disclosure.

Referring to FIG. 17g, a portion of an interconnect structure (300a of FIG. 17e) may be removed along the edges of the plurality of wafers 10 to form a separation lane 350. For example, a portion of the second insulating layer 313, a portion of the first metal layer 323, a portion of the seed metal layer 321, and a portion of the first insulating layer 311 may be removed along the edges of the plurality of wafers 10 to expose the edges of the plurality of wafers 10. By the separation lane 350, wafer level semiconductor packages including the wafers 10 and the interconnect structure 200 formed on the wafers 10 may be separated from each other.

After the separation lane 350 is formed, the wafer level semiconductor packages may be separated from the tray 100c. Each of the separated wafer level semiconductor packages may be singulated into a plurality of package unit semiconductor packages through a sawing process.

By the method of producing the semiconductor package, according to the embodiments of the present disclosure, a plurality of unit processes of a semiconductor package process may be performed by using a tray capable of supporting a plurality of wafers. That is, because the semiconductor package process is performed by arranging a plurality of wafers on a tray, a plurality of wafer level semiconductor packages may be manufactured in a panel level. Accordingly, by the technical concept of the present disclosure, semiconductor package processes for a plurality of wafers can be performed at the same time, and therefore, productivity may be improved.

Figure 18A:
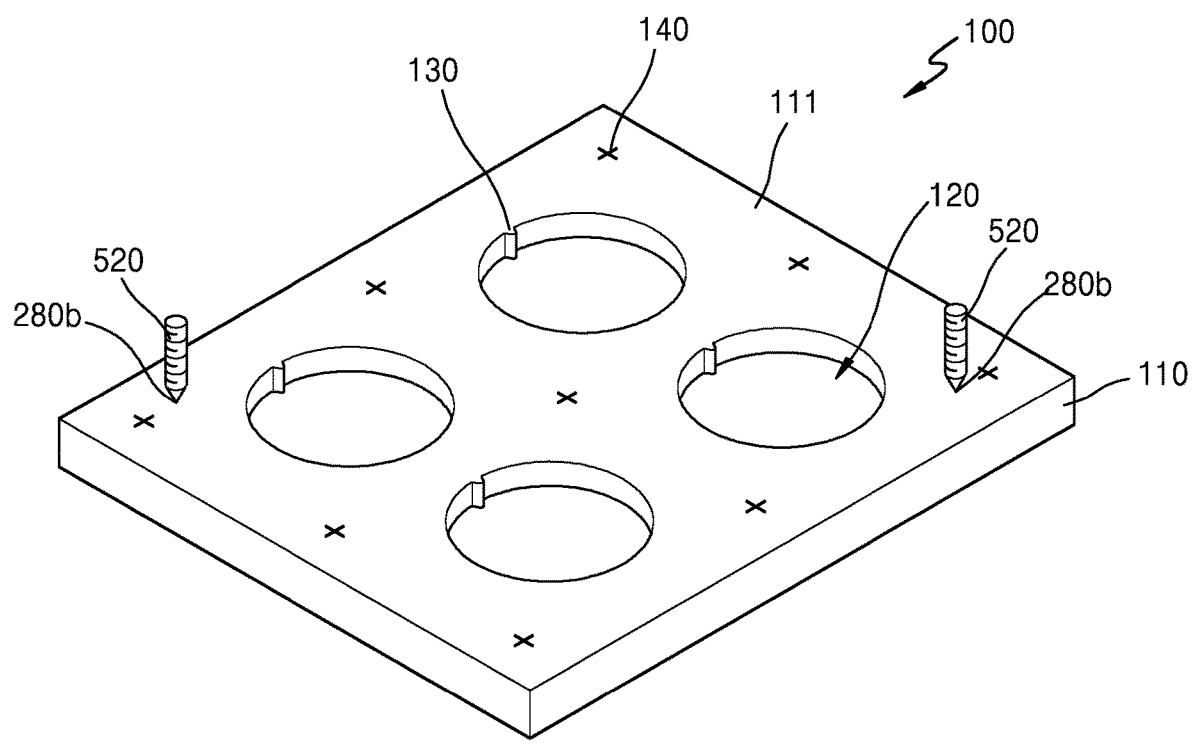
FIG. 18A is a view conceptually showing a plating process in a method of producing a semiconductor package, according to some embodiments of a technical concept of the present disclosure.
Figure 18B:
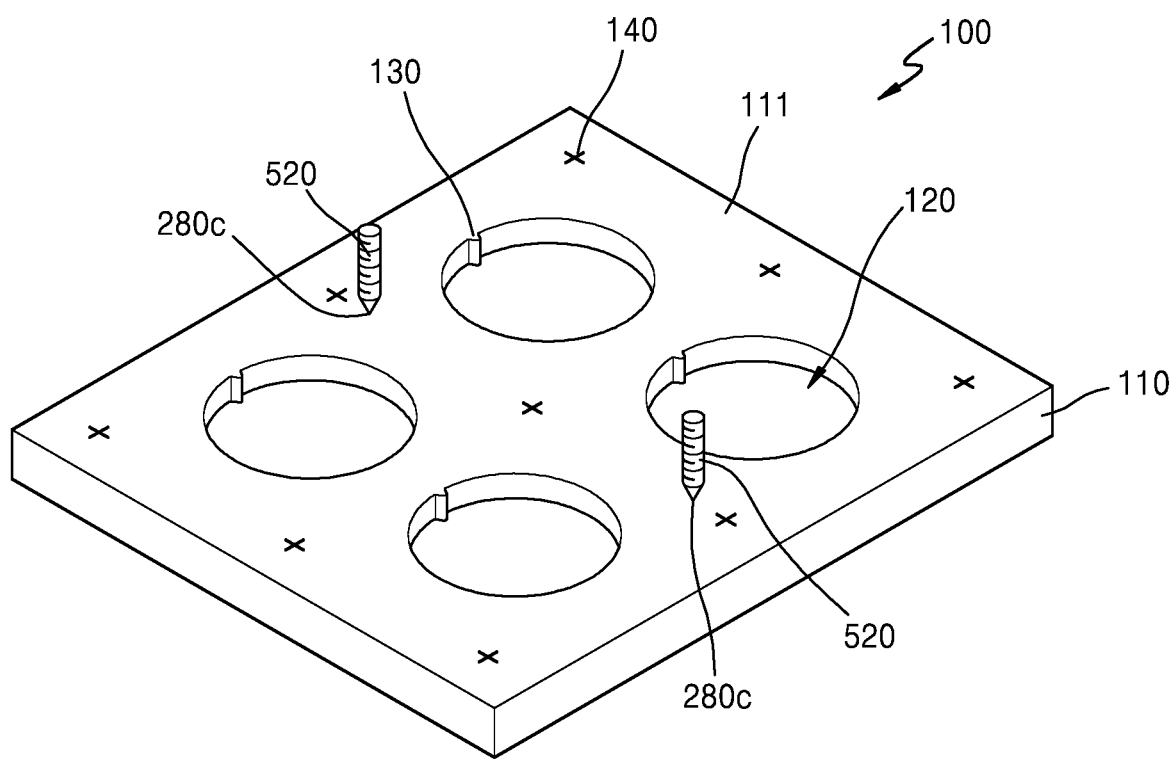
FIG. 18B is a view conceptually showing a plating process in a method of producing a semiconductor package, according to some embodiments of a technical concept of the present disclosure.
Figure 18C:
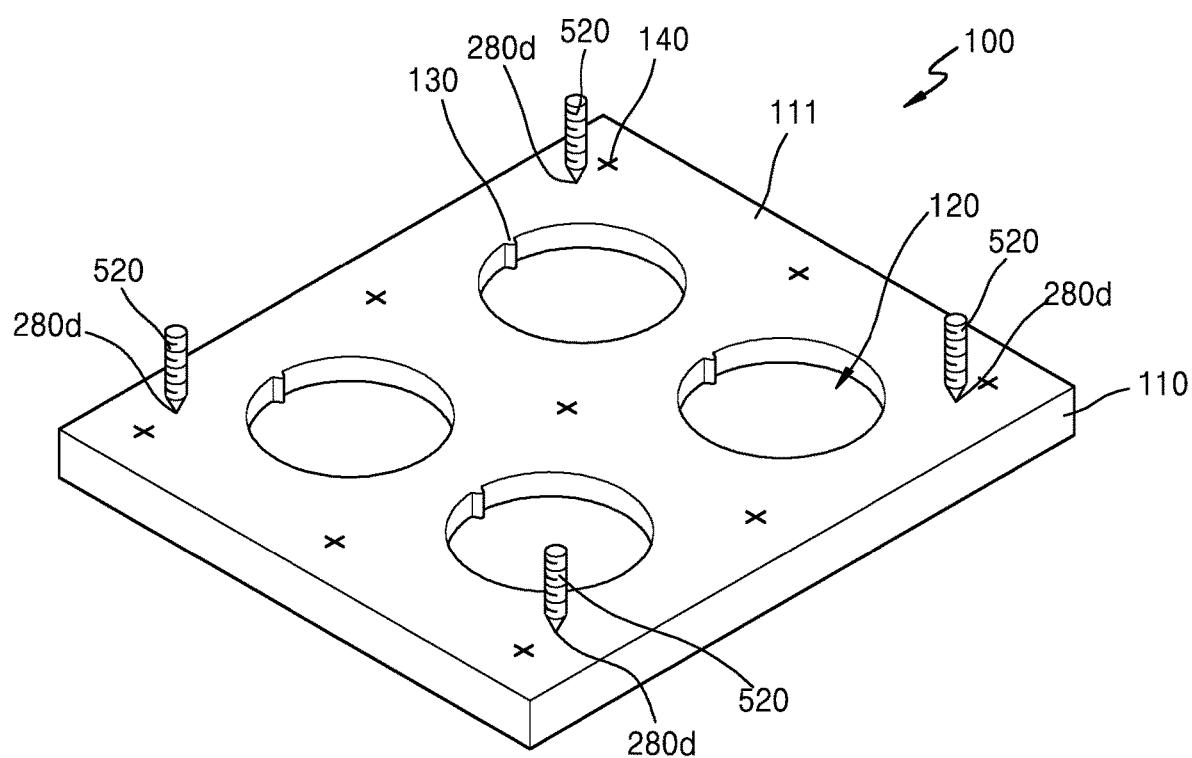
FIG. 18C is a view conceptually showing a plating process in a method of producing a semiconductor package, according to some embodiments of a technical concept of the present disclosure.

FIGS. 18a to 18c are views conceptually showing a plating process in a method of producing a semiconductor package according to some embodiments of a technical concept of the present disclosure. In FIGS. 18a to 18c, for convenience of description, wafers arranged on the tray and structures formed on the tray and the wafers are not shown.

Also, hereinafter, a part of a method of producing a semiconductor package by using the tray 100 shown in FIGS. 2a and 2b will be described.

Referring to FIGS. 18a and 18b, the number of locations 280b at which the plating jig 520 contacts the seed metal layer (see 221a of FIG. 16e) may be less than the number of wafers arranged on the tray 100.

In some embodiments, as shown in FIG. 18a, for the tray 100 on which four wafers can be arranged, a plating jig 520 may contact two locations 280b on an upper surface 111 of the tray 100 to apply power for a plating process to the seed metal layer.

The two locations 280b at which the plating jig 520 contacts the seed metal layer may be spaced in a peripheral direction from areas where the wafers are arranged on the upper surface 111 of the tray 100. That is, the two locations 280b may be spaced in a peripheral direction from the cavities 120 on the upper surface 111 of the tray 100. Also, the two locations 280b may be adjacent to two different corners of the upper surface 111 of the tray 100.

In some embodiments, as shown in FIG. 18b, two locations 280c which the plating jig 520 contacts the seed metal layer may be spaced in a peripheral direction from areas where the wafers are arranged, on the upper surface 111 of the tray 100, and the two locations 280c may be adjacent to centers of edges of the upper surface 111 of the tray 100.

Referring to FIG. 18c, the number of locations 280d at which the plating jig 520 contacts the seed metal layer (see 221a of FIG. 16e) may be equal to the number of wafers arranged on the tray 100. For example, for the tray 100 on which four wafers can be arranged, the plating jig 520 may contact four locations 280d on the upper surface 111 of the tray 100 to apply power for a plating process to the seed metal layer. For example, when the plating jig 520 contacts four locations 280d on the upper surface 111 of the tray 100, each of the four locations 280d may apply power for a plating process to the seed metal layer formed on the respective wafers accommodated in four cavities 120.

Meanwhile, in FIGS. 18a to 18c, a plating process of a case of using the tray 100 shown in FIGS. 2a and 2b has been described, however, plating processes using the trays 100a, 100b, and 100c as described above with reference to FIGS. 3 to 5 may also be performed in the substantially same way as that described above with reference to FIGS. 18a to 18c.

Figure 19A:
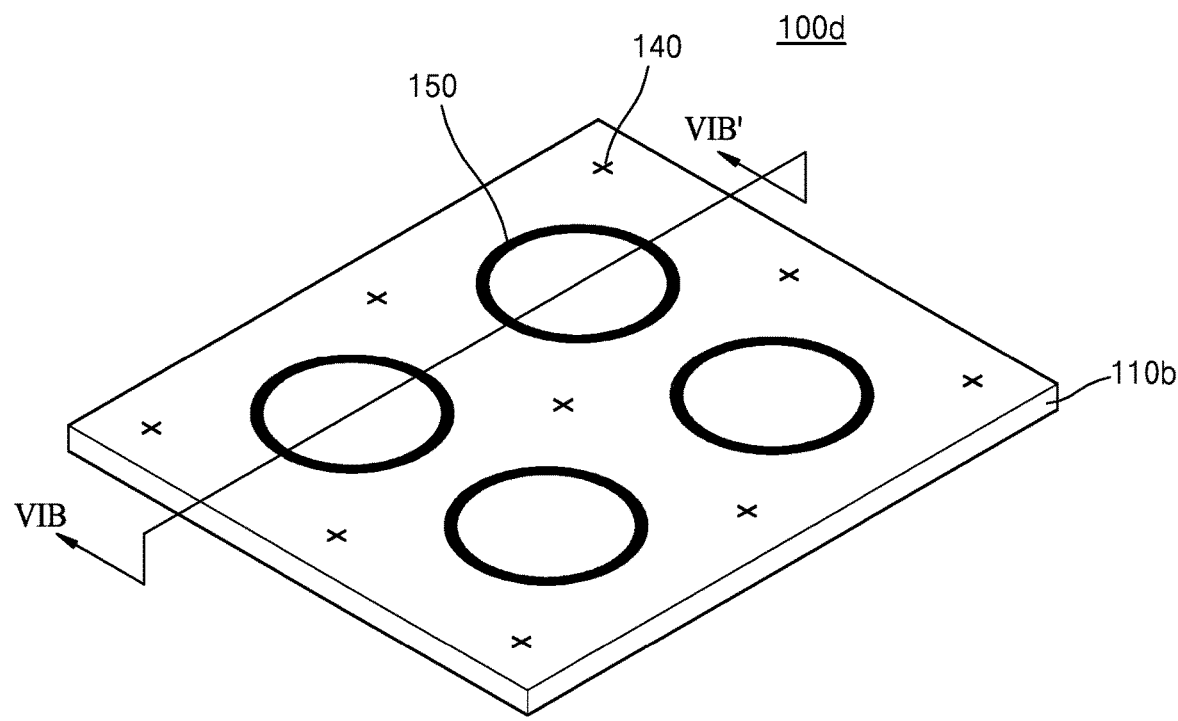
FIG. 19A is a perspective view of a tray according to some embodiments of the present disclosure.
Figure 19B:
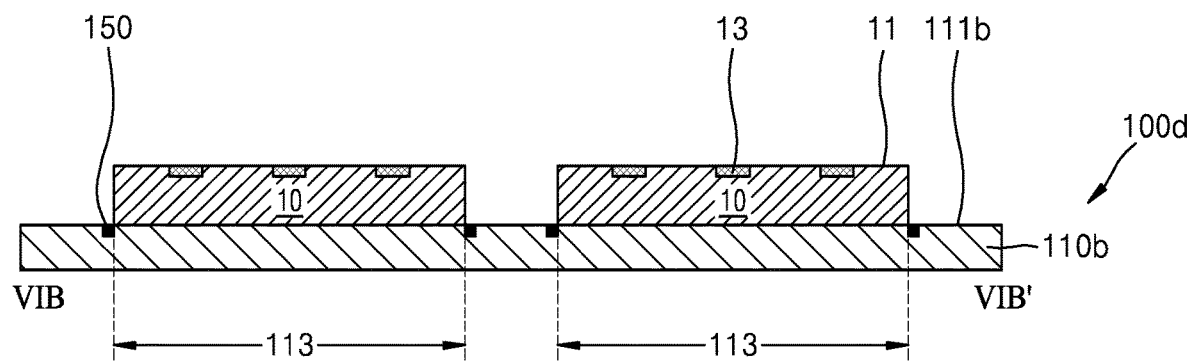
FIG. 19B is a cross-sectional view of the tray of FIG. 19A, taken along line VIB-VIB', showing a state in which a plurality of wafers are arranged on the tray.

FIG. 19a is a perspective view of a tray 100d according to some embodiments of the present disclosure. FIG. 19b is a cross-sectional view of the tray 100d of FIG. 19a, taken along line VIB-VIB', showing a state in which a plurality of wafers 10 are arranged on the tray 100d. The tray 100d shown in FIGS. 19a and 19b may have substantially the same configuration as that of the tray 100c shown in FIG. 5 except that the tray 100d furher includes a pattern 150. In FIGS. 19a and 19B, the same reference numerals as those used in FIG. 5 indicate the same components, and therefore, detailed descriptions about the components will be omitted or briefly given.

Referring to FIGS. 19a and 19b, the tray 100d may include the pattern 150 provided on the upper surface 111b of the body 110b. The pattern 150 may define a wafer arrangement area 113 on which the plurality of wafers 10 may be arranged. In some embodiments, the pattern 150 and/or an align mark 140 may be used to arrange the plurality of wafers 10 on a plurality of wafer arrangement areas 113. By the pattern 150, an error by which the wafers 10 arranged on the tray 100d deviate from predetermined locations may be reduced.

The pattern 150 may be exposed upward, and may be in the shape of a ring, as seen from above. In this case, an inside area of the pattern 150 in the shape of a ring may be defined as the wafer arrangement area 113. In the drawings, the pattern 150 is shown to be in the shape of a continuously extending ring, however, the shape of the pattern 150 is not limited thereto. For example, the pattern 150 may be discontinuous, and may be in the shape of a ring whose a portion is cut off. The pattern 150 may be formed with, for example, copper, although not limited thereto.

Figure 20A:
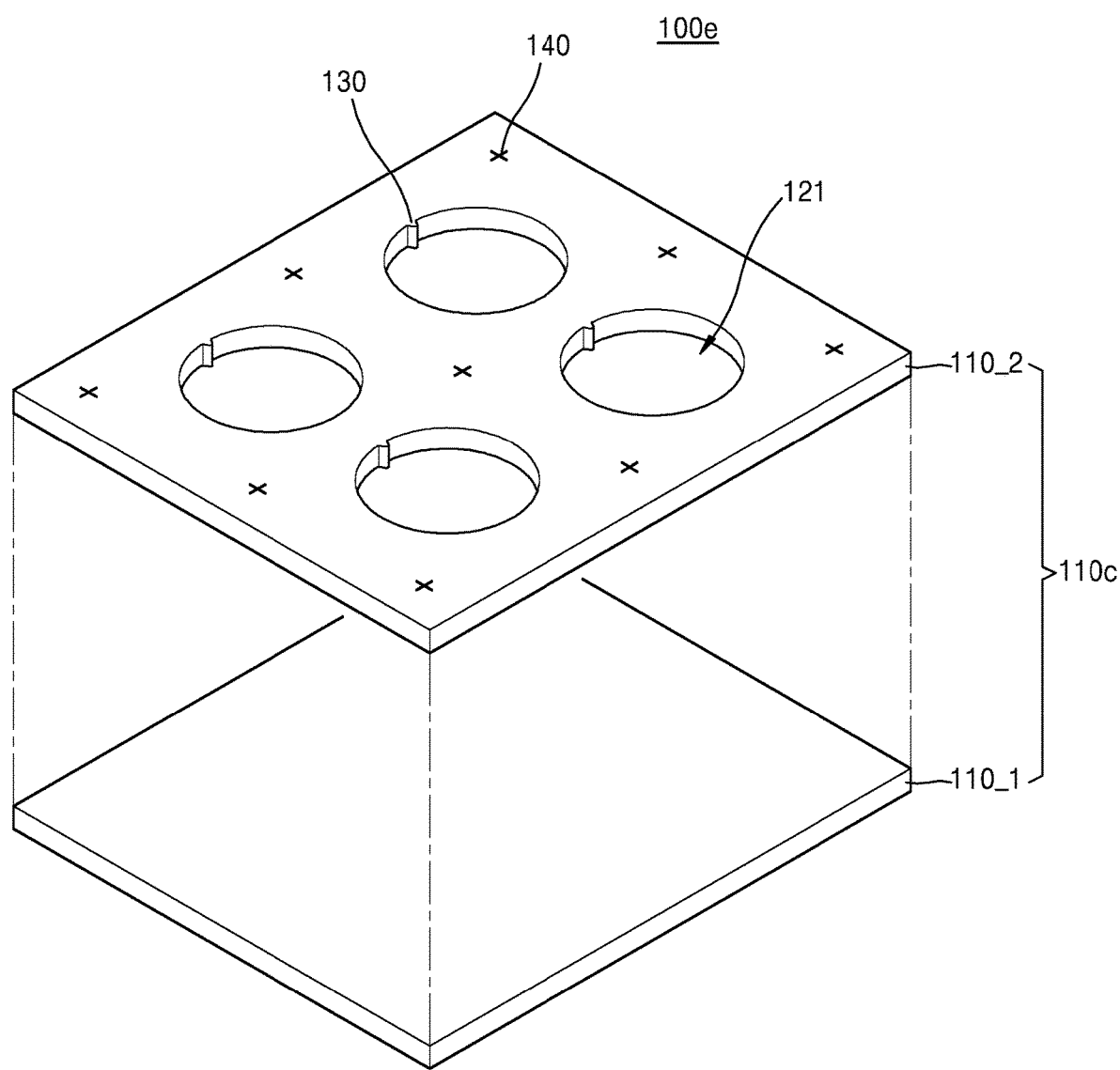
FIG. 20A is an exploded perspective view of a tray according to some embodiments of the present disclosure.
Figure 20B:
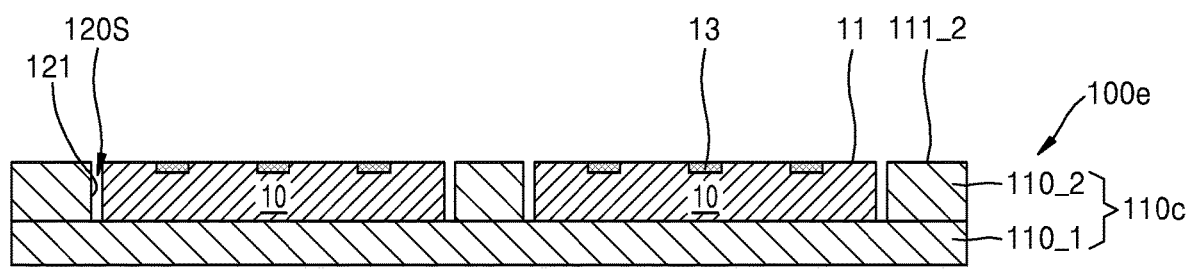
FIG. 20B is a cross-sectional view showing a state in which a plurality of wafers are arranged on the tray of FIG. 20A.

FIG. 20a is an exploded perspective view of a tray 100e according to some embodiments of the present disclosure. FIG. 20b is a cross-sectional view showing a state in which a plurality of wafers 10 are arranged on the tray 100e of FIG. 20a. The tray 100e shown in FIGS. 20a and 20b may have substantially the same configuration as that of the tray 100 shown in FIGS. 2a and 2b except that the tray 100e includes a first body 110_1 and a second body 110_2. In FIGS. 20a and 20b, the same reference numerals as those used in FIGS. 2a and 2b indicate the same components, and therefore, detailed descriptions about the components will be omitted or briefly given.

Referring to FIGS. 20a and 20b, the tray 100e may include a body 100c having the first body 110_1 and the second body 110_2 that may be separated from or coupled with each other. The first body 110_1 may be in the shape of a flat plate. The second body 110_2 may be positioned on the first body 110_1, and include a plurality of holes 121 penetrating the second body 110_2. When the first body 110_1 is coupled with the second body 110_2, the first body 110_1 may be positioned below the second body 110_2 to block one sides of the plurality of holes 121.

As shown in FIG. 20b, when the first body 110_1 is coupled with the second body 110_2, the first body 110_1 may block one sides of the plurality of holes 121, and therefore, recess areas for accommodating the plurality of wafers 10 may be formed in the tray 100e. While at least a part of a semiconductor package process is performed, the plurality of wafers 1 may be respectively accommodated in the plurality of holes 121. When the plurality of wafers 10 are accommodated in the plurality of holes, lower surfaces of the plurality of wafers 10 may face the first body 110_1, and side portions of the plurality of wafers 10 may face side walls provided by the plurality of holes 121.

Meanwhile, because the first body 110_1 is couled with or separated from the second body 110_2, the wafers 10 may be more easily separated from the tray 100e after an interconnect structure (for example, see 200 of FIG. 6i) is formed. That is, by separating the second body 110_2 from the first body 110_1, the side portions of the plurality of wafers 10 may be exposed so that the wafers 10 may be prevented from being damaged when being separated.

Figure 21:
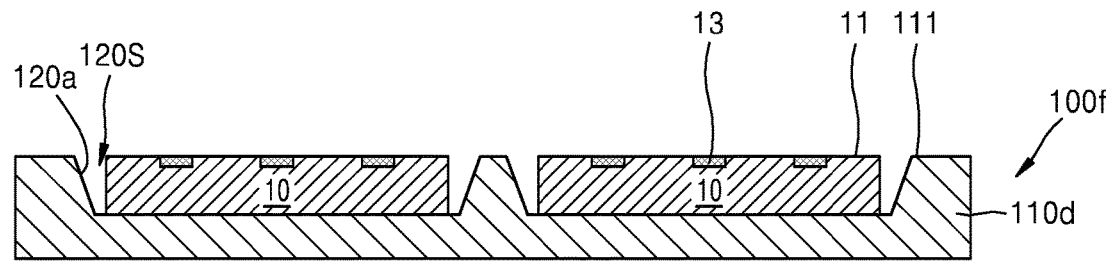
FIG. 21 is a cross-sectional view showing a state in which a plurality of wafers are arranged on a tray according to some embodiments of a technical concept of the present disclosure.

FIG. 21 is a cross-sectional view showing a state in which a plurality of wafers 10 are arranged on a tray 100f according to some embodiments of a technical concept of the present disclosure. The tray 100f shown in FIG. 21 may have substantially the same configuration as the tray 100 shown in FIGS. 2a and 2b except for the shape of cavities 120a. In FIG. 21, the same reference numerals as those used in FIGS. 2a and 2b indicate the same components, and therefore, detailed descriptions about the components will be omitted or briefly given.

Referring to FIG. 21, side walls of the cavities 120a may be inclined. For example, the cavities 120a formed in an upper portion of the body 110d may be narrowed from top to bottom. In other words, a horizontal width of the cavities 120*a* may be smaller as being closer to bottom surfaces of the cavities 120*a*.

Because the side walls of the cavities 120*a* are inclined, the wafers 10 may be more easily arranged in the cavities 120*a* of the tray 100*f*. Furthermore, because the cavities 120*a* are widened upward, the wafers 10 may be prevented from being damaged due to collision with the side walls of the cavities 120*a* when being separated.

As described above, exemplary embodiments are disclosed in the specification and drawings. Specific terms used in the present specification should be considered for purposes for describing the technical concept of the present disclosure, not for purposes for limiting the meanings or the scope of the present disclosure written in the claims. Therefore, it will be understood by those of ordinary skill in the art that various modifications or other equivalent embodiments may be made from the embodiments. Accordingly, the true technical protecting range of the present disclosure should be determined according to the technical concept of the attached claims.

What is claimed is:

1. A method of producing a semiconductor package, comprising:
    arranging a plurality of wafers on a tray;
    forming an interconnect structure on the tray and the plurality of wafers arranged on the tray; and
    separating the plurality of wafers from the tray,
    wherein forming the interconnect structure comprises forming a first insulating layer covering the plurality of wafers on the tray and forming a distribution layer on the first insulating layer,
    the first insulating layer includes a first portion contacting a surface of the tray, a second portion contacting the plurality of wafers, and a third portion extending between the first portion and the second portion, and
    the third portion is spaced from side surfaces of the plurality of wafers with a first space therebetween, the third portion covering the first space when the distribution layer is formed.

2. The method of claim 1, wherein
    the tray includes a plurality of cavities in which the plurality of wafers are accommodated, and
    when the interconnect structure is formed, the plurality of wafers are respectively accommodated in the plurality of cavities of the tray.

3. The method of claim 2, wherein
    the tray includes a notch portion positioned at a side wall of each cavity, and
    arranging the plurality of wafers comprises arranging the plurality of wafers in the cavities by using the notch portion such that the plurality of wafers are aligned in a predetermined direction.

4. The method of claim 2, wherein,
    in an operation of arranging the plurality of wafers, a level of upper surfaces of the plurality of wafers accommodated in the cavities is equal to or lower than a level of an upper surface of the tray.

5. The method of claim 1, wherein,
    in an operation of forming the first insulating layer, the first insulating layer covers a surface of the tray and surfaces of the plurality of wafers to fix the plurality of wafers on the tray.

6. The method of claim 1, wherein
    forming the interconnect structure comprises:
    forming a second insulating layer covering the distribution layer after forming the distribution layer; and
    removing a portion of the second insulating layer to expose a portion of the distribution layer.

7. The method of claim 6, wherein
    forming the distribution layer comprises:
    forming a seed metal layer on a surface of the first insulating layer and surfaces of pads of the wafers, and
    forming a first metal layer on a portion of the seed metal layer by a plating method.

8. The method of claim 1, wherein
    separating the plurality of wafers from the tray comprises removing a portion of the first insulating layer to expose edges of the plurality of wafers.

9. The method of claim 1, wherein
    the tray includes an align mark positioned on an upper surface of the tray to arrange the plurality of wafers at predetermined locations on the tray.

10. A method of producing a semiconductor package, comprising:
    preparing a tray including a plurality of cavities in which a plurality of wafers are accommodated, and arranging the plurality of wafers in the plurality of cavities;
    forming a first insulating layer on the plurality of wafers, the first insulating layer including an opening for exposing pads of the plurality of wafers;
    forming a seed metal layer on the first insulating layer, the seed metal layer connected to the pads exposed through the opening of the first insulating layer; and
    causing a plating jig to contact at least one location on the seed metal layer to form a first metal layer on the seed metal layer,
    wherein the first insulating layer and the seed metal layer cover an upper surface of the tray and upper surfaces of the plurality of wafers, and
    the first insulating layer and the seed metal layer cover a space between side walls of the cavities and the wafers accommodated in the cavities.

11. The method of claim 10, wherein
    forming the first metal layer comprises locating the plating jig in another area except for an area where the plurality of wafers are arranged, on the upper surface of the tray, to plate the first metal layer.

12. The method of claim 11, wherein
    a number of the at least one location at which the plating jig contacts the seed metal layer is less than a number of the plurality of wafers arranged on the tray.

13. The method of claim 11, wherein
    a number of the at least one location at which the plating jig contacts the seed metal layer is equal to the number of the plurality of wafers arranged on the tray.

14. The method of claim 10, wherein
    forming the first metal layer comprises locating the plating jig on the plurality of wafers to plate the first metal layer.

15. The method of claim 10, wherein
    forming the first metal layer comprises locating the plating jig on each of the plurality of wafers to plate the first metal layer on the plurality of wafers.

16. The method of claim 10, wherein
    forming the first metal layer comprises locating the plating jig on a portion of an upper surface of the tray spaced from the cavities to plate the first metal layer.

17. The method of claim 10, wherein
    a portion of the seed metal layer covering the space between the side walls of the cavities and the wafers accommodated in the cavities is parallel to the upper surface of the tray.

18. A method of producing a semiconductor package, comprising:
- a first arrangement operation of preparing a tray in which a plurality of cavities are formed and arranging a plurality of wafers in the plurality of cavities;
- forming a first insulating layer covering an upper surface of the tray and upper surfaces of the plurality of wafers, the first insulating layer including an opening for exposing pads of the plurality of wafers;
- forming a seed metal layer on the first insulating layer and the pads of the plurality of wafers exposed through the first insulating layer;
- forming a mask pattern on the seed metal layer, the mask pattern including a mask opening for exposing a portion of the seed metal layer;
- a first separation operation of separating the plurality of wafers from the tray;
- forming a first metal layer on the seed metal layer to fill at least a portion of the mask opening; and
- removing the mask pattern and a portion of the seed metal layer located below the mask pattern.

19. The method of claim 18,
after removing the mask pattern and the portion of the seed metal layer located below the mask pattern, further comprising:
- a second arrangement operation of arranging the plurality of wafers in the cavities in the tray;
- forming a second insulating layer covering the tray and the first metal layer on the plurality of wafers; and
- a second separation operation of separating the plurality of wafers from the tray.

20. The method of claim 18, wherein,
in an operation of forming the first insulating layer, the first insulating layer covers a space between side walls of the cavities and the wafers, and
when the first insulating layer, the seed metal layer, and the mask pattern are formed, the space between the side walls of the cavities and the wafers is covered by the first insulating layer.

* * * * *